(12) United States Patent
Maeda

(10) Patent No.: US 6,621,425 B2
(45) Date of Patent: Sep. 16, 2003

(54) SEMICONDUCTOR DEVICE, TERMINAL DEVICE AND COMMUNICATION METHOD

(75) Inventor: Shigenobu Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/943,026

(22) Filed: Aug. 31, 2001

(65) Prior Publication Data

US 2002/0024453 A1 Feb. 28, 2002

(30) Foreign Application Priority Data

Aug. 31, 2000 (JP) ........................................ 2000-262445

(51) Int. Cl.[7] .......................... H03M 7/00; H01L 21/763
(52) U.S. Cl. ........................... 341/50; 341/106; 713/182
(58) Field of Search ............................... 341/155, 106, 341/50; 711/100; 713/182

(56) References Cited

U.S. PATENT DOCUMENTS

| | | | | |
|---|---|---|---|---|
| 4,969,126 A | * | 11/1990 | Maeno | ........................ 365/240 |
| 5,789,763 A | * | 8/1998 | Kato et al. | .................... 257/172 |
| 5,903,043 A | * | 5/1999 | Ichikawa et al. | ............. 257/532 |
| 6,037,923 A | * | 3/2000 | Suzuki | ......................... 345/92 |

FOREIGN PATENT DOCUMENTS

| | | | | |
|---|---|---|---|---|
| JP | 61-1900 | | 1/1986 | ............ H01L/27/10 |
| JP | 6-326315 | | 11/1994 | ......... H01L/21/236 |
| JP | 7-99207 | | 4/1995 | ......... H01L/21/236 |
| JP | 8-293611 | | 11/1996 | ............ H01L/29/78 |
| JP | 4008320832 | * | 12/1996 | ............ G06F/12/14 |

| | | | |
|---|---|---|---|
| WO | WO 00/49538 | | 8/2000 |

OTHER PUBLICATIONS

"GSM (Global System for Mobile Communication)", Nikkei Electronics (No. 736), Feb. 8, 1999, p. 155–162.
Shigenobu Maeda, et al., "An Analytical Method of Evaluating Variation of the Threshold Voltage Shift Caused by the Negative–Bias Temperature Stress in Poly–Si TFT's" IEEE Transactions on Electron Devices, vol. 45, No. 1, Jan. 1998, p. 165–172.
S. Maeda, et al., "mechanism of Negative–Bias Temperature Instability in Polycrystalline–silicon Thin Film Transistors", Journal of Applied Physics, vol. 76, No. 12, Dec. 15, 1994, p. 8160–8166.
Yasuo Kadokawa, "Spectrum Kakusan Tsushin Gijutsu: Saishin Oyo Report–Shu", Nihon Gijutsu Keizai Center, Jan. 30. 1987, p. 3–24.

* cited by examiner

Primary Examiner—Peguy Jeanpierre
(74) Attorney, Agent, or Firm—Oblon, Spivak, McClelland, Maier & Neustadt, P.C.

(57) ABSTRACT

A code generation unit generates an identification code inherent in a semiconductor substrate. A memory formed in another semiconductor substrate stores the identification code as a memory code. The identification code is written from the code generation unit to the memory before shipment of a semiconductor device as a product. A comparator circuit compares the identification code with the memory code and stops some operations of a predetermined circuit when the two codes do not coincide with each other. With this construction, a higher technical barrier (security) against fraudulent use of an appliance of the semiconductor device through replacement of the semiconductor substrate can be achieved.

20 Claims, 52 Drawing Sheets

F I G. 1
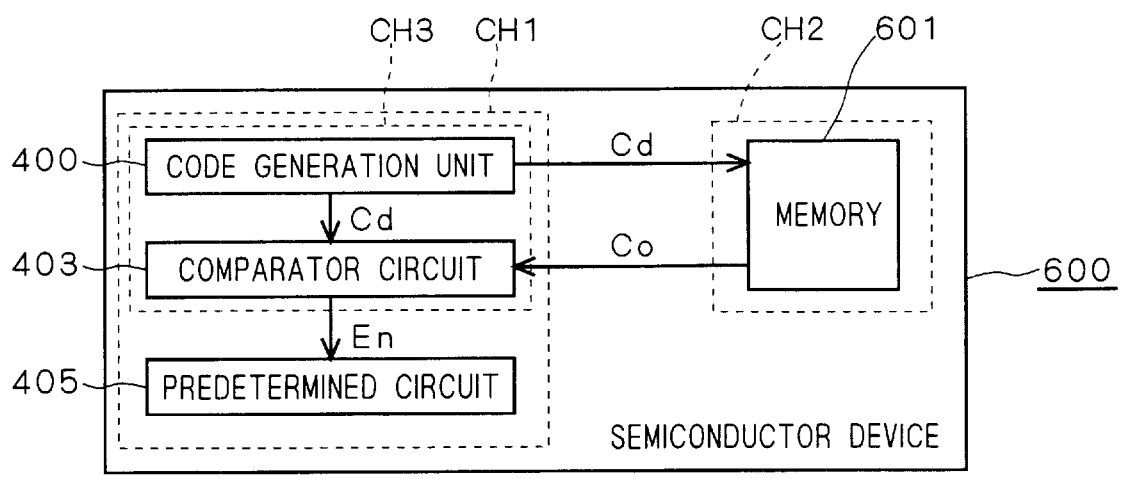
F I G. 2
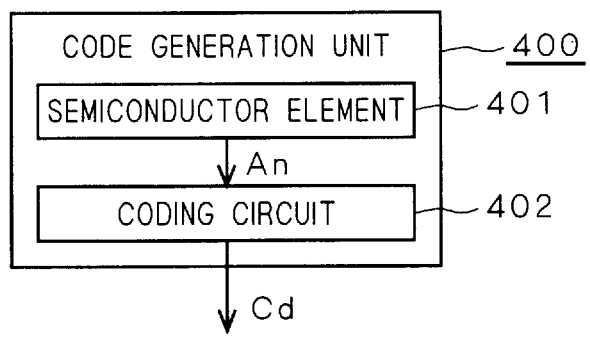

F I G. 5
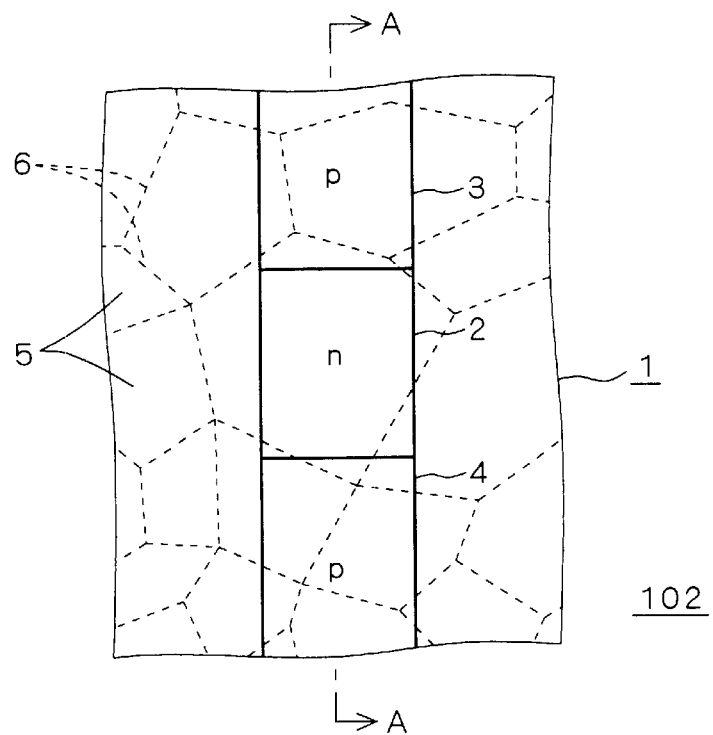
F I G. 6
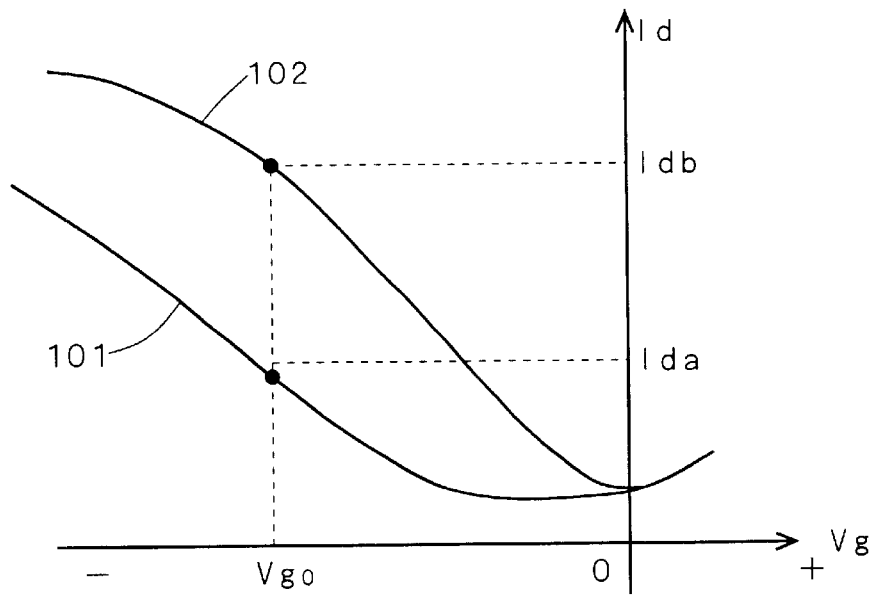

F / G. 7
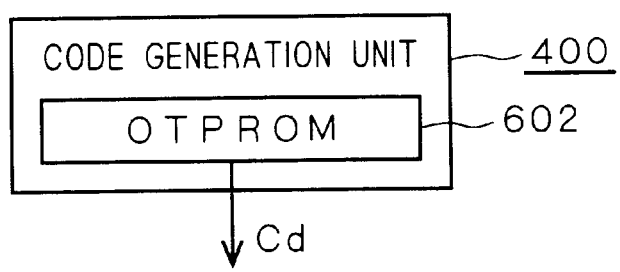
F / G. 8
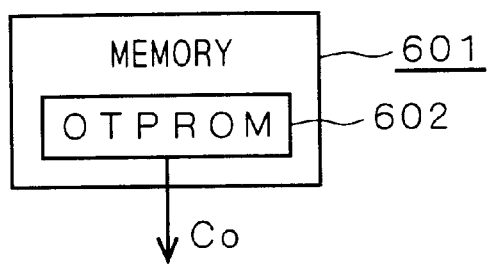

F I G. 16
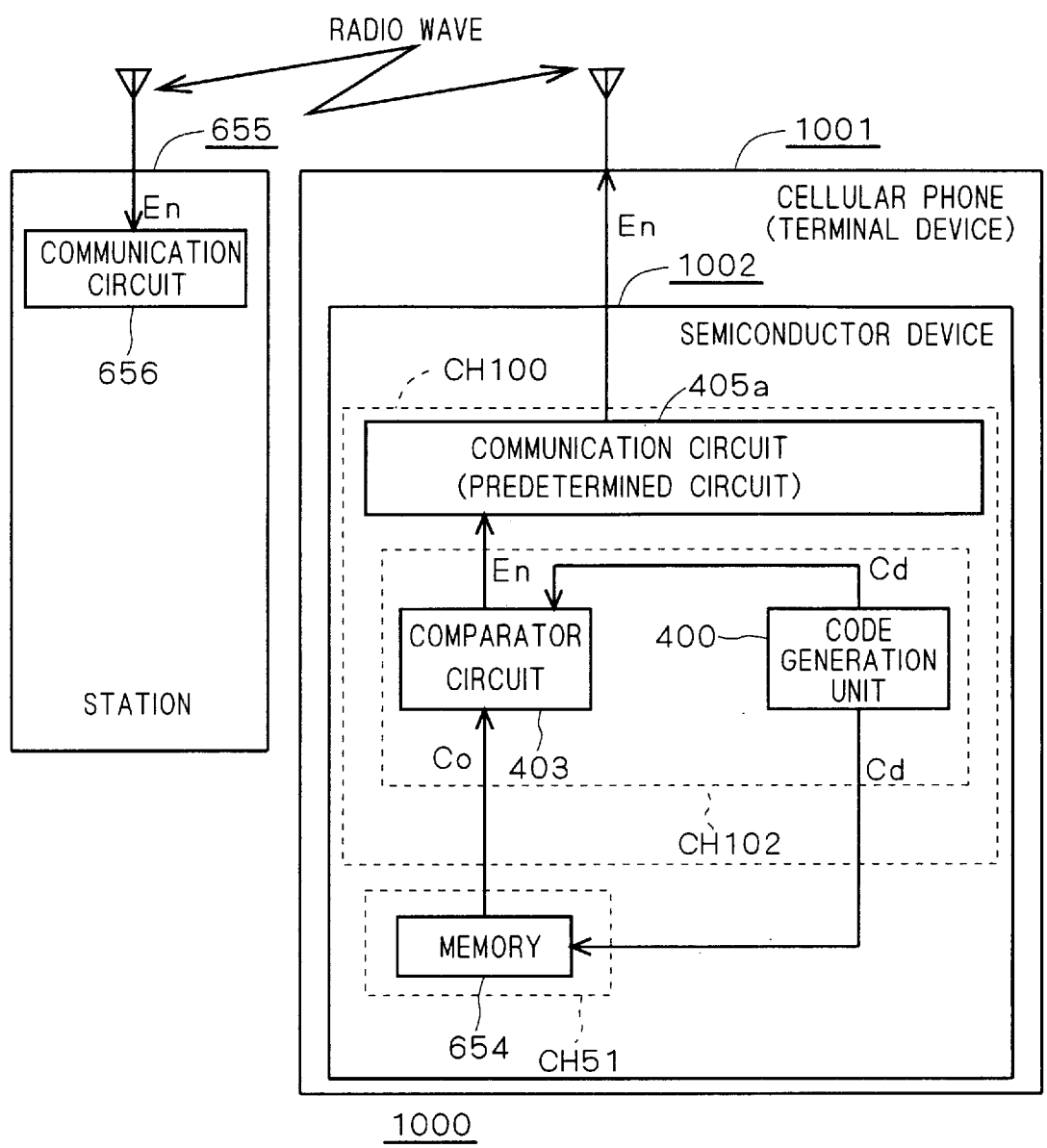

F I G. 32
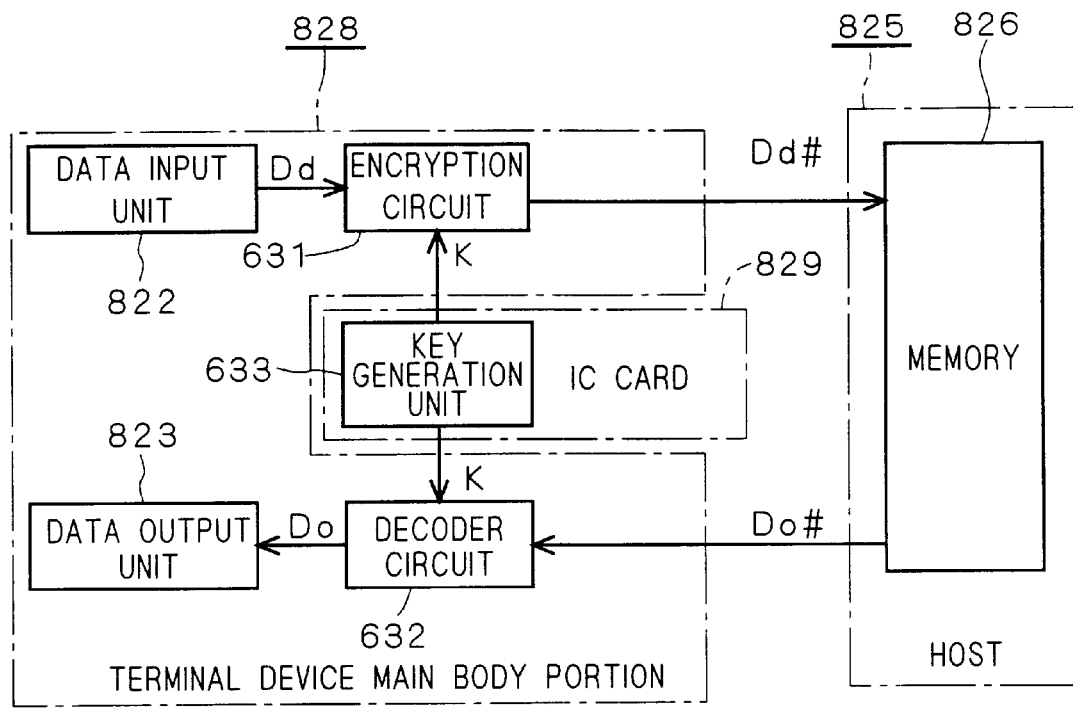

F I G. 52
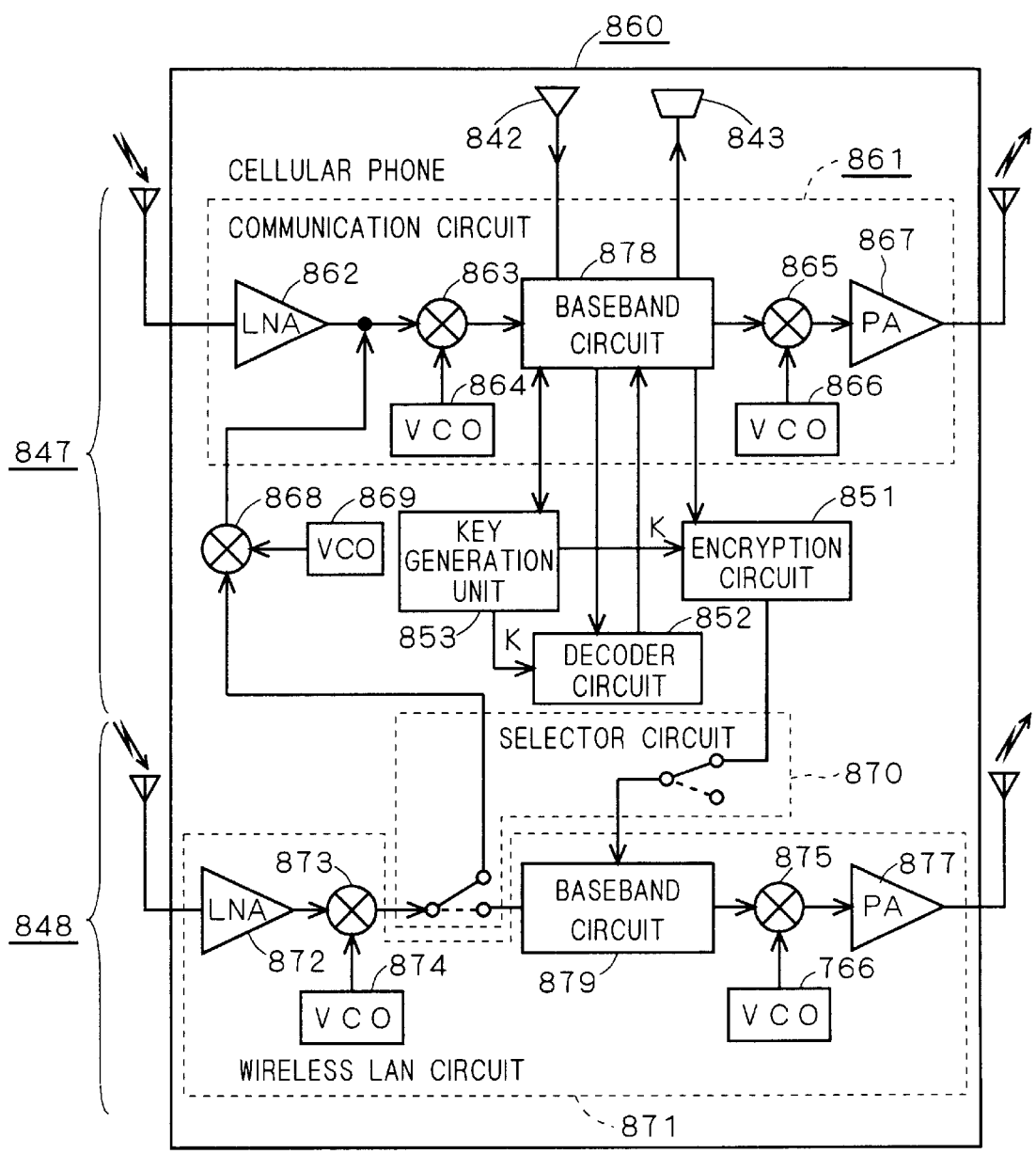

F I G. 57
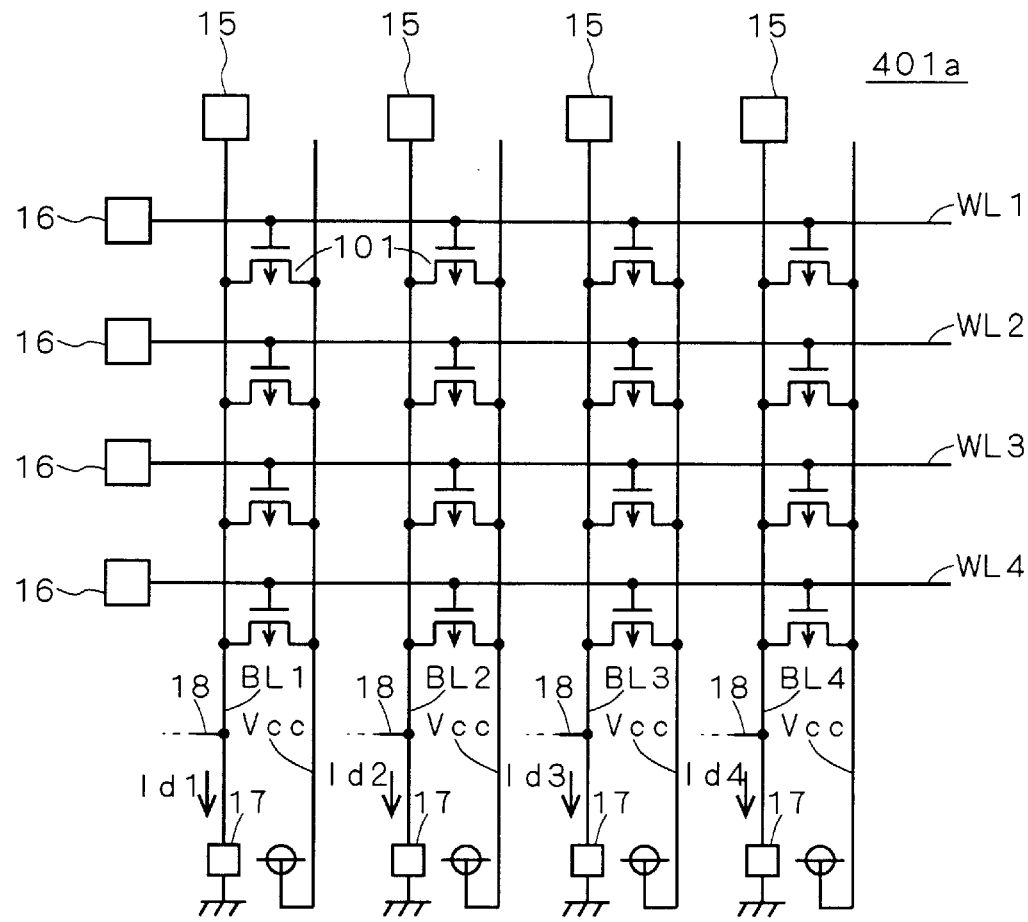
F I G. 58
|  | BL1 | BL2 | BL3 | BL4 |
|---|---|---|---|---|
| WL1 | 1 | 1 | 0 | 0 |
| WL2 | 1 | 0 | 1 | 0 |
| WL3 | 0 | 0 | 0 | 1 |
| WL4 | 0 | 1 | 0 | 0 |

F I G. 62
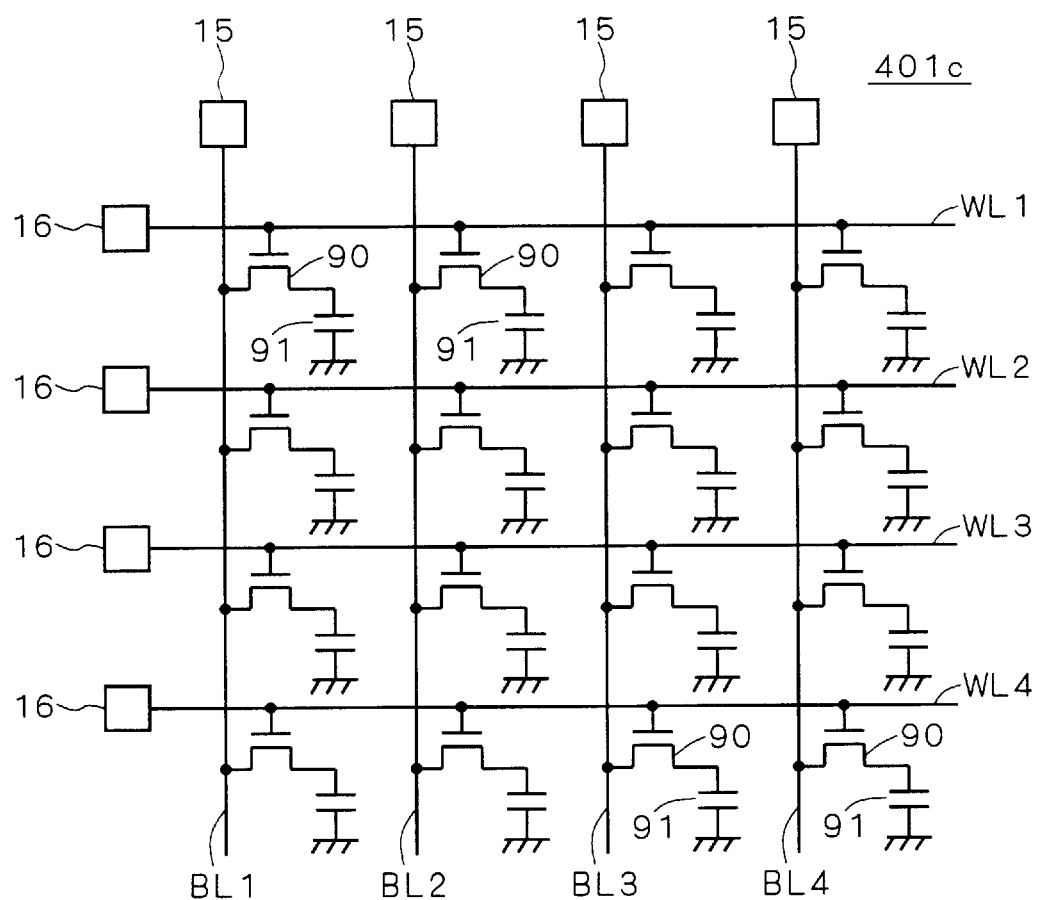

SEMICONDUCTOR DEVICE, TERMINAL DEVICE AND COMMUNICATION METHOD

BACKGROUND OF THE INVENTION

1. Field of the Invention

The present invention relates to a semiconductor device, a terminal device and a communication method.

2. Description of the Background Art

It is said that a fraudulent use of a terminal device such as a cellular phone, i.e., an illegal action of evading the duty of payment on the pretence that a user's own terminal device is some other's one in a communication network has recently increased. Though, naturally, the fraudulent use should be socially controlled by inflicting some legal punishment, it is recognized at the same time that a technical difficulty of fraudulent use, in other words, a higher technical barrier (security) against the fraudulent use is one of especially important countermeasures for preventing the crime.

FIG. 64 is an illustration cited from an article of "NIKKEI ELECTRONICS", on Feb. 8, 1999 (No. 736), pp. 155–162 (document 1), showing an example of the current countermeasures for fraud prevention on the cellular phone. As described in the document 1, the method of FIG. 64 is one with the highest level of security among the current countermeasures for fraud prevention, utilizing a procedure of "authentication".

In this method, an electronic serial number (ESN) of a cellular phone, shared secret data (SSD) which are shared by the cellular phone and an authentication center of a communication common carrier and a mobile identification number (MIN) are given to each cellular phone. These identification numbers are encoded into cipher referred to as AUTHREQ on the basis of the CAVE (Cellular Authentication and Voice Encryption) algorithm. In the encryption, a random number referred to as RAND outputted from a mobile exchange center of the communication common carrier is used.

The communication common carrier decodes the cipher AUTHREQ transmitted from the cellular phone on the basis of the CAVE algorithm. The identification number obtained by decoding is compared with an identification number including the shared secret data (SSD) known only by the authentication center and a judgment on whether the communication should be permitted or not is made in accordance with the comparison result. Thus, a check on whether the user of the cellular phone is authorized or not, i.e., an authentication is performed on the basis of the shared secret data (SSD) shared only between the cellular phone and the communication common carrier.

It is said, however, that the illegal action through the fraudulent use eluding this authentication system of FIG. 64, which is considered as the current countermeasure for fraud prevention with the highest level of security, is prevailing. Further, it is said that one of the technical causes is that the identification number given to the cellular phone is written in a flash memory (flash ROM) which is rewritable, as described in the document 1.

FIG. 65 is a block diagram briefly showing an internal constitution of a cellular phone. A cellular phone 903 in the background art comprises a flash memory 908 as well as a communication circuit 907. The communication circuit 907 operates in accordance with a program written in the flash memory 908. The identification number ID is also stored in the flash memory 908, and the communication circuit 907 performs encoding of the identification number ID read out from the flash memory 908 and transmits a cipher AUTHREQ obtained by encoding to the communication common carrier.

The reason why the rewritable flash memory 908 is used as a storage medium is that it is necessary to respond to a program change made by the communication common carrier, e.g., a change into a program for a new communication system. Further, the use of a non-rewritable mask ROM not only disables the program change but also needs to use different mask patterns corresponding to the identification numbers which are different from one device to another in the manufacturing process of the mask ROM to record the identification numbers, causing deterioration of manufacturing efficiency and an increase in manufacturing cost.

The application (Japanese Patent Application Laid Open Gazette 2001-007290: document 2) by the present applicant discloses a technique to solve the above cause, in which a semiconductor element having a polycrystalline substance is formed in a semiconductor substrate and variation in electric properties caused by variation in crystal structures of the polycrystalline substances is used for generation of an identification number.

On the other hand, as well as the above type of fraudulent use by rewriting of an identification number, known is another type of fraudulent use of terminal device by replacing a semiconductor substrate (semiconductor chip) mounted in a terminal device. Specifically, the fraudulent use through replacement of a semiconductor substrate in which an identification number is recorded with a semiconductor substrate in which another identification number is recorded so as to evade the duty of payment on the pretense that a user's own terminal device is some other's one has appeared. Further known is a crime to make an illegal gain through the fraudulent use through replacement of the semiconductor substrate in a general appliance of semiconductor device including a game machine for gamble ("pachinko machine" in Japan as a good example) and the like.

Furthermore known is still another type of fraudulent use of a terminal device which is capable of performing radio communication through a communication common carrier (i.e., a cellular phone) to evade the duty of payment on the pretense that the terminal device has been lost while being used.

SUMMARY OF THE INVENTION

The present invention is directed to a semiconductor device. According to a first aspect of the present invention, the semiconductor device comprises: N ($1 \leq N$) code generation unit formed in N semiconductor substrate in one to one correspondence, each of the N code generation unit being configured to generate an identification code inherent in a corresponding semiconductor substrate; and N memory formed in one-to-one correspondence to the N identification code, each of the N memory storing a code which coincides with a corresponding identification code as a memory code, and each of the N memory being formed in other semiconductor substrate than a corresponding semiconductor substrate.

According to a second aspect of the present invention, in the semiconductor device of the first aspect, each of the N memory comprises an OTPROM storing the memory code.

According to a third aspect of the present invention, in the semiconductor device of the first or second aspect, each of the N code generation unit comprises a semiconductor element; and a coding circuit configured to convert an electric property of the semiconductor element into a digital signal so that a value of the digital signal varies with variation in the electric property of the semiconductor element to generate the identification code and outputting the identification code.

According to a fourth aspect of the present invention, in the semiconductor device of the third aspect, the semiconductor element has a polycrystalline substance, and the variation in the electric property of the semiconductor element is caused by variation in crystal structure of the polycrystalline substance.

According to a fifth aspect of the present invention, in the semiconductor device of the first or second aspect, each of the N code generation unit comprises an OTPROM storing the identification code.

According to a sixth aspect of the present invention, the semiconductor device of any one of the first to fifth aspects further comprises: N comparator circuit formed in one-to-one correspondence to the N identification code, each of the N comparator circuit being configured to compare a corresponding identification code and a corresponding memory code to thereby judge whether these codes coincide with each other or not and outputting an enable signal representing the judgment result.

According to a seventh aspect of the present invention, in the semiconductor device of the sixth aspect, each of the N comparator circuit is formed in the semiconductor substrate corresponding to a corresponding identification code to be compared.

According to an eighth aspect of the present invention, the semiconductor device of the seventh aspect further comprises: N key generation unit, N encryption circuit and N decoder circuit formed in one-to-one correspondence to the N identification code, each of the N key generation unit, each of the N encryption circuit and each of the N decoder circuit being formed in the semiconductor substrate corresponding to a corresponding identification code, and in the semiconductor device of the eighth aspect, each of the N key generation unit generates a key for encryption inherent in a corresponding semiconductor substrate, each of the N encryption circuit encrypts the identification code generated by the code generation unit formed in a corresponding semiconductor substrate on the basis of a corresponding key and transmits the identification code of encrypted form to the corresponding memory, each of the N memory stores the identification code of encrypted form outputted from a corresponding encryption circuit as the memory code of encrypted form, each of the N decoder circuit decodes the memory code of encrypted form stored in a corresponding memory on the basis of a corresponding key, and each of the N comparator circuit compares the identification code generated by a corresponding code generation unit with the memory code decoded by a corresponding decoder circuit.

According to a ninth aspect of the present invention, in the semiconductor device of the eighth aspect, each of the N key generation unit comprises another semiconductor element; another coding circuit for converting an electric property of the another semiconductor element into another digital signal so that a value of the another digital signal varies with variation in the electric property of the another semiconductor element to generate the key and outputting the key.

According to a tenth aspect of the present invention, in the semiconductor device of the ninth aspect, the another semiconductor element has another polycrystalline substance, and the variation in the electric property of the another semiconductor element is caused by variation in crystal structure of the another polycrystalline substance.

According to an eleventh aspect of the present invention, in the semiconductor device of the eighth aspect, each of the N key generation unit comprises an OTPROM storing the key.

According to a twelfth aspect of the present invention, the semiconductor device of any one of the seventh to eleventh aspects further comprises N switching circuit formed in one-to-one correspondence to the N identification code, each of the N switching circuit being formed in the semiconductor substrate corresponding to a corresponding identification code, each of the N switching circuit being configured to exclusively perform a transmission of a corresponding identification code generated by a corresponding code generation unit to a corresponding memory and an input of the memory code stored in the corresponding memory to a corresponding comparator circuit.

According to a thirteenth aspect of the present invention, the semiconductor device of any one of the sixth to twelfth aspects further comprises a predetermined circuit including a circuit portion which selectively comes into an active state or an inactive state, depending on the N enable signal respectively corresponding to the N identification code.

According to a fourteenth aspect of the present invention, in the semiconductor device of the thirteenth aspect, the predetermined circuit is formed in one of the N semiconductor substrate together with a corresponding comparator circuit.

According to a fifteenth aspect of the present invention, in the semiconductor device of any one of the first to fourteenth aspects, the number N is one.

According to a sixteenth aspect of the present invention, in the semiconductor device of any one of the first to fourteenth aspects, the number N is two, and each of the N code generation unit and a corresponding memory are formed respectively in one and the other of the N semiconductor substrates.

The present invention is also directed to a terminal device. According to a seventeenth aspect of the present invention, the terminal device comprises: a key generation unit comprising a semiconductor element and a coding circuit configured to convert an electric property of the semiconductor element into a digital signal so that a value of the digital signal varies with variation in the electric property of the semiconductor element to generate a key for encryption and outputting the key; an encryption circuit configured to encrypt transmitting data on the basis of the key; and a decoder circuit for decoding receiving data on the basis of the key.

According to an eighteenth aspect of the present invention, in the semiconductor device of the seventeenth aspect, the encryption circuit and the decoder circuit are incorporated in a main body portion, and the key generation unit is incorporated in an auxiliary portion detachable from the main body portion.

According to a nineteenth aspect of the present invention, in the semiconductor device of the eighteenth aspect, the auxiliary portion is an IC card.

According to a twentieth aspect of the present invention, in the semiconductor device of any one of the seventeenth to nineteenth aspects, the semiconductor element has a polycrystalline substance, and the variation in the electric property of the semiconductor element is caused by variation in crystal structure of the polycrystalline substance.

According to a twenty-first aspect of the present invention, the terminal device comprises: the semiconductor device as defined in the thirteenth or fourteenth aspect, and in the terminal device of the twenty-first aspect, the predetermined circuit is a communication circuit for transmitting and receiving a signal to and from the outside, and at least one of transmission and reception is stopped when the N enable signal indicates noncoincidence between at least one of the N identification code and a corresponding memory code.

According to a twenty-second aspect of the present invention, the terminal device comprises: the semiconductor device as defined in any one of the sixth to twelfth aspects; and a communication circuit configured to transmit and receive a signal to and from the outside, and in the terminal device of the twenty-second aspect, the communication circuit transmits the N enable signal as part of the signal to the outside.

According to a twenty-third aspect of the present invention the terminal device comprises: the semiconductor device as defined in any one of the first to fifth aspects; and a communication circuit configured to transmit and receive a signal to and from the outside, and in the terminal device of twenty-third aspect, the communication circuit transmits the N identification code and the N memory code as part of the signal to the outside.

According to a twenty-fourth aspect of the present invention, in the terminal device of the twenty-third aspect, the number N is one, the N code generation unit and the communication circuit are incorporated in a main body portion, and the N memory is incorporated in an auxiliary portion detachable from the main body portion.

According to a twenty-fifth aspect of the present invention, in the terminal device of the twenty-fourth aspect, the main body portion further incorporates a first key generation unit configured to generate a first key for encryption; and a first encryption circuit configured to encrypt the identification code generated by the N code generation unit on the basis of the first key, and the auxiliary portion further incorporates a second key generation unit configured to generate a second key for encryption; and a second encryption circuit configured to encrypt the memory code stored in the N memory on the basis of the second key, the first encryption circuit also encrypts the memory code encrypted by the second encryption circuit on the basis of the first key, and the communication circuit transmits the identification code and the memory code both in a form encrypted by the first encryption circuit to the outside.

According to a twenty-sixth aspect of the present invention, in the terminal device of the twenty-fifth aspect, the first key generation unit and the first encryption circuit are formed in the N semiconductor substrate in which the N code generation unit is formed.

According to a twenty-seventh aspect of the present invention, in the terminal device of the twenty-fifth or twenty-sixth aspect, the second key generation unit and the second encryption circuit are formed in the semiconductor substrate in which the N memory is formed.

According to a twenty-eighth aspect of the present invention, in the terminal device of any one of the twenty-fourth to twenty-seventh aspects, the main body portion further incorporates a rechargeable battery, and the auxiliary portion is a battery charger which charges the battery when being attached to the main body portion.

According to a twenty-ninth aspect of the present invention, in the terminal device of any one of the twenty-fourth to twenty-seventh aspects, the auxiliary portion is an IC card, and the main body portion and the auxiliary portion each further incorporate a communication interface used for transmitting a code from the auxiliary portion to the main body portion by wireless.

According to a thirtieth aspect of the present invention, in the terminal device of any one of the twenty-second to twenty-ninth aspects, the communication circuit is formed in one of the N semiconductor substrate together with one of the N code generation unit.

According to a thirty-first aspect of the present invention, the terminal device comprises: a communication circuit configured to perform radio communication through a communication common carrier equipment; and a radio communication network circuit configured to perform radio communication by forming a radio communication network not through the communication common carrier equipment.

According to a thirty-second aspect of the present invention, the terminal device of the thirty-first aspect further comprises: a selector circuit configured to selectively perform connection and disconnection of a path through which communication signals are transmitted and received between the communication circuit and the radio communication network circuit, to selectively establish communication between a user of the terminal device and one other person through the radio communication network and a relay of communication between a plurality of persons other than the user of the terminal device through the radio communication network.

According to a thirty-third aspect of the present invention, the terminal device of the thirty-second aspect further comprises: a key generation unit configured to generate a key for encryption; an encryption circuit configured to encrypt a transmitting signal to be transmitted from the communication circuit to the radio communication network circuit, among the communication signals, on the basis of the key; and a decoder circuit configured to decode a receiving signal to be transmitted from radio communication network circuit to the communication circuit, among the communication signals, on the basis of the key, and in the terminal device of thirty-third aspect, the key generation unit comprises a code generation unit configured to generate a code for identifying the terminal device; and a key calculation unit configured to calculate a shared key sharable among the user and his communication partner, on the basis of the code generated by the code generation unit and another code transmitted from the communication partner through the radio communication network circuit.

According to a thirty-fourth aspect of the present invention, in the terminal device of the thirty-third aspect, the code generation unit comprises a semiconductor element; and a coding circuit for converting an electric property of the semiconductor element into a digital signal so that a value of the digital signal varies with variation in the electric property of the semiconductor element to generate the code and outputting the code.

According to a thirty-fifth aspect of the present invention, in the terminal device of the thirty-fourth aspect, the semiconductor element has a polycrystalline substance, and the variation in the electric property of the semiconductor element is caused by variation in crystal structure of the polycrystalline substance.

According to a thirty-sixth aspect of the present invention, in the terminal device of the thirty-third aspect, the code generation unit comprises an OTPROM storing the code.

According to a thirty-seventh aspect of the present invention, the terminal device of any one of the thirty-second to thirty-sixth aspects further comprises: a first mixer and a second mixer inserted in a path for a receiving signal to be transmitted from the radio communication network circuit to the communication circuit, among the communication signals, and in the terminal device of thirty-seventh aspect, the first mixer demodulates the receiving signal received by the communication circuit, and the second mixer modulates the demodulated receiving signal with a carrier wave having a frequency within a frequency band of the communication circuit.

The present invention is further directed to a communication method. According to a thirty-eighth aspect of the present invention, the communication method which enables a communication common carrier equipment and the terminal device as defined in the twenty-second aspect to perform mutual communication, comprises the steps of: (a) transmitting the N enable signal from the terminal device to the communication common carrier equipment; and (b) as an authentication step, performing an authentication that a user of the terminal device is an authorized user by the communication common carrier equipment when a condition that each of the N enable signal received by the communication common carrier equipment indicates coincidence between a corresponding identification code and a corresponding memory code is satisfied and not performing the authentication by the communication common carrier equipment when the condition is not satisfied.

According to a thirty-ninth aspect of the present invention, the communication method which enables a communication common carrier equipment and the terminal device as defined in the twenty-third aspect to perform mutual communication, comprises the steps of: (a) transmitting the N identification code and the N memory code from the terminal device to the communication common carrier equipment; (b) comparing each of the N identification code and a corresponding memory code which are received to judge whether each of the N identification code and a corresponding memory code coincides with each other or not by the communication common carrier equipment; and (c) as an authentication step, performing an authentication that a user of the terminal device is an authorized user by the communication common carrier equipment when a condition that a judgment result indicates coincidence between each of the N identification code and a corresponding memory code in the step (b) is satisfied and not performing the authentication by the communication common carrier equipment when the condition is not satisfied.

According to a fortieth aspect of the present invention, the communication method of the thirty-ninth aspect further comprises the step of: (e) recording the N identification code and the N memory code which are received by the communication common carrier equipment.

According to a forty-first aspect of the present invention, in the communication method of the thirty-ninth aspect, the communication common carrier equipment, in the step (c), records the N identification code and the N memory code which are received when the authentication is not performed.

According to a forty-second aspect of the present invention, the communication method comprises the steps of: (a) obtaining the N identification code of the terminal device as defined in the twenty-fourth aspect to store the N identification code as a first registered code by the communication common carrier equipment; (b) obtaining the N memory code of the terminal device to store the N memory code as a second registered code by the communication common carrier equipment; and (c) as a communication step, performing mutual communication between the communication common carrier equipment and the terminal device after the steps (a) and (b), and in the communication method of the forty-second aspect, the step (c) comprises (c-1) a first communication step which is performed when the auxiliary portion is not attached to the main body portion, and (c-2) a second communication step which is performed when the auxiliary portion is attached to the main body portion, the first communication step (c-1) comprises the steps of: (c-1-1) transmitting the N identification code from the terminal device to the communication common carrier equipment; (c-1-2) comparing the N identification code which is received with the first registered code to judge whether the N identification code and the first registered code coincide with each other or not by the communication common carrier equipment; and (c-1-3) as an authentication step, performing an authentication that a user of the terminal device is an authorized user by the communication common carrier equipment when a condition that the judgment result indicates coincidence between the N identification code and the first registered code in the step (c-1-2) is satisfied and not performing the authentication by the communication common carrier equipment when the condition is not satisfied, and the second communication step (c-2) comprises the steps of: (c-2-1) transmitting the N identification code and the N memory code from the terminal device to the communication common carrier equipment; (c-2-2) comparing the N identification code which is received with the first registered code to judge whether the N identification code and the first registered code coincide with each other or not and comparing the N memory code which is received with the second registered code to judge whether the N memory code and the second registered code coincide with each other or not by the communication common carrier equipment; and (c-2-3) as a high-level authentication step, performing a high-level authentication that a user of the terminal device is an authorized user by the communication common carrier equipment when a condition that both two judgment results indicate coincidences in the step (c-2-2) is satisfied and not performing the high-level authentication by the communication common carrier equipment when the condition is not satisfied.

According to a forty-third aspect of the present invention, in the communication method of the forty-second aspect, the communication common carrier equipment, in the step (b), obtains the N memory code of the terminal device by performing communication between the communication common carrier equipment and the terminal device with the auxiliary portion attached to the main body portion.

According to a forty-fourth aspect of the present invention, in the communication method of the forty-second or forty-third aspect, the step (c) further comprises the step of: (c-3) a changing step of changing the second registered code when the auxiliary portion is attached to the main body portion, the changing step (c-3) comprises the steps of (c-3-1) transmitting a request signal representing decision of change of the second registered code, the N identification code and the N memory code from the terminal device to the communication common carrier equipment; (c-3-2) comparing the N identification code which is received with the first registered code to judge whether the N identification code and the first registered code coincide with each other or not and comparing the N memory code which is received with the second registered code to judge whether the N memory code and the second registered code coincide with each other or not by the communication common carrier equipment; (c-3-3) permitting the change by the communication common carrier equipment only when both two judgment results indicate coincidences in the step (c-3-2); (c-3-4) changing the auxiliary portion of the terminal device and attaching a changed auxiliary portion to the main body portion after the step of (c-3-3); (c-3-5) transmitting the N identification code and the N memory code changed on the basis of the changed auxiliary portion from the terminal device to the communication common carrier equipment after the step of (c-3-4); and (c-3-6) updating the second registered code by the communication common carrier equipment with the changed N memory code which is received only when the change is permitted in the step of (c-3-3).

According to a forty-fifth aspect of the present invention, the communication method comprises the steps of: (a) obtaining the N identification code and the first key from the terminal device as defined in claim 25 to store the N identification code and the first key as a first registered code and a registered key, respectively, by the communication common carrier equipment; (b) obtaining the N memory code which is encrypted with the second key of the terminal device to store the N memory code as a second registered code by the communication common carrier equipment; and (c) as a communication step, performing mutual communication between the communication common carrier equipment and the terminal device after the steps (a) and (b), and in the communication method of forty-fifth aspect, the communication step (c) comprises (c-1) a first communication step which is performed when the auxiliary portion is not attached to the main body portion, and (c-2) a second communication step which is performed when the auxiliary portion is attached to the main body portion, the first communication step (c-1) comprises the steps of: (c-1-1) transmitting the N identification code in a form encrypted by the first encryption circuit from the terminal device to the communication common carrier equipment; (c-1-2) decoding the N identification code which is received on the basis of the registered key and comparing the N identification code with the first registered code to judge whether the N identification code and the first registered code coincide with each other or not by the communication common carrier equipment; and (c-1-3) as an authentication step, performing an authentication that a user of the terminal device is an authorized user by the communication common carrier equipment when a condition that the judgment result indicates coincidence between the N identification code and the first registered code in the step (c-1-2) is satisfied and not performing the authentication by the communication common carrier equipment when the condition is not satisfied, and the second communication step (c-2) comprises the steps of: (c-2-1) transmitting the N identification code and the N memory code both in a form encrypted by the first encryption circuit from the terminal device to the communication common carrier equipment; (c-2-2) decoding the N identification code and the N memory code which are received on the basis of the registered key and comparing the N identification code with the first registered code to judge whether the N identification code and the first registered code coincide with each other or not and comparing the N memory code with the second registered code to judge whether the N memory code and the second registered code coincide with each other or not by the communication common carrier equipment; and (c-2-3) as a high-level authentication step, performing a high-level authentication that a user of the terminal device is an authorized user by the communication common carrier equipment when a condition that both two judgment results indicate coincidences in the step (c-2-2) is satisfied and not performing the high-level authentication by the communication common carrier equipment when the condition is not satisfied.

According to a forty-sixth aspect of the present invention, in the communication method of the forty-fifth aspect, the communication common carrier equipment, in the step (b), obtains the N memory code encrypted with the second key of the terminal device by performing communication between the communication common carrier equipment and the terminal device with the auxiliary portion attached to the main body portion.

According to a forty-seventh aspect of the present invention, in the communication method of the forty-fifth or forty-sixth aspect, the step (c) further comprises: (c-3) a changing step of changing the second registered code when the auxiliary portion is attached to the main body portion, the changing step (c-3) comprises the steps of: (c-3-1) transmitting a request signal representing decision of change of the second registered code, and the N identification code and the N memory code both in a form encrypted by the first encryption circuit from the terminal device to the communication common carrier equipment; (c-3-2) decoding the N identification code and the N memory code which are received on the basis of the registered key and comparing the N identification code with the first registered code to judge whether the N identification code and the first registered code coincide with each other or not and comparing the N memory code with the second registered code to judge whether the N memory code and the second registered code coincide with each other or not by the communication common carrier equipment; (c-3-3) permitting the change by the communication common carrier equipment only when a condition that both two judgment results indicate coincidences in the step (c-3-2) is satisfied; (c-3-4) changing the auxiliary portion of the terminal device and attaching a changed auxiliary portion to the main body portion after the step of (c-3-3); (c-3-5) transmitting the N identification code and the N memory code changed on the basis of the changed auxiliary portion both in a form encrypted by the first encryption circuit from the terminal device to the communication common carrier equipment after the step of (c-3-4); and (c-3-6) updating the second registered code by the communication common carrier equipment with a code obtained by decoding the changed N memory code which is received on the basis of the registered key only when the change is permitted in the step of (c-3-3).

According to a forty-eighth aspect of the present invention, in the communication method of any one of the forty-second to forty-seventh aspects, the communication common carrier equipment, in the high-level authentication step, records each code which is compared with each registered code in the step of (c-2-2), when the high-level authentication is not performed.

According to a forty-ninth aspect of the present invention, in the communication method of any one of the forty-second to forty-eighth aspects, the communication common carrier equipment, in the high-level authentication step, records a communication charge for the communication therebefore as confirmed, when the high-level authentication is performed.

According to a fiftieth aspect of the present invention, in the communication method of any one of the forty-second to forty-ninth aspects, the communication common carrier equipment, in the high-level authentication step, records that the high-level authentication has been performed when the high-level authentication is performed, and the communication common carrier equipment, in the authentication step, performs the authentication on a further condition that there is a record that the high-level authentication has been performed.

According to a fifty-first aspect of the present invention, in the communication method of any one of the forty-second to fiftieth aspects, the communication common carrier equipment, in the high-level authentication step, records a business transaction through the communication therebefore as concluded when the high-level authentication is performed and records the business transaction through the communication therebefore as not concluded when the high-level authentication is not performed.

According to a fifty-second aspect of the present invention, in the communication method of any one of the thirty-eighth to fifty-first aspects, the communication common carrier equipment, in the authentication step, continues the communication when the authentication is performed and stops the communication when the authentication is not performed.

According to a fifty-third aspect of the present invention, the communication method enables communication between terminal devices each of which is capable of performing radio communication through a communication common carrier equipment and forming a radio communication network not through the communication common carrier equipment in a space where people in crowds carrying the terminal devices assemble or pass by, by forming the radio communication network among the terminal devices carried by at least some of the people, even when a region where the radio communication can not be performed through the communication common carrier equipment exists in the space.

According to a fifty-fourth aspect of the present invention, in the communication method of the fifty-third aspect, some of the plurality of terminal devices which form the radio communication network perform the radio communication through the communication common carrier equipment, to enable the others of the terminal devices which form the radio communication network to establish communication through the radio communication network and further through the communication common carrier equipment.

According to a fifty-fifth aspect of the present invention, in the communication method of the fifty-third or fifty-fourth aspect, a pair of terminal devices performing mutual communication through the radio communication network, which constitute part of the terminal devices which form the radio communication network, calculate a shared key by exchanging codes for identifying themselves and transmit a communication signal in a form encrypted on the basis of the shared key to each other.

According to a fifty-sixth aspect of the present invention, in the communication method of any one of the fifty-third to fifty-fifth aspects, the communication through the radio communication network is permitted only for emergency communication.

According to a fifty-seventh aspect of the present invention, in the communication method of any one of the fifty-third to fifty-sixth aspects, another terminal device capable of forming the radio communication network is installed in the region where the radio communication through the communication common carrier equipment is not performed, to thereby enable formation of the radio communication network even when the population density of persons carrying the terminal devices is low.

In the semiconductor device of the first aspect of the present invention, since the code for identifying the semiconductor substrate is stored in one other semiconductor substrate, a fraudulent use of an appliance incorporating the present device through replacement of the semiconductor substrate can be prevented by checking these codes.

In the semiconductor device of the second aspect of the present invention, since the code is stored in the OTPROM of the memory, there is a high barrier (security) against a fraudulent change of the code stored in the memory.

In the semiconductor device of the third aspect of the present invention, since the identification code is generated by using the variation in the electric properties of the semiconductor elements, it is possible to use the semiconductor elements manufactured through the same process among a lot of mass-produced present devices. Therefore, the manufacturing process of the present device can be simplified. Further, since the electric property of the semiconductor element on which the identification code is based can not be changed from the outside, there is a high barrier against a fraudulent change of the identification code.

In the semiconductor device of the fourth aspect of the present invention, since the semiconductor element has a polycrystalline substance and the identification code is generated by using the variation (i.e. dispersion) in crystal structure of the polycrystalline substance, there is large variation in the electric property of the semiconductor elements manufactured through the same process. Therefore, it is easy to prevent coincidence of the identification codes among a lot of mass-produced present devices.

In the semiconductor device of the fifth aspect of the present invention, since the identification code is stored in the OTPROM of the code generation unit, there is a high barrier against a fraudulent change of the identification code generated by the code generation unit.

In the semiconductor device of the sixth aspect of the present invention, since the comparator circuit makes judgment on coincidence of the codes, it is possible to use the enable signal for authentication.

In the semiconductor device of the seventh aspect of the present invention, the comparator circuit is formed in the semiconductor substrate in which the code generation unit is formed, it is impossible to fraudulently change the identification code inputted from the code generation unit to the comparator circuit in the same semiconductor substrate from the outside. Therefore, there is a higher barrier against the fraud use.

In the semiconductor device of the eighth aspect of the present invention, since the codes are transmitted in the encrypted form between the different semiconductor substrates, it is impossible to read the codes from the outside. Therefore, there is a still higher barrier against the fraud use.

In the semiconductor device of the ninth aspect of the present invention, since the key is generated by using the variation in the electric properties of the semiconductor elements, it is possible to use the semiconductor elements manufactured through the same process among a lot of mass-produced present devices. Therefore, the manufacturing process of the present device can be simplified. Further, since the electric property of the semiconductor element on which the key is based can not be changed from the outside, there is a high barrier against a fraudulent change of the key.

In the semiconductor device of the tenth aspect of the present invention, since the semiconductor element has a polycrystalline substance and the key is generated by using the variation (i.e. dispersion) in crystal structure of the polycrystalline substance, there is large variation in the electric property of the semiconductor elements manufactured through the same process. Therefore, it is easy to prevent coincidence of the keys among a lot of mass-produced present devices.

In the semiconductor device of the eleventh aspect of the present invention, since the key is stored in the OTPROM of the key generation unit, there is a high barrier against a fraudulent change of the key generated by the key generation unit.

Since the semiconductor device of the twelfth aspect of the present invention comprises the switching circuit, it is possible to prevent a fraudulent use through inputting the identification code outputted from the semiconductor substrate, which fakes the memory code, to the same semiconductor substrate.

Since the semiconductor device of the thirteenth aspect of the present invention comprises the predetermined circuit including the circuit portion which selectively comes into an active state or an inactive state, depending on the judgment of the comparator circuit, it is possible to enable or disable a predetermined operation of the appliance depending on the comparison result, by using the predetermined circuit as part of a circuit for achieving the function of the appliance.

In the semiconductor device of the fourteenth aspect of the present invention, since the predetermined circuit is formed in one of the semiconductor substrates in which the code generation unit and the comparator circuit are formed, the enable signal inputted from the comparator circuit to th predetermined circuit in the same semiconductor substrate can not be inputted from the outside. Therefore, there is a still higher barrier against the fraud use.

The semiconductor device of the fifteenth aspect of the present invention has the simplest structure in which the code generation unit is formed in one of the two semiconductor substrates and the memory is formed in the other and the code which coincides with the identification code inherent in the one of the semiconductor substrates is stored in the other semiconductor substrate. Therefore, it is easy to manufacture the device and it is possible to reduce the size of the device.

In the semiconductor device of the sixteenth aspect of the present invention, the code generation unit and the memory are each formed in both the two semiconductor substrates and the two semiconductor substrates store the codes each of which coincides with the other's identification code, it is possible to suppress the number of semiconductor substrates to the minimum and achieve a higher barrier against the fraudulent use.

In the terminal device of the seventeenth aspect of the present invention, since the data are transmitted and received in the encrypted form to and from the outside, there is a high barrier against leakage of information that the data represent. Moreover, since the key for encryption is generated by using the variation in the electric properties of the semiconductor elements, it is possible to use the semiconductor elements manufactured through the same process among a lot of mass-produced present devices. Therefore, the manufacturing process of the present device can be simplified. Further, since the electric property of the semiconductor element on which the key is based can not be changed from the outside, there is a high barrier against a fraudulent change of the key.

In the terminal device of the eighteenth aspect of the present invention, since the key generation unit is incorporated in the auxiliary portion detachable from the main body portion, a key can be used for a plurality of main body portions.

In the terminal device of the nineteenth aspect of the present invention, since the key generation unit is incorporated in the IC card, this is convenient to carry.

In the terminal device of the twentieth aspect of the present invention, since the semiconductor element has a polycrystalline substance and the key is generated by using the variation (i.e. dispersion) in crystal structures of the polycrystalline substances, there is large variation in the electric property of the semiconductor elements manufactured through the same process. Therefore, it is easy to prevent coincidence of the keys among a lot of mass-produced present devices.

Since the terminal device of the twenty-first aspect of the present invention comprises the communication circuit which stops at least one of transmission and reception when the judgment of the comparator circuit indicates noncoincidence, it is possible to automatically suppress a fraudulent use of the appliance incorporating the present device for communication through replacement of the semiconductor substrate, by the action of the terminal device itself without a procedure of the communication common carrier equipment.

In the terminal device of the twenty-second aspect of the present invention, since the enable signal is transmitted, the communication common carrier equipment performs the authentication on the basis of the enable signal to prevent a fraudulent use of the appliance incorporating the present device for communication through replacement of the semiconductor substrate.

In the terminal device of the twenty-third aspect of the present invention, since the identification code and the memory code are transmitted, the communication common carrier equipment compares these codes and performs the authentication on the basis of the comparison result to prevent a fraudulent use of the appliance incorporating the present device for communication through replacement of the semiconductor substrate.

In the terminal device of the twenty-fourth aspect of the present invention, since the memory is incorporated in the auxiliary portion detachable from the main body portion, the communication common carrier equipment can perform the authentications of different levels in two cases where the main body portion and the auxiliary portion are combined and where the main body portion and the auxiliary portion are not combined. For example, through the high-level authentication performed when the main body portion and the auxiliary portion is combined, the communication common carrier equipment can record the communication charge for the communication therebefore as confirmed and it is possible to prevent an illegal action of evading the duty of payment on the pretence that the terminal device has been lost.

In the terminal device of the twenty-fifth aspect of the present invention, since the identification code and the memory code are transmitted in the encrypted form, there is a high barrier against leakage of the codes.

In the terminal device of the twenty-sixth aspect of the present invention, since the first key generation unit and the first encryption circuit are formed in a single semiconductor substrate together with the code generation unit, there is a higher barrier against leakage of the identification code and the first key.

In the terminal device of the twenty-seventh aspect of the present invention, since the second key generation unit and the second encryption circuit are formed in a single semiconductor substrate together with the memory, there is a higher barrier against leakage of the memory code and the second key.

In the terminal device of the twenty-eighth aspect of the present invention, since the auxiliary portion is the battery charger which charges the battery of the main body portion, the main body portion and the auxiliary portion are periodically combined without requesting an extra labor of the user.

In the terminal device of the twenty-ninth aspect of the present invention, since the auxiliary portion is the IC card, this is convenient to carry. Further, since the codes are transmitted between the main body portion and the auxiliary portion by wireless, it is possible to achieve combination of the main body portion and the auxiliary portion only by carrying the IC card and the main body portion.

In the terminal device of the thirtieth aspect of the present invention, since the communication circuit is formed in one of the semiconductor substrates in which the code generation unit is formed, the enable signal or the codes inputted to the communication circuit in the same semiconductor substrate can not inputted from the outside. Therefore, there is a higher barrier against the fraudulent use.

In the terminal device of the thirty-first aspect of the present invention, the communication can be established in the space where people in crowds carrying the terminal devices assemble or pass by, by forming the radio communication network among the terminal devices carried by at least some of the people, even when the region where the radio communication through the communication common carrier equipment can not be performed, e.g., an underground shopping area, exists in the space.

Since the terminal device of the thirty-second aspect of the present invention comprises the selector circuit, not only the terminal device can relay the communication between other persons other than the user of the terminal device through the radio communication network, but also the user of the terminal device can perform communication through the radio communication network.

In the terminal device of the thirty-third aspect of the present invention, since the shared key can be set by exchanging the codes with the communication partner and the communication signal is transmitted in the form encrypted on the basis of the shared key, there is a high barrier against leakage of the content of communication with any communication partner.

In the terminal device of the thirty-fourth aspect of the present invention, since the code on which the shared key is based is generated by using the variation in the electric properties of the semiconductor elements, it is possible to use the semiconductor elements manufactured through the same process among a lot of mass-produced present devices. Therefore, the manufacturing process of the present device can be simplified. Further, since the electric property of the semiconductor element on which the code is based can not be changed from the outside, there is a high barrier against the fraudulent change of the code.

In the terminal device of the thirty-fifth aspect of the present invention, since the semiconductor element has a polycrystalline substance and the code is generated by using the variation (i.e. dispersion) in crystal structure of the polycrystalline substance, there is large variation in the electric property of the semiconductor elements manufactured through the same process. Therefore, it is easy to prevent coincidence of the codes among a lot of mass-produced present devices.

In the terminal device of the thirty-sixth aspect of the present invention, since the code is stored in the OTPROM of the code generation unit, there is a high barrier against a fraudulent change of the code generated by the code generation unit.

In the terminal device of the thirty-seventh aspect of the present invention, since the signal received by the radio communication network circuit is transmitted to the communication circuit after being demodulated and then modulated, it is possible to enhance the utilization ratio of the frequency band of the communication circuit.

In the communication method of the thirty-eighth aspect of the present invention, since the enable signal transmitted from the terminal device is used for the authentication, it is possible to prevent a fraudulent use of the appliance incorporating the present device for communication through replacement of the semiconductor substrate.

In the communication method of the thirty-ninth aspect of the present invention, since the identification code and the memory code transmitted from the terminal device are used for the authentication, it is possible to prevent a fraudulent use of the appliance incorporating the present device for communication through replacement of the semiconductor substrate.

In the communication method of the fortieth aspect of the present invention, since the identification code and the memory code which are received are recorded, it is possible to effectively suppress a crime with the fraudulent use before being committed. Further, if the fraudulent use is made, the recorded code can be useful for specifying the unauthorized user.

In the communication method of the forty-first aspect of the present invention, since the identification code and the memory code which are received are recorded when the authentication is not performed in the authentication step, i.e., when the user is not authorized, the recorded codes can be useful for specifying the unauthorized user.

In the communication method of the forty-second aspect of the present invention, the authentications of different levels are performed in two cases where the main body portion and the auxiliary portion are combined and where the main body portion and the auxiliary portion are not combined. Since the high-level authentication in combination of the main body portion and the auxiliary portion is performed only when both the identification code and the memory code coincide with the registered codes, the high-level authentication proves that the terminal device is used validly with higher accuracy. Therefore, the communication common carrier equipment can selectively use the two authentications in accordance with the importance of procedure.

In the communication method of the forty-third aspect of the present invention, since the memory code to be registered is transmitted to the communication common carrier equipment by performing communication with the auxiliary portion attached to the main body portion, only the identification code has to be registered before the terminal device is supplied for the user.

In the communication method of the forty-fourth aspect of the present invention, since the second registered code can be changed, the user can change the auxiliary portion as necessary after acquiring the terminal device.

In the communication method of the forty-fifth aspect of the present invention, the authentications of different levels are performed in two cases where the main body portion and the auxiliary portion are combined and where the main body portion and the auxiliary portion are not combined. Since the high-level authentication in combination of the main body portion and the auxiliary portion is performed only when both the identification code and the memory code coincide with the registered codes, the high-level authentication proves that the terminal device is used validly with higher accuracy. Therefore, the communication common carrier equipment can selectively use the two authentications in accordance with the importance procedure. Moreover, since the identification code and the memory code are transmitted in the encrypted form, there is a high barrier against leakage of the codes.

In the communication method of the forty-sixth aspect of the present invention, since the memory code to be registered is transmitted to the communication common carrier equipment by performing communication with the auxiliary portion attached to the main body portion, only the identification code has to be registered before the terminal device is supplied for the user.

In the communication method of the forty-seventh aspect of the present invention, since the second registered code can be changed, the user can change the auxiliary portion as necessary after acquiring the terminal device.

In the communication method of the forty-eighth aspect of the present invention, since the identification code and the memory code which are received are recorded when the high-level authentication is not performed in the high-level authentication step, i.e., when there is strong possibility that the user is not authorized, the recorded codes can be useful for specifying the unauthorized user.

In the communication method of the forty-ninth aspect of the present invention, since the communication charge for communication therebefore is recorded as confirmed when the high-level authentication is performed in the high-level authentication step, i.e., when there is strong possibility that the user is authorized, it is possible to prevent an illegal action of evading the duty of payment on the pretence that the terminal device has been lost.

In the communication method of the fiftieth aspect of the present invention, since the judgment result made in the past high-level authentication step is reflected on the normal authentication performed with the auxiliary portion not attached to the main body portion, it is possible to perform an important procedure such as business transaction under the normal authentication.

In the communication method of the fifty-first aspect of the present invention, since whether the business transaction through the communication therebefore is concluded or not is recorded in accordance with whether the high-level authentication is performed or not in the high-level authentication step, it is possible to resolve or reduce the loss through the illegal business transaction based on the fraudulent use of the terminal device.

In the communication method of the fifty-second aspect of the present invention, since the communication is continued or stopped in accordance with the authentication is performed or not in the authentication step, it is possible to prevent the communication based on the fraudulent use of the terminal device.

In the communication method of the fifty-third aspect of the present invention, the communication can be established in the space where people in crowds carrying the terminal devices having the predetermined function assemble or pass by, by forming the radio communication network among the terminal devices carried by at least some of the people, even when the region where the radio communication through the communication common carrier equipment can not be performed, e.g., an underground shopping area, exists in the space.

In the communication method of the fifty-fourth aspect of the present invention, since some of the terminal devices which form the radio communication network perform the radio communication through the communication common carrier equipment to enable the others of the terminal devices to perform communication through the radio communication network and further through the communication common carrier equipment, it becomes possible to establish the radio communication through the communication common carrier equipment from the region where the radio communication through the communication common carrier equipment can not be performed, e.g., an underground shopping area.

In the communication method of the fifty-fifth aspect of the present invention, since the shared key is set by exchanging the codes with the communication partner and the communication signal is transmitted in the form encrypted on the basis of the shared key, there is a high barrier against leakage of the content of communication with any communication partner.

In the communication method of the fifty-sixth aspect of the present invention, since the communication through the radio communication network is permitted only for emergency communication, such as a request for aid at the time when an emergency which endangers life and property occurs, this does not need the procedure of encryption for preventing leakage of the content of communication.

In the communication method of the fifty-seventh aspect of the present invention, since the terminal device capable of forming the radio communication network is installed in the region where the radio communication through the communication common carrier equipment can not be performed, e.g., an underground shopping area, the communication through the radio communication network can be established even when the population density of persons carrying the terminal devices having the predetermined function is low in the region.

An object of the present invention is to provide a semiconductor device, a terminal device and a communication method to enhance the technical barrier (security) against various types of fraudulent use. A further object of the present invention is to provide a terminal device and a communication method which achieve higher convenience in radio communication by utilizing this technique.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a semiconductor device in accordance with a first preferred embodiment of the present invention;

FIG. 2 is a block diagram showing a code generation unit of FIG. 1;

FIG. 5 is a plan view showing a semiconductor element of FIG. 2;

FIG. 6 is a graph representing the properties of the semiconductor element of FIG. 2;

FIG. 7 is a block diagram showing another example of the code generation unit of FIG. 1;

FIG. 8 is a block diagram showing a memory of FIG. 1;

FIG. 16 is a block diagram showing a terminal device in accordance with a third preferred embodiment of the present invention;

FIG. 32 is a block diagram showing another example of the terminal device in accordance with the seventh preferred embodiment of the present invention;

FIG. 52 is a block diagram showing still another example of the terminal device in accordance with the tenth preferred embodiment of the present invention;

FIG. 57 is a circuit diagram showing a semiconductor element in accordance with a twelfth preferred embodiment of the present invention;

FIG. 58 is an illustration for explaining an operation of the semiconductor element of FIG. 57;

FIG. 62 is a circuit diagram showing still another example of the semiconductor element in accordance with the twelfth preferred embodiment of the present invention;

DESCRIPTION OF THE PREFERRED EMBODIMENTS

Figure 3:
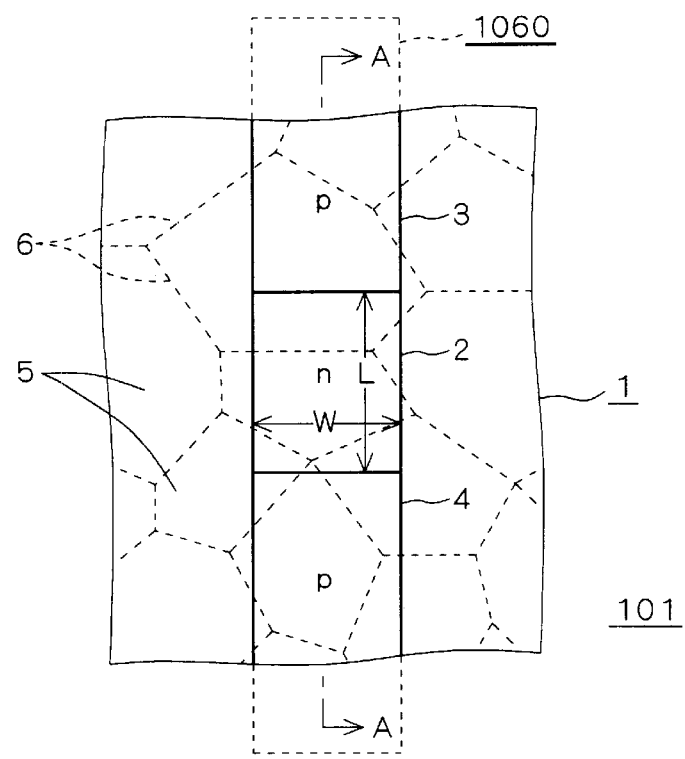
FIG. 3 is a plan view showing a semiconductor element of FIG. 2.

First of all, explanation on a term used in the present specification will be presented. In the present specification, "coincidence" of codes is not limited to complete coincidence, but includes approximation within a predetermined range.

[1. The First Preferred Embodiment]

In the first preferred embodiment, description will be made on a semiconductor device having a constitution in which an identification code inherent in one of two semiconductor substrate is stored in the other semiconductor substrate, which makes it possible to prevent a fraudulent use through replacement of the semiconductor substrate, and a terminal device as an appliance of the semiconductor device.

[1.1. Semiconductor Device]

FIG. 1 is a block diagram showing a constitution of a semiconductor device in accordance with the first preferred embodiment of the present invention. This semiconductor device 600 comprises a code generation unit 400, a comparator circuit 403, a predetermined circuit 405 and a memory 601. The code generation unit 400, the comparator circuit 403 and the predetermined circuit 405 are formed in a semiconductor substrate CH1 and the memory 601 is formed in another semiconductor substrate CH2. The semiconductor substrates CH1 and CH2 may be either molded ones or bare chips, and mounted on a single circuit board or a plurality of circuit boards.

The code generation unit 400 generates an identification code Cd inherent in the semiconductor substrate CH1. The memory 601 stores the identification code Cd generated by the code generation unit 400 as a memory code Co. The identification code Cd is transmitted from the code generation unit 400 to the memory 601 and written into the memory 601 before shipment of the semiconductor device 600 as a product.

The comparator circuit 403 compares the identification code Cd generated by the code generation unit 400 with the memory code Co read out from the memory 601, judges whether these codes coincide with each other or not and outputs an enable signal (or a judgement signal) En representing the judgment result. To judge complete coincidence, the comparator circuit 403 may be a conventionally well-known comparator which judges whether the difference between the two codes is zero or not. To obtain approximation within a predetermined range, the comparator circuit 403 has only to compare the magnitude of difference of these codes with a predetermined reference value. The magnitude of difference can be estimated by numeral value of difference or the number of bits which are different between the codes. Further, there may be a constitution of the semiconductor device 600 where the reference value can be inputted from the outside and a user of the semiconductor device 600 can set the reference value to a desired value.

Figure 65:
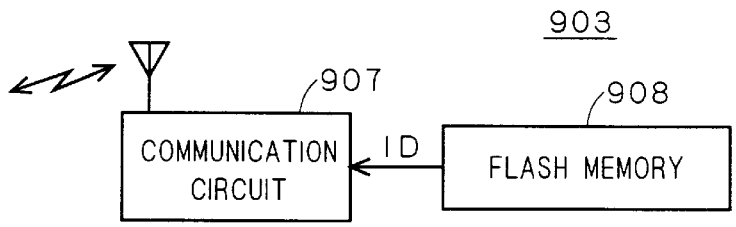
FIG. 65 is a block diagram showing a communication terminal in the background art.

The predetermined circuit 405 consists of a plurality of circuit elements to achieve a predetermined function and includes a circuit portion which selectively comes into an active state or inactive state on the basis of the enable signal En outputted from the comparator circuit 403. The communication circuit 907 of FIG. 65 is an example of the predetermined circuit 405.

In the semiconductor device 600 having the above constitution, only when the identification code Cd generated by the code generation unit 400 and the memory code Co read out from the memory 601 coincide with each other, all the portions of the predetermined circuit 405 operate. Therefore, by using the predetermined circuit 405 as part of the circuits to achieve functions of an appliance, it is possible to enable or disable a predetermined operation of the appliance. If it is intended that the semiconductor substrate CH1 or CH2 is replaced with one other semiconductor substrate for fraudulent use of the appliance, the appliance can not perform a predetermined operation since the identification code Cd and the memory code Co do not coincide with each other. Thus, the fraudulent use of the appliance incorporating the semiconductor device 600 through replacement of the semiconductor substrate can be prevented.

There may be another constitution where the code generation unit 400 and the comparator circuit 403 are formed in a single semiconductor substrate CH3 and the predetermined circuit 405 is formed in one other semiconductor substrate. In the constitution where the predetermined circuit 405 is formed in the single semiconductor substrate CH1 together with the code generation unit 400 and the comparator circuit 403, however, the enable signal En inputted from the comparator circuit 403 to the predetermined circuit 405 can not be inputted from the outside. Therefore, the barrier (security) against the fraudulent use advantageously becomes higher.

Further, there may be still another constitution where the comparator circuit 403 is formed in a semiconductor substrate other than the semiconductor substrate in which the code generation unit 400 is formed. In the constitution where the comparator circuit 403 is formed in the signal semiconductor substrate CH1 or CH3 together with the code generation unit 400, however, the identification code Cd inputted from the code generation unit 400 to the comparator circuit 403 can not be fraudulently changed from the outside. Therefore, the barrier against the fraudulent use advantageously becomes higher.

Furthermore, there may be yet another constitution where the semiconductor device 600 does not comprise the predetermined circuit 405. In this case, the predetermined circuit 405 has only to be formed in the appliance separately from the semiconductor device 600. Alternatively, there may be another constitution of the appliance where the enable signal En is taken out of the appliance and the active/inactive state of the appliance is directed from the outside in accordance with the value of the enable signal En. A terminal device of the third preferred embodiment described later is an example of this type of appliance.

Furthermore, there may be a further constitution where the semiconductor device 600 comprise neither the predetermined circuit 405 nor the comparator circuit 403. In this case, the predetermined circuit 405 and the comparator circuit 403 have only to be formed in the appliance separately from the semiconductor device 600. Alternatively, there may be still another constitution of the appliance where the identification code Cd and the memory code Co are taken out of the appliance and the active/inactive state of the appliance is directed from the outside in accordance with the values of the identification code Cd and the memory code Co. A terminal device of the fourth preferred embodiment described later is an example of this type of appliance.

[1.2. Code Generation Unit]

FIG. 2 is a block diagram showing a preferable internal constitution of the code generation unit 400. In the example of FIG. 2, the code generation unit 400 comprises a semiconductor element 401 and a coding circuit 402. The coding circuit 402 reads the electric property of the semiconductor element 401 as an analog signal An and converts it into a digital signal. The digital signal obtained by the conversion is outputted as the identification code Cd.

As the electric property of the semiconductor element 401 selected is a property which varies from one semiconductor element 401 to another. The identification code Cd, which is generated as a value which varies from one semiconductor element 401 to another, is inherent in the semiconductor substrate in which the code generation unit 400 is formed. Since the semiconductor elements 401 manufactured through the same process can be used among a lot of mass-produced semiconductor devices 600, the manufacturing process of the semiconductor device 600 can be simplified. Further, since the electric property of the semiconductor element 401 on which the identification code Cd is based can not be changed from the outside, the barrier against the fraudulent change of the identification code Cd is advantageously high.

The semiconductor element 401 has polycrystalline substance for example, and a property which varies (i.e. disperses) with variation (i.e. dispersion) in crystal structures of the polycrystalline substances can be used as the electric property. This Example will be described later with reference to FIGS. 3 to 6. Further, the semiconductor element 401 comprises a MOSFET for example, and the variation in threshold values caused by variation in impurity concentrations of the impurity diffusion regions may be used.

Figure 4:
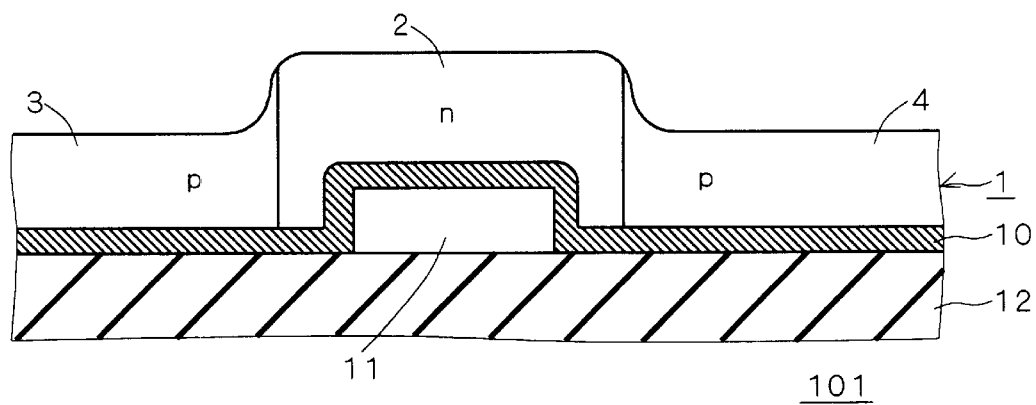
FIG. 4 is a cross section taken along the line A—A of the semiconductor element of FIG. 3.

FIG. 3 is a plan view showing a preferable example of the semiconductor element 401. FIG. 4 is a cross section taken along the line A—A of FIG. 3. In this example, the semiconductor element 401 has a thin-film transistor (hereinafter, abbreviated as TFT) 101 and a semiconductor layer 1060 including a channel region of the TFT 101 is formed as a polycrystalline substance. Further, though a semiconductor layer 1 formed as an intermediate in the manufacturing process of the semiconductor element 401 is shown for easy illustration, the semiconductor layer 1 is selectively etched in the manufacturing process, being patterned into the semiconductor layer 1060 in the semiconductor element 401 as a finished product.

In the TFT 101, a gate electrode 11 is selectively formed on an insulating film 12 and a whole surface of the insulating film 12 and the gate electrode 11 is covered with an insulating film 10. On the insulating film 10, the semiconductor layer 1 is formed. Discussing exemplary materials for these constituent elements, the insulating film 12 is made of silicon oxide, the gate electrode 11 is made of polysilicon doped with impurity, the insulating film 10 is made of silicon oxide such as TEOS and the semiconductor layer 1 is mainly made of silicon.

In the semiconductor layer 1, a channel region 2 positioned above the gate electrode 11, a source region 3 and a drain region 4 which sandwich the channel region 2 are formed. A portion of the insulating film 10 in contact with the channel region 2 serves as a gate insulating film. In the examples of FIGS. 3 and 5, the conductivity type of the channel region 2 is n type and the conductivity type of the source region 3 and the drain region 4 is p type. Specifically, the TFT 101 is formed as a p-channel type MOS TFT, as an example. Needless to say, the TFT 101 may be formed as an n-channel type MOS TFT.

The semiconductor layer 1 is formed as a polycrystalline semiconductor layer, and as shown in FIG. 3, includes numberless grains 5 and a grain boundary 6 which is positioned at an interface therebetween and has crystal disturbance. A crystal orientation is uniform in each crystal grain 5, while the crystal orientations are generally different among different crystal grains 5. The size and arrangement of the grains 5 are random and vary in the process of forming the semiconductor layer 1. Specifically, even when a lot of TFTs 101 are manufactured through the same manufacturing process, the crystal structure of the semiconductor layer 1 varies from one TFT 101 to another.

As a result, assuming that the TFT 101 represents one unity and a TFT 102 is distinguished from the TFT 101 as a unity different from the TFT 101 and manufactured through the same process as that of the TFT 101 as shown in FIG. 5, the amount of grain boundaries 6 occupying the channel region 2 in the TFT 101 is not equal to that in the TFT 102. FIG. 5 shows an example of the TFT 102 which contains less grain boundaries 6 in the channel region 2 than the TFT 1.

As to the polycrystalline TFT, it is known that its property varies with the amount of grain boundaries 6 contained in the channel region 2. This is shown in, e.g., IEEE Transactions on Electron Devices, Vol. 45, No. 1, January (1998), pp. 165-172 (document 3). Specifically, as FIG. 6 shows the relationship between a gate voltage Vg and a drain current Id of the TFTs 101 and 102, the drain current Id in the TFT 101 in which more grain boundaries 6 are contained in the channel region 2 is smaller under the same gate voltage Vg0 than that in the TFT 102 in which less grain boundaries 6 are contained in the channel region 2 (Ida<Idb).

Therefore, the variation in the crystal structure of the polycrystalline substance of the TFT 101 can be used for identification of the semiconductor substrate. Since the electric property which is different from one semiconductor substrate to another is caused by the variation in the crystal structure of the polycrystalline substance, the electric property can not be rewritten from the outside, unlike the identification code which is recorded in the flash memory 908 (FIG. 65). Therefore, it is possible to enhance the security level against the fraudulent use of the appliance.

Moreover, unlike the technique to program the identification code into the flash memory 908, a labor of programming is not needed. Further, since the property different from one semiconductor substrate to another can be obtained through the same manufacturing process unlike the technique to record the identification code into the mask ROM, the manufacturing process is simplified and the number of process steps and the manufacturing cost can be reduced. Furthermore, the variation in the crystal structures of the polycrystalline substances is large, and the variation in the electric properties caused by the variation in the crystal structures is accordingly large. Therefore, it is possible to ensure a large range of variation in the identification codes Cd. In other words, it is easy to prevent coincidence of the identification codes among a lot of massproduced semiconductor devices 600.

Further, though the manufacturing process is complicated, there may be another structure where only the channel region 2 is formed of polycrystalline semiconductor and the source region 3 and the drain region 4 are formed of single crystalline semiconductor, and also in this case, the property varies randomly.

The electric property of the semiconductor element 401 shown in FIGS. 2 to 6 may be subtlety changed by the change of temperature and time. It is accordingly supposed that the identification code Cd does not hold a completely constant value and varies to some degree. To solve this problem, the comparator circuit 403 has to judge the coincidence of the identification codes within a margin considering the change of the identification code Cd.

As an example of the semiconductor element 401 having the polycrystalline substance, besides the TFTs shown in FIGS. 3 to 6, other elements such as a resistive element having the polycrystalline substance and a capacitive element having the polycrystalline substance can also be used. Further, the semiconductor element 401 may have a plurality of TFTs and the like. As the number of TFTs increases, the variation in the identification codes Cd becomes larger. This will be discussed later in detail in the twelfth preferred embodiment.

[1.3. Example Using OTPROM]

FIG. 7 is a block diagram showing another preferable internal constitution of the code generation unit 400. In the example of FIG. 7, the code generation unit 400 comprises an OTP (One Time Programmable) ROM 602 which is a nonvolatile memory programmable only one time. Before the shipment of the semiconductor device 600, the identification code Cd is written in the OTPROM 602. After the semiconductor device 600 is supplied for a user thereafter, it is technically impossible to rewrite the identification code Cd written in the OTPROM 602. In other words, in the example of FIG. 7, a high technical barrier against the fraudulent use of the identification code Cd generated by the code generation unit 400 is advantageously achieved.

The OTPROM is suitable for the use in the memory 601 as shown in FIG. 8, as well as in the code generation unit 400. In the example of FIG. 8, the memory 601 comprises the OTPROM 602. Before the shipment of the semiconductor device 600, the identification code Cd transmitted from the code generation unit 400 is written in the OTPROM 602 in the memory 601 as the memory code Co. After the semiconductor device 600 is supplied for a user thereafter, it is technically impossible to rewrite the memory code Co written in the OTPROM 602. In other words, in the example of FIG. 8, a high technical barrier against the fraudulent use of the memory code Co stored in the memory 601 is advantageously achieved. It is also thereby possible to prevent a fraudulent use through replacement of the semiconductor substrate in which the code generation unit 400 is formed and rewriting of the memory code Co stored in the memory 601 at the same time so as to coincide with the identification code Cd of a new semiconductor substrate.

[1.4. Terminal Device]

Figure 9:
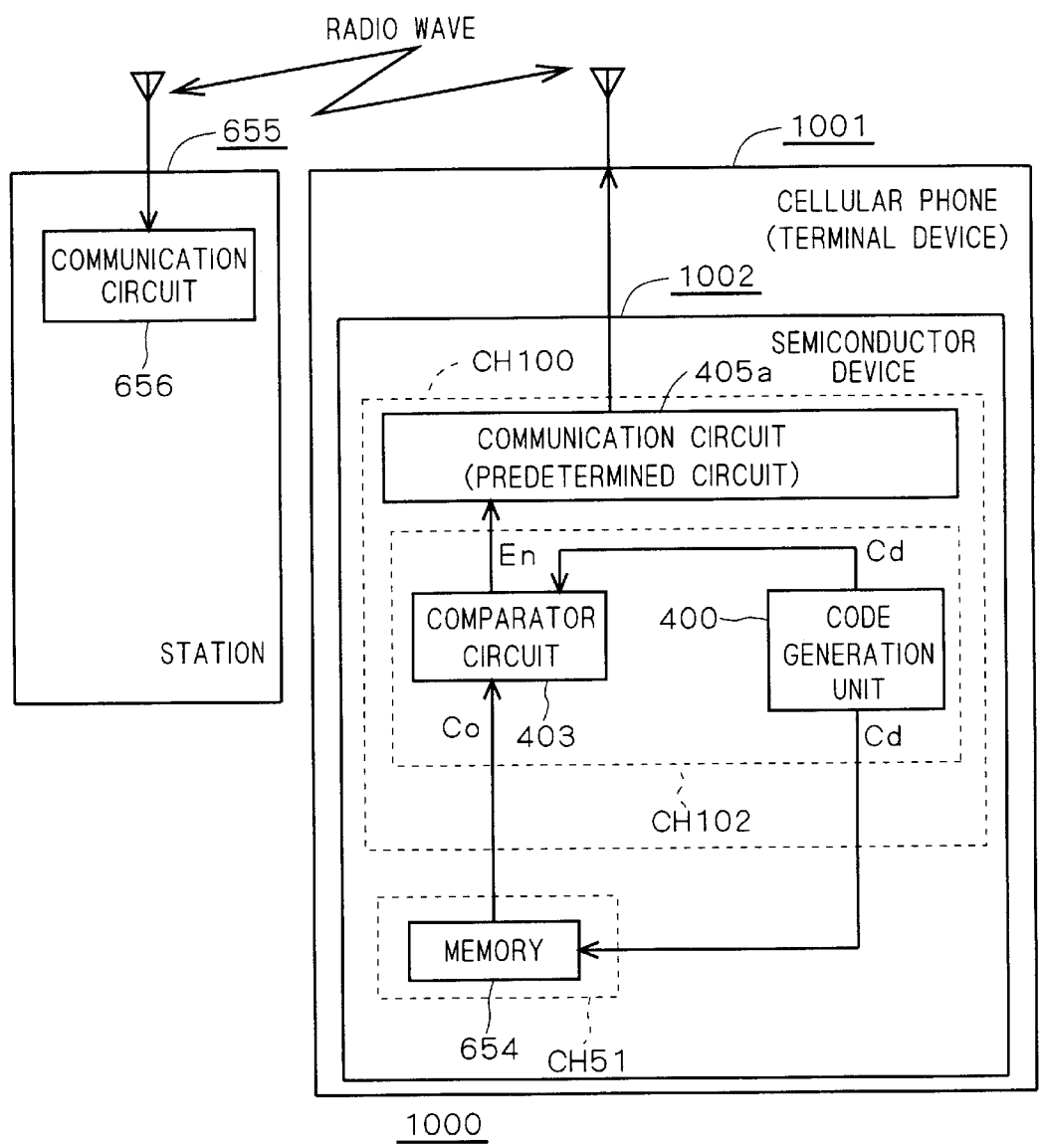
FIG. 9 is a block diagram showing a terminal device in accordance with the first preferred embodiment of the present invention.

FIG. 9 is a block diagram showing a constitution of a terminal device as an appliance of the semiconductor device 600. The terminal device 1001 is constituted as a cellular phone. A semiconductor device 1002 in the terminal device 1001 is an example of the semiconductor device 600 shown in FIG. 1 and comprises a communication circuit 405a as the predetermined circuit 405.

Though it is preferable that the code generation unit 400, the comparator circuit 403 and the communication circuit 405a are formed in a single semiconductor substrate CH100, only the comparator circuit 403 and the code generation unit 400 may be formed in a single semiconductor substrate CH102, or only the code generation unit 400 may be formed in a single semiconductor substrate. In any case, a memory 654 storing the memory code Co is formed in a semiconductor substrate CH51 different from the semiconductor substrate in which the code generation unit 400 is formed.

An communication common carrier (referred to as "station" as necessary) equipment 655 which is an equipment of the communication common carrier through which the communication of the terminal device 1001 is performed comprises a communication circuit 656. Between the communication circuit 405a and the communication circuit 656, a communication signal whose contents are voice, data and the like is transmitted by wireless (with radio wave). The terminal device 1001 and the communication common carrier equipment 655 constitute a communication system 1000.

Figure 10:
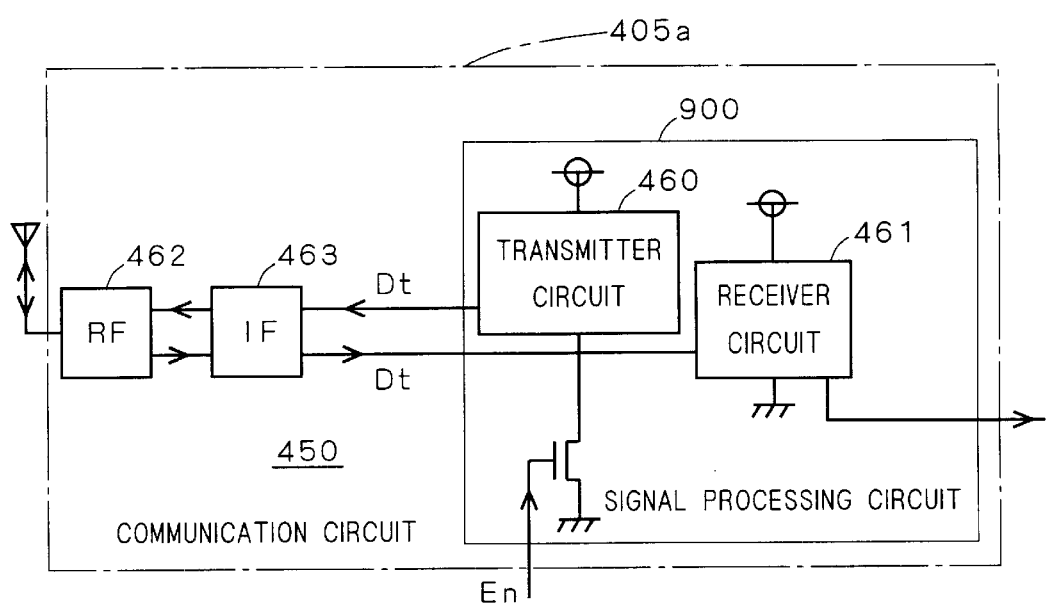
FIG. 10 is a block diagram showing a communication circuit of FIG. 9.

FIG. 10 is a block diagram showing an exemplary internal constitution of the communication circuit 405a. In the communication circuit 405a included in the terminal device 1001 using radio wave, a well-known radio frequency circuit 462 and an intermediate frequency circuit 463 are interposed between an antenna and a signal processing circuit (baseband circuit) 900. The signal processing circuit 900 comprises a transmitter circuit 460 and a receiver circuit 461, and a communication signal Dt is received by the receiver circuit 461 and transmitted by the transmitter circuit 460.

In the example of FIG. 10, only the transmitter circuit 460 is turned on and off by the enable signal En. Specifically, when the comparator circuit 403 makes a judgment of noncoincidence, a transmission function is stopped. There may be another constitution of the communication circuit 405 where only the receiver circuit 461 or both the transmitter circuit 460 and the receiver circuit 461 are turned on and off on the basis of the enable signal En.

Figure 11:
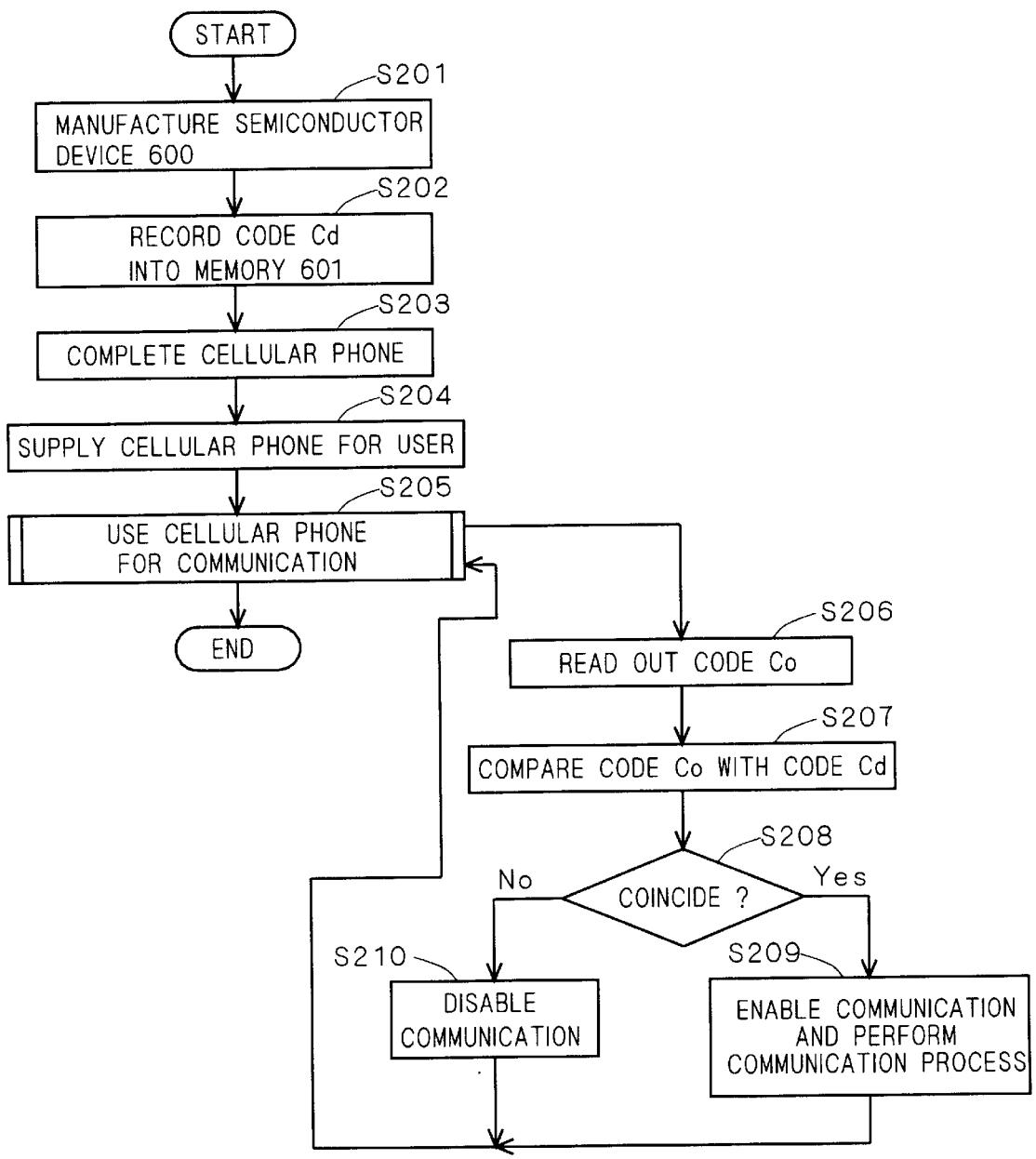
FIG. 11 is a flowchart of procedure for the use of the terminal device of FIG. 9.

FIG. 11 is a flowchart of procedure for the use of the terminal device 1001 for communication. At first, the semiconductor device 600 (more specifically, a semiconductor device 1001) as a part is manufactured (S201). During or before the last step, the identification code Cd is recorded into the memory 601 as the memory code Co (S202). After that, the semiconductor device 600 is supplied for a phone maker and the terminal device 1001 is assembled by the phone maker (S203). The finished terminal device 1001 is supplied for a user (S204), and served for communication by the user (S205).

The steps S206 to S210 show a procedure of communication using the terminal device 1001, i.e., an internal flow of the step S205. When the communication is started, the terminal device 1001 reads out the memory code Co from the memory 601 (S206). Subsequently, the comparator circuit 403 compares the identification code Cd with the memory code Co, and generates the enable signal En representing the result of judgment on whether these codes coincide with each other or not (S207).

When the enable signal En indicates coincidence of the codes (S208), the communication circuit 405a maintains the communication function to continue the communication (S209). On the other hand, the enable signal En indicates noncoincidence of the codes (S208), the communication circuit 405a stops at least one of the transmission function and the reception function to disable the communication (S210). When the communication is completed, the procedure is ended.

Thus, since at least one of the functions of the communication circuit 405a is stopped in the terminal device 1001 when the enable signal En indicates noncoincidence, it is possible to automatically suppress a fraud of using the terminal device for communication through replacement of the semiconductor substrate, by the action of the terminal device 1001 itself without a procedure of the communication common carrier equipment 655.

Further, though the cellular phone performing communication by wireless is shown as an example of the terminal device in the above discussion, this preferred embodiment can be applied to a wire phone performing communication through a communication cable. Furthermore, this preferred embodiment can also be applied to various terminal devices, not limited to the phone.

Figure 12:
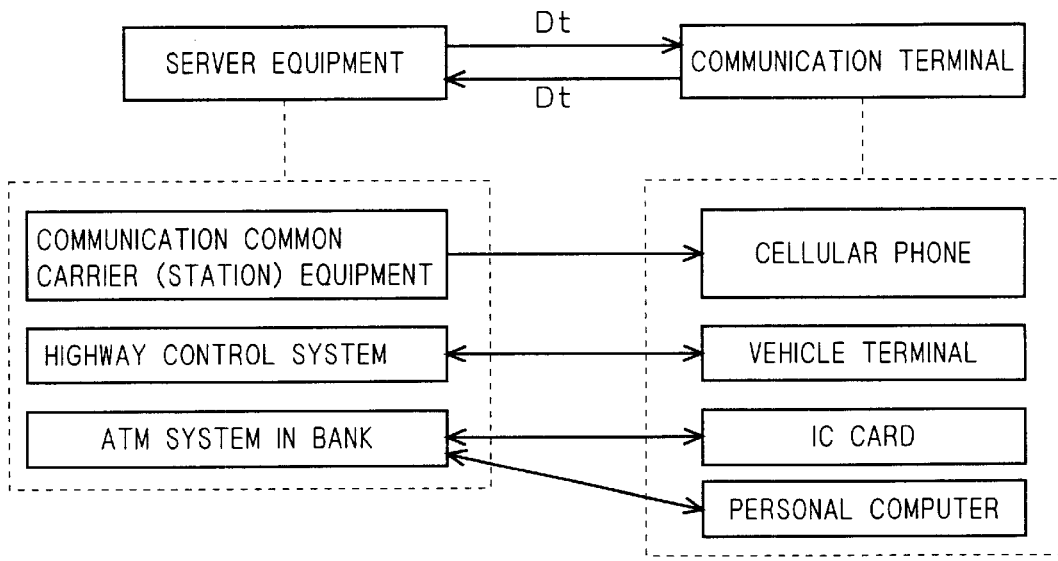
FIG. 12 is a block diagram showing a communication system in accordance with the first preferred embodiment of the present invention.

FIG. 12 illustrates various terminal devices to which this preferred embodiment can be applied and various servers with which the terminal devices communicate. For example, the terminal device may be a vehicle terminal communicating with a highway control system which automatically controls payment of highway toll and the like, or an IC card or a personal computer each of which communicates with an ATM system in a bank to draw or deposit cash.

[2. The Second Preferred Embodiment]

Though the single semiconductor substrate is identified by the inherent identification code in the semiconductor device and the terminal device of the first preferred embodiment, a plurality of semiconductor substrate are identified in the second preferred embodiment.

Figure 13:
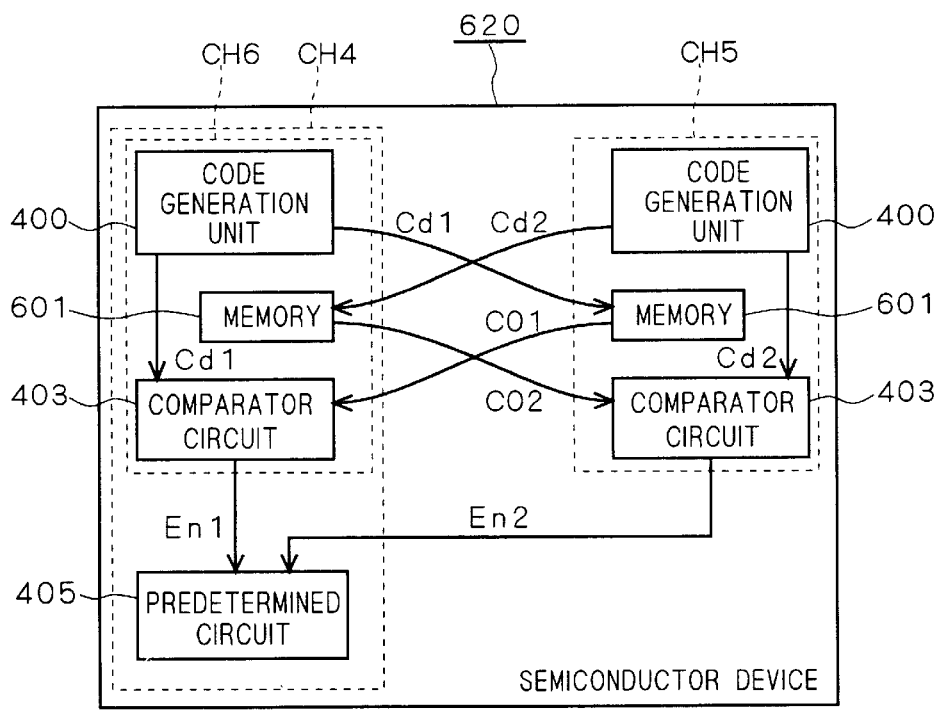
FIG. 13 is a block diagram showing a semiconductor device in accordance with a second preferred embodiment of the present invention.

FIG. 13 is a block diagram showing a constitution of a semiconductor device in accordance with the second preferred embodiment of the present invention. In the semiconductor device 620 of FIG. 13, the memory 601 is formed in a semiconductor substrate CH4 together with the code generation unit 400, the comparator circuit 403 and the predetermined circuit 405, and the code generation unit 400 and the comparator circuit 403 are formed in a semiconductor substrate CH5 together with the memory 601. The code generation unit 400 formed in the semiconductor substrate CH4 generates an identification code Cd1 inherent in the semiconductor substrate CH4 and the code generation unit 400 formed in the semiconductor substrate CH5 generates an identification code Cd2 inherent in the semiconductor substrate CH5.

The memory 601 formed in the semiconductor substrate CH4 stores the identification code Cd2 transmitted from the code generation unit 400 formed in the semiconductor substrate CH5 as a memory code Co2, and the memory 601 formed in the semiconductor substrate CH5 stores the identification code Cd1 transmitted from the code generation unit 400 formed in the semiconductor substrate CH4 as a memory code Co1. Specifically, the identification codes Cd1 and Cd2 inherent in the semiconductor substrates CH4 and CH5, respectively, are stored in the memories 601 formed in the other semiconductor substrates.

The comparator circuit 403 formed in the semiconductor substrate CH4 compares the identification code Cd1 with the memory code Co1, and the comparator circuit 403 formed in the semiconductor substrate CH5 compares the identification code Cd2 with the memory code Co2. The predetermined circuit 405 formed in the semiconductor substrate CH4 includes a circuit portion which selectively comes into an active state or an inactive state on the basis of a pair of enable signals En1 and En2 outputted form the two comparator circuits 403. The predetermined circuit 405 is a communication circuit similar to the communication circuit 405a of FIG. 10, for example, and has a constitution to stop the operation of the transmitter circuit 460 when at least one of the enable signals En1 and En2 indicates noncoincidence of the codes. This further enhances the barrier against the fraudulent use through replacement of the semiconductor substrate.

The number of semiconductor substrates to which the inherent identification codes Cd are allotted may be three or more. For example, there may be another constitution where the code generation unit 400 for generating the inherent identification code Cd and the memory 601 are formed in each of three semiconductor substrates and the memory 601 stores the identification code Cd transmitted from the code generation unit 400 formed in the semiconductor substrate other than the semiconductor substrate in which the memory 601 itself is formed. Alternately, at least part of the three memories 601 may be formed in a semiconductor substrate other than the three semiconductor substrates in which the code generation units 400 are formed.

As the number of semiconductor substrates given the identification codes Cd, i.e., semiconductor substrates comprising the code generation units 400 increases, a higher barrier against the fraudulent use of the appliance can be obtained. Further, since the memory 601 is formed only in the semiconductor substrate which comprises the code generation unit 400, it is possible to suppress the number of semiconductor substrates to the minimum. In the semiconductor device 620 of FIG. 13, especially, a higher barrier against the fraudulent use can be advantageously obtained while suppressing the number of semiconductor substrates to two, which is equal to the number of semiconductor substrates in the semiconductor device 600 of FIG. 1.

Figure 14:
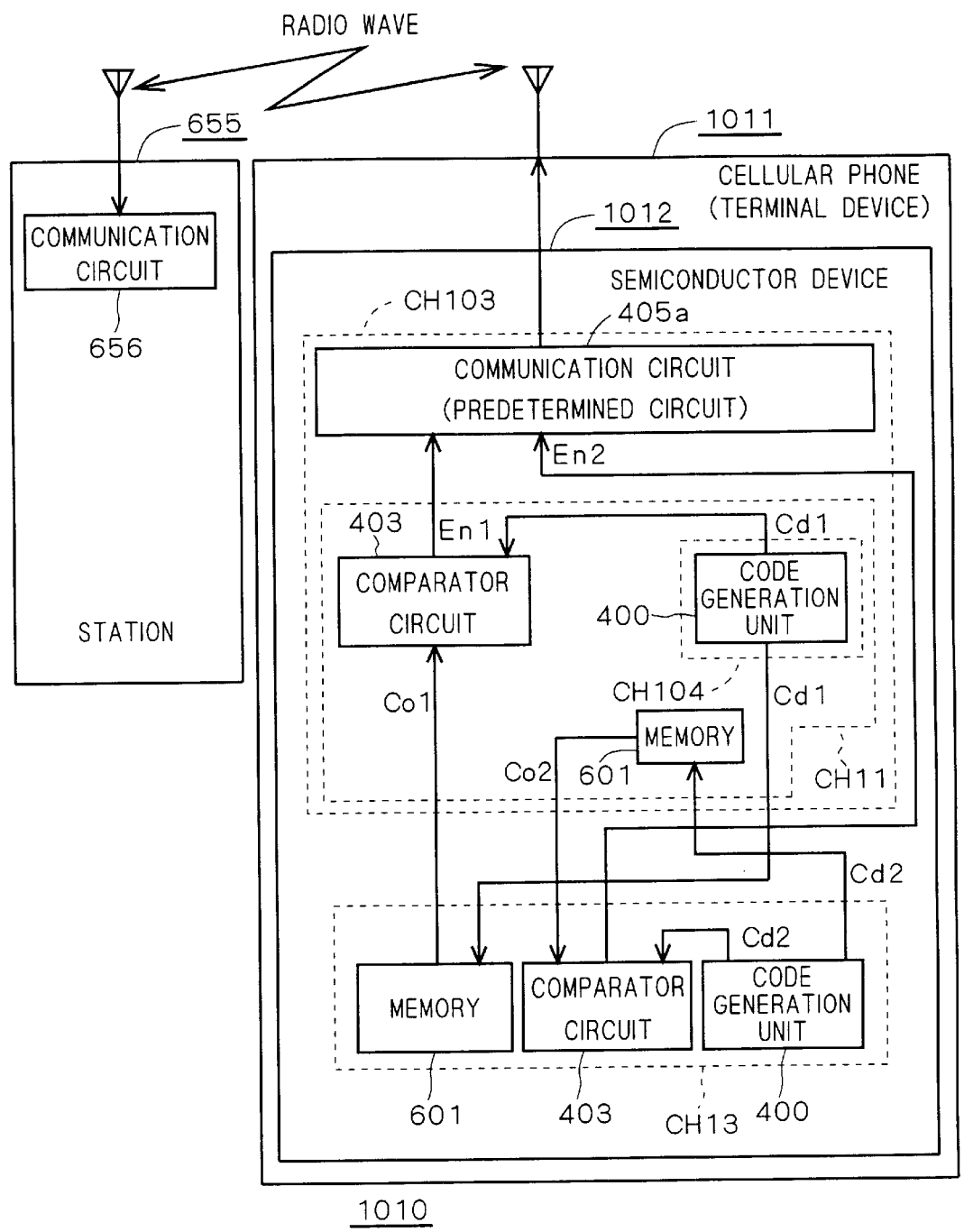
FIG. 14 is a block diagram showing a terminal device in accordance with the second preferred embodiment of the present invention.

FIG. 14 is a block diagram showing a constitution of the terminal device as an appliance of the semiconductor device 620. The terminal device 1011 works as a cellular phone and constitute a communication system 1010 with the communication common carrier equipment 655. A semiconductor device 1012 incorporated in the terminal device 1011 is an example of the semiconductor device 620 shown in FIG. 13 and comprises the communication circuit 405a as the predetermined circuit 405. The communication circuit 405a stops its function when at least one of the enable signals En1 and En2 indicates noncoincidence of the codes.

Though it is preferable that the code generation unit 400 for generating the identification code Cd1, the comparator circuit 403 for performing a comparison of the identification code Cd1, the memory 601 for storing the memory code Co2 and the communication circuit 405a are formed in a single semiconductor substrate CH103, there may be another constitutions where only the comparator circuit 403, the memory 601 and the code generation unit 400 are formed in a single CH11 and where only the code generation unit 400 is formed in a single semiconductor substrate CG104. Further, it is preferable that the memory 601 for storing the memory code Co1 is formed in a single semiconductor substrate CH13 together with the code generation unit 400 for generating the identification code Cd2 and the comparator circuit 403 for performing a comparison of the identification code Cd2.

Figure 15:
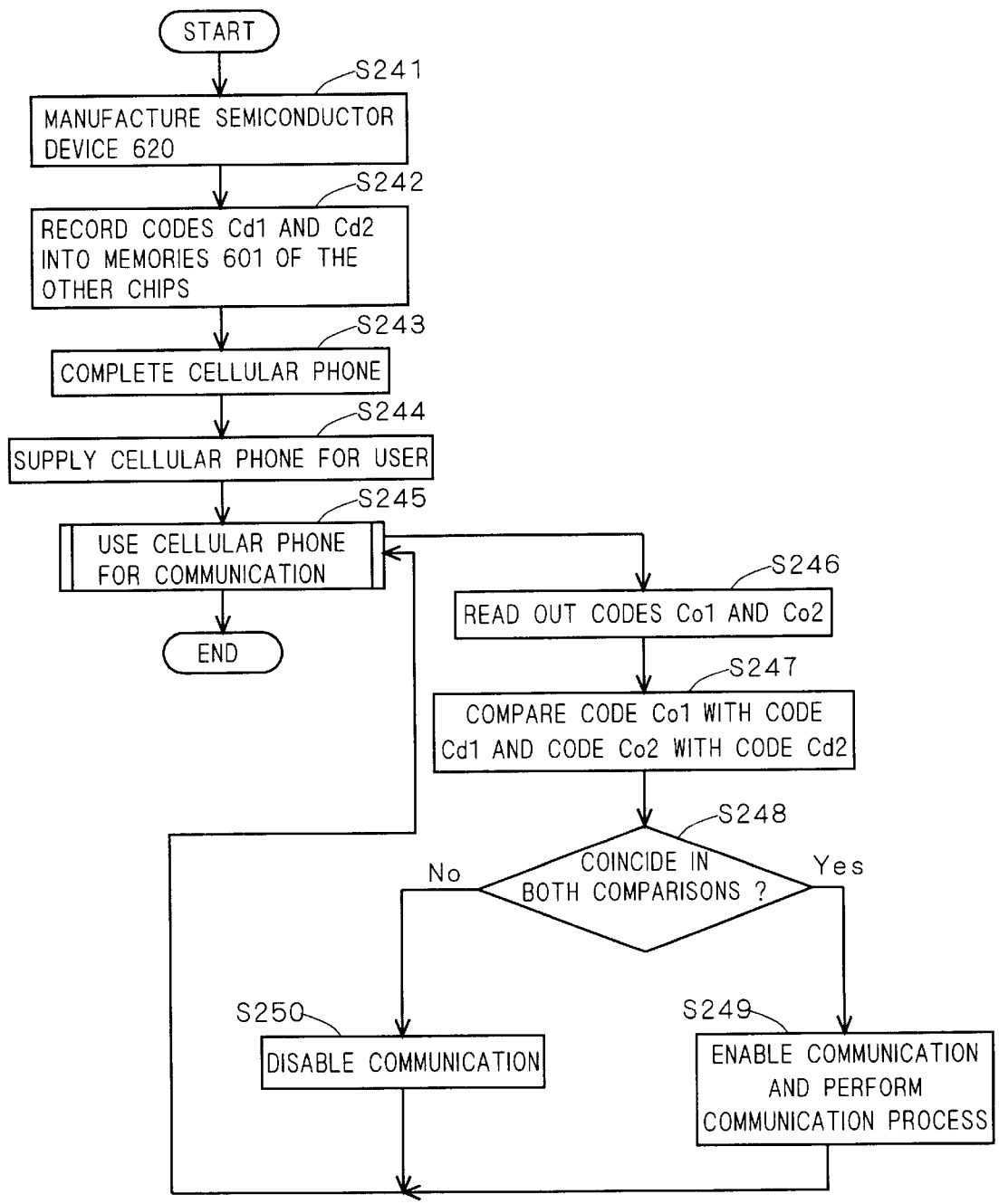
FIG. 15 is a flowchart of procedure for the use of the terminal device of FIG. 13.

FIG. 15 is a flowchart of procedure for the use of the terminal device 1011. At first, the semiconductor device 620 (more specifically, the semiconductor device 1012) as a part is manufactured (S241). During or before the final stage of the step S241, the identification codes Cd1 and Cd2 of the semiconductor substrates are recorded into the memories 601 of the other semiconductor substrates as the memory codes Co1 and Co2 (S242). After that, the semiconductor device 620 is supplied for a phone maker and the terminal device 1011 is assembled by the phone maker (S243). The finished terminal device 1011 is supplied for a user (S244), and served for communication by the user (S245).

The steps S246 to S250 show a procedure of communication using the terminal device 1011, i.e., an internal flow of the step S245. When the communication is started, the terminal device 1011 reads out the memory codes Co1 and Co2 from the two memories 601 (S246). Subsequently, one of the comparator circuit 403 compares the identification code Cd1 and the memory code Co1 to output the enable signal En1 representing the judgment result on whether these codes coincide with each other or not, and at the same time, the other of the comparator circuits 403 compares the identification code Cd2 and the memory code Co2 to output the enable signal En2 representing the judgment result on whether these codes coincide with each other or not (S247).

When both the enable signals En1 and En2 indicate coincidence of the codes (S248), the communication circuit 405a maintains the communication function to continue the communication (S249). On the other hand, at least one of the enable signals En1 and En2 indicates noncoincidence of the codes (S248), the communication circuit 405a stops at least one of the transmission function and the reception function to disable the communication (S250). When the communication is completed, the procedure is ended.

[3. The Third Preferred Embodiment]

In the third preferred embodiment, discussion will be made on a terminal device using a portion with the predetermined circuit removed in the semiconductor device of the first or second preferred embodiment.

FIG. 16 is a block diagram showing a constitution of a terminal device in accordance with the third preferred embodiment of the present invention. The terminal device 1001 is characteristically different from the terminal device 1001 of the first preferred embodiment shown in FIG. 9 in that the communication circuit 405a does not select the active state or the inactive state on the basis of the enable signal En which is transmitted from the comparator circuit 403 but merely transmits the enable signal En to the communication common carrier equipment 655 as part of the communication signal.

Figure 17:
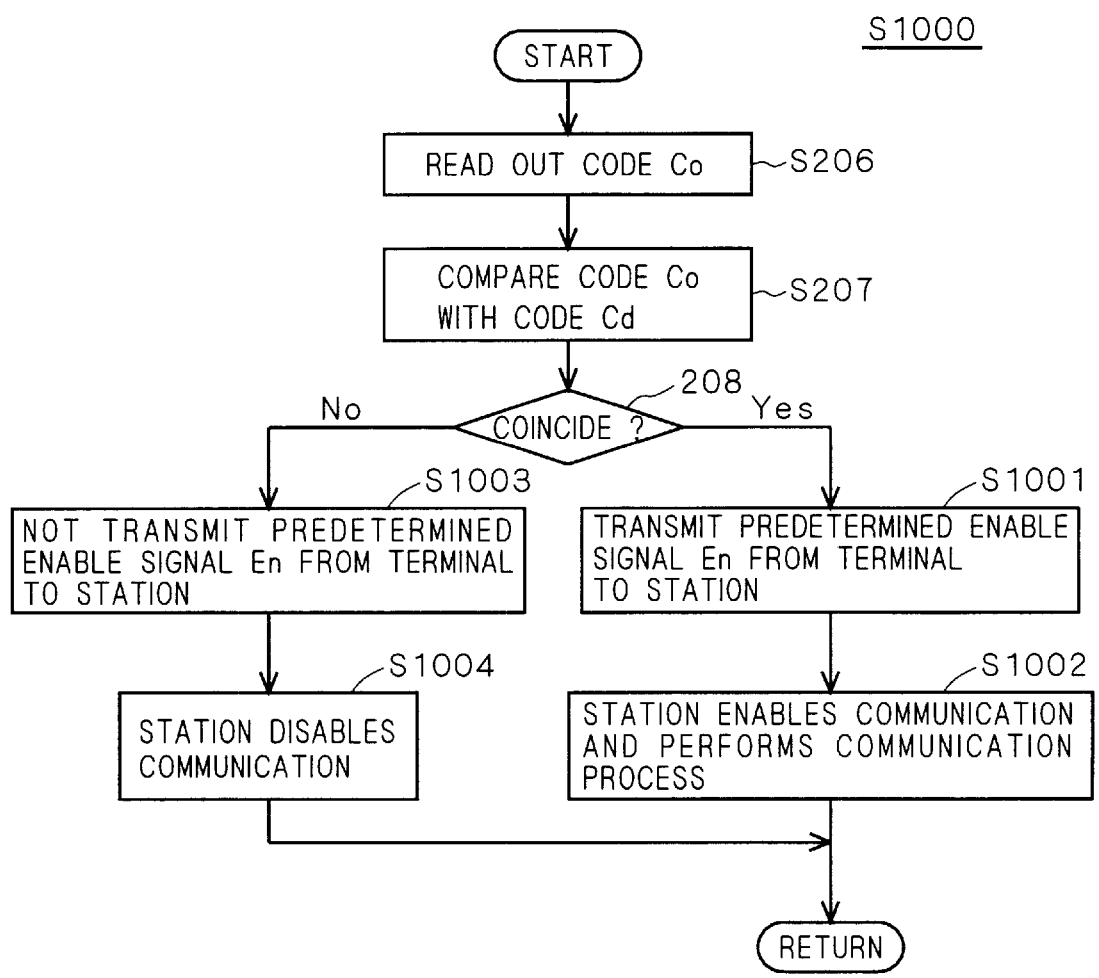
FIG. 17 is a flowchart of communication method using the terminal device of FIG. 16.

The flow of procedure for the use of the terminal device 1001 of FIG. 16 for communication is similar to as that shown in FIG. 11. The internal flow of the step S205, however, is replaced with the procedure of the step S1000 shown in FIG. 17. When the step S1000 starts, the terminal device 1001 reads out the memory code Co from the memory 601 (S206). Subsequently, the comparator circuit 403 compares the identification code Cd and the memory code Co, and generates the enable signal En representing the result of judgment on whether these codes coincide with each other or not (S207).

The enable signal En is transmitted to the communication common carrier equipment 655 through the communication circuit 405a (S208, S1001, S1003). In other words, when the enable signal En indicates coincidence of the codes (S208), a predetermined value indicating coincidence of the codes is transmitted as the enable signal En (S1001), and when the enable signal En indicates noncoincidence of the codes (S208), the predetermined value is not transmitted (S1003).

The communication common carrier equipment 655 performs an authentication that the user of the terminal device 1001 is authorized when the enable signal En indicates coincidence of the codes and does not perform the authentication when the enable signal En indicates noncoincidence of the codes. The communication common carrier equipment 655 permits the communication to continue the communication process (S1002) when the authentication is performed, and does not permit the communication to stop the communication process (S1004) when the authentication is not performed, for example.

Thus, in the terminal device 1001 of FIG. 16, the enable signal En can be served for judgment in the authentication performed by the communication common carrier equipment 655, and the fraudulent use through replacement of the semiconductor substrate is thereby omitted in the authentication to achieve the authentication with high accuracy. Further, besides continuing or stopping the communication, providing or not-providing some service such as permitting or not-permitting a business transaction can follow the authentication. Alternately, there may be another case where only recording of the judgment matter for authentication is performed. Specific examples will be discussed in the later preferred embodiments.

Figure 18:
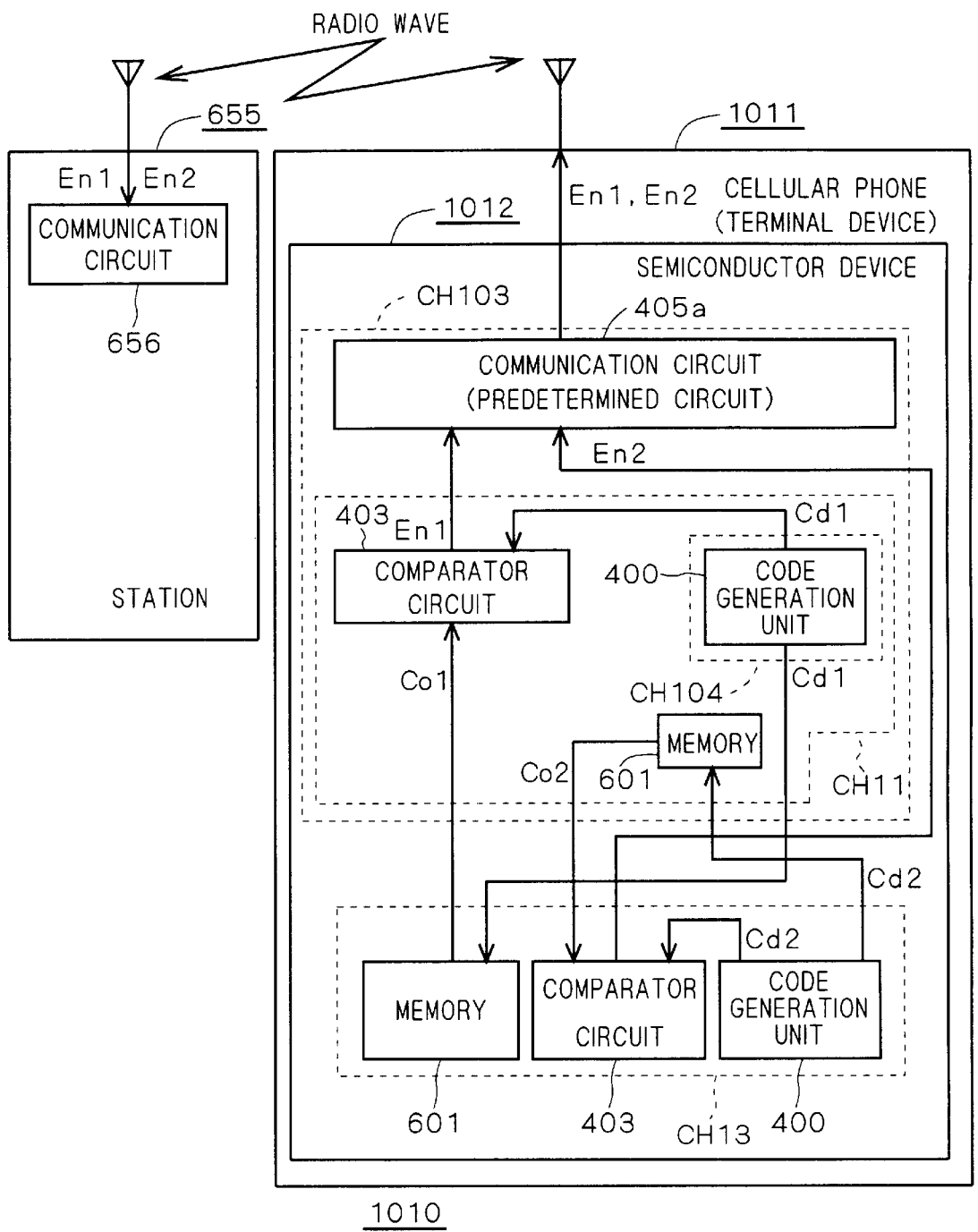
FIG. 18 is a block diagram showing another example of the terminal device in accordance with the third preferred embodiment of the present invention.

FIG. 18 is a block diagram showing another constitution of the terminal device in accordance with the third preferred embodiment of the present invention. The terminal device 1011 is characteristically different from the terminal device 1011 of the second preferred embodiment shown in FIG. 14 in that the communication circuit 405a does not select the active state or the inactive state on the basis of the enable signals En1 and En2 which are transmitted from the comparator circuits 403 but merely transmits the enable signals En1 and En2 to the communication common carrier equipment 655 as part of the communication signal.

Figure 19:
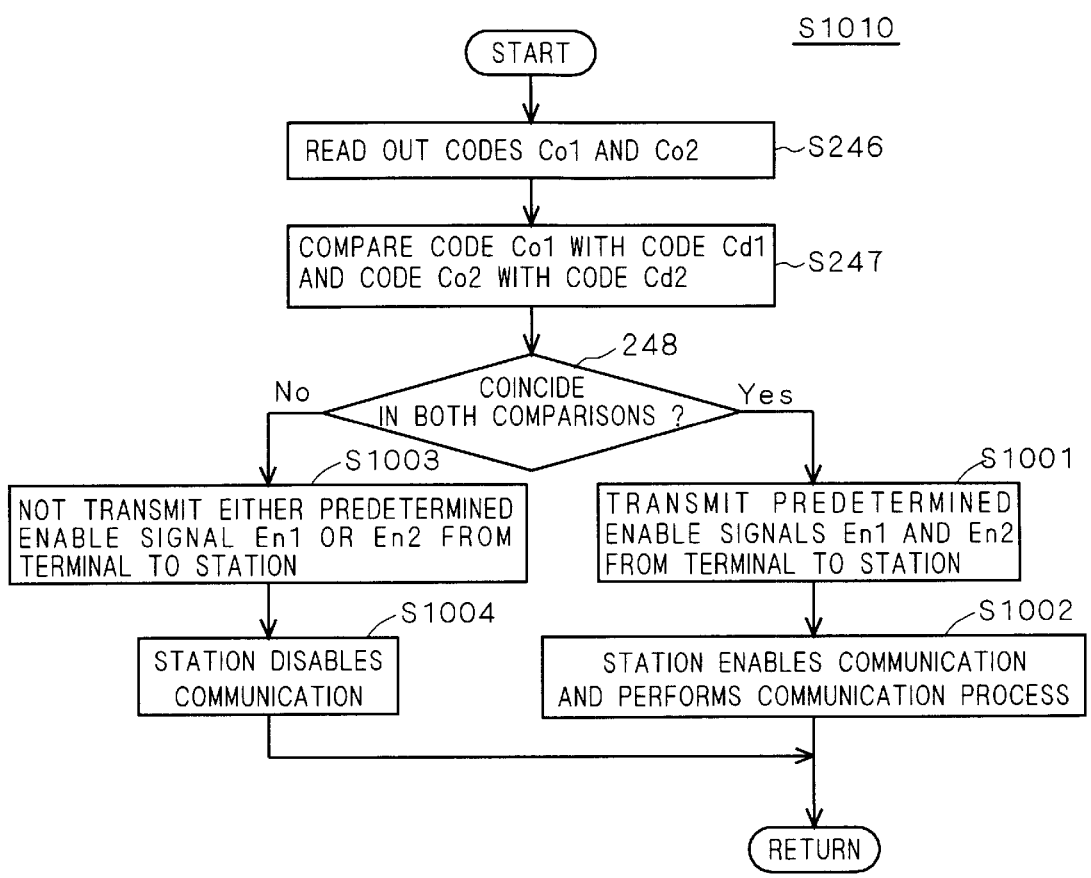
FIG. 19 is a flowchart of communication method using the terminal device of FIG. 18.

The flow of procedure for the use of the terminal device 1011 of FIG. 18 for communication is similar to that shown in FIG. 15. The internal flow of the step S245, however, is replaced with the procedure of the step S1010 shown in FIG. 19. When the step S1010 starts, the terminal device 1011 reads out the memory codes Co1 and Co2 from the two memories 601 (S246). Subsequently, one of the comparator circuits 403 compares the identification code Cd1 and the memory code Co1 to output the enable signal En1 representing the judgment result on whether these codes coincide with each other or not, and at the same time, the other of the comparator circuits 403 compares the identification code Cd2 and the memory code Co2 to output the enable signal En2 representing the judgment result on whether these codes coincide with each other or not (S247).

The enable signals En1 and En2 are transmitted to the communication common carrier equipment 655 through the communication circuit 405a (S248, S1001, S1003). In other words, when both the enable signals En1 and En2 indicate coincidence of the codes (S248), predetermined values indicating coincidence of the codes are transmitted (S1001) as the enable signals En1 and En2, and when at least one of the enable signals En1 and En2 indicates noncoincidence of the codes (S248), the predetermined values are not transmitted (S1003).

The communication common carrier equipment 655 performs an authentication that the user of the terminal device 1001 is authorized when both the enable signals En1 and En2 indicate coincidence of the codes and does not perform the authentication when at least one of the enable signals En1 and En2 indicates noncoincidence of the codes. The communication common carrier equipment 655 permits the communication to continue the communication process (S1002) when the authentication is performed, and does not permit the communication to stop the communication process (S1004) when the authentication is not performed, for example.

Thus, in the terminal device 1011 of FIG. 18, the enable signals En1 and En2 can serve for judgment in the authentication performed by the communication common carrier equipment 655, and the fraudulent use through replacement of the semiconductor substrate is thereby omitted in the authentication to achieve the authentication with high accuracy. Further, since the two enable signals En1 and En2 are used as judgment matters in the authentication, the authentication with still higher accuracy can be achieved than in the terminal device 1001 of FIG. 16.

[4. The Fourth Preferred Embodiment]

In the fourth preferred embodiment, discussion will be made on a terminal device using a portion with the predetermined circuit and the comparator circuit removed in the semiconductor device of the first or second preferred embodiment.

Figure 20:
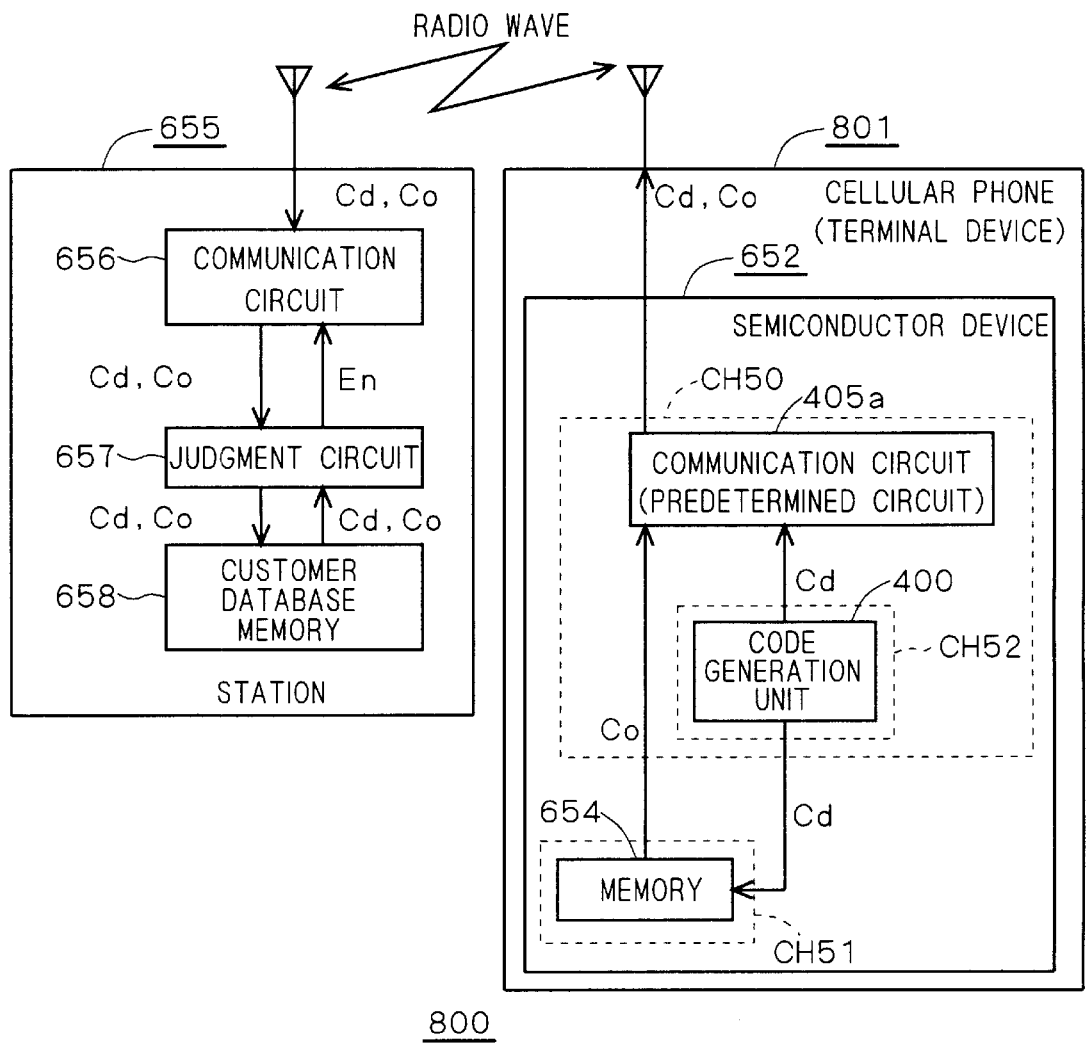
FIG. 20 is a block diagram showing a terminal device in accordance with a fourth preferred embodiment of the present invention.

FIG. 20 is a block diagram showing a constitution of a terminal device in accordance with the fourth preferred embodiment of the present invention. The semiconductor device 652 in the terminal device 801 is characteristically different from the terminal device 1002 of the first preferred embodiment shown in FIG. 9 in that the comparator circuit 403 is removed and the communication circuit 405a merely transmits the identification code Cd and the memory code Co to the communication common carrier equipment 655 as part of the communication signal.

The communication common carrier equipment 655 of FIG. 20 comprises a judgment circuit 657 and a customer database memory 658 besides the communication circuit 656. The communication common carrier equipment 655 and the terminal device 801 constitute the communication system 800.

Figure 21:
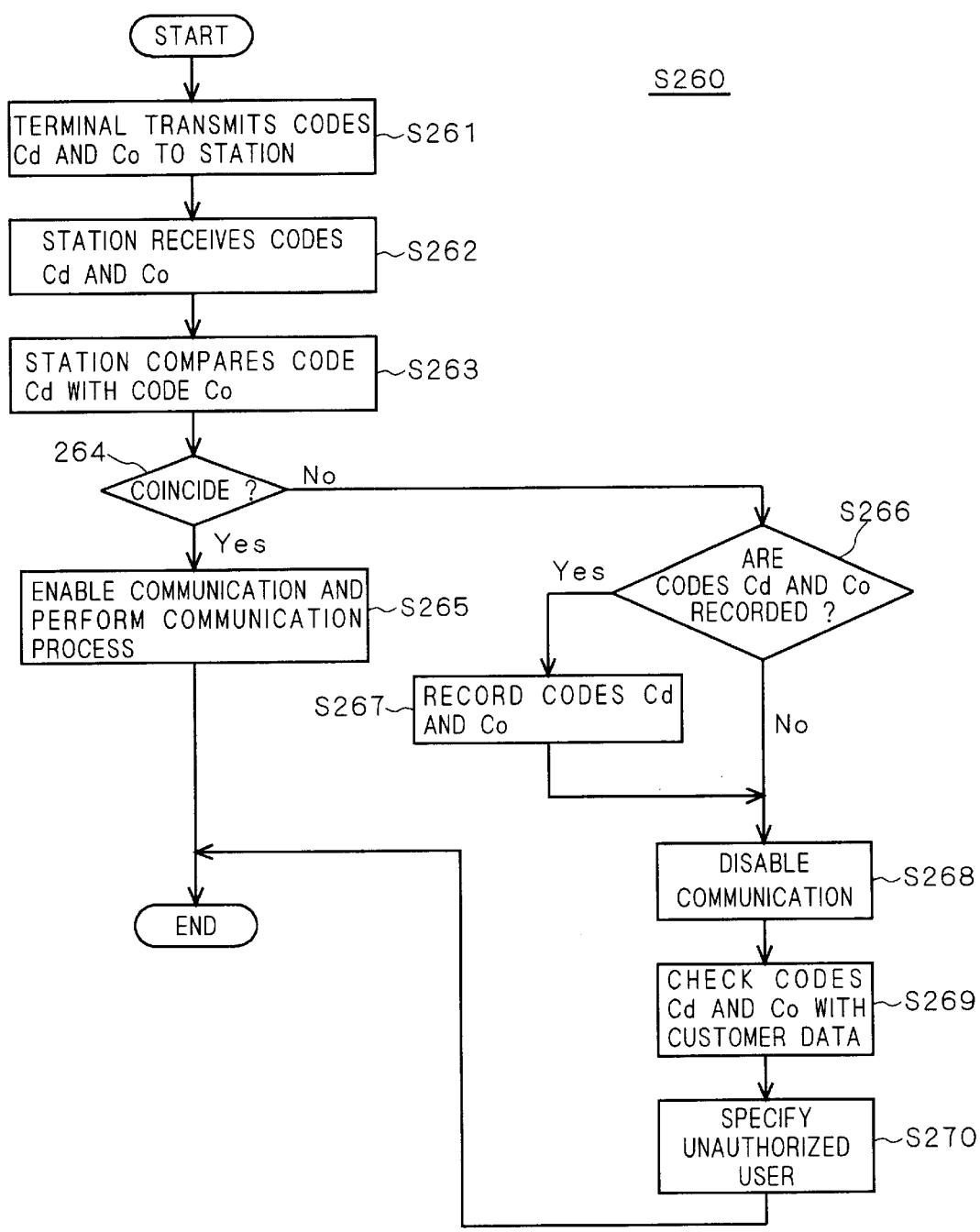
FIG. 21 is a flowchart of communication method using the terminal device of FIG. 20.

The flow of procedure for the use of the terminal device 801 for communication is similar to that shown in FIG. 11. The internal flow of the step S205, however, is replaced with the procedure of the step S260 shown in FIG. 21. When the step 260 starts, the terminal device 801 transmits the identification code Cd and the memory code Co to the communication common carrier equipment 655 (S261). Accordingly, the communication circuit 656 in the communication common carrier equipment 655 receives the identification code Cd and the memory code Co (S262).

Subsequently, the judgment circuit 657 in the communication common carrier equipment 655 compares the identification code Cd with the memory code Co and judges whether these codes coincide with each other or not to transmit the enable signal En indicating the judgment result to the communication circuit 656 (S263). When the enable signal En indicates coincidence (S264), the communication common carrier equipment 655 performs an authentication that the user of the terminal device 801 is authorized, and when the enable signal En indicates noncoincidence (S264), the communication common carrier equipment 655 does not perform the authentication. The communication common carrier equipment 655 permits the communication to continue the communication process (S265) when the authentication is performed, and does not permit the communication to stop the communication process (S268) when the authentication is not performed, for example.

Further, when it is instructed to record the identification code Cd and the memory code Co (S266), the identification code Cd and the memory code Co are recorded into the customer database memory 658 if the authentication is not performed (S267). Then, for example, after the communication process is stopped (S268), by checking the identification code Cd and the memory code Co with the content of the customer database memory 658 which is recorded in the past (S269), an unauthorized user is specified (S270).

There may be another case where only recording of the identification code Cd and the memory code Co is performed (S267), without stopping the communication process, when the authentication is not performed. Further, there may be still another case where recording of the identification code Cd and the memory code Co is performed (S267) regardless of the authentication result. In the latter case, the procedure of the step S267 is performed between the steps S263 and S264 for example.

Thus, in the terminal device 801 of FIG. 20, the identification code Cd and the memory code Co can be served for judgment in the authentication performed by the communication common carrier equipment 655, and the fraudulent use through replacement of the semiconductor substrate is thereby omitted in the authentication to achieve the authentication with high accuracy.

Figure 22:
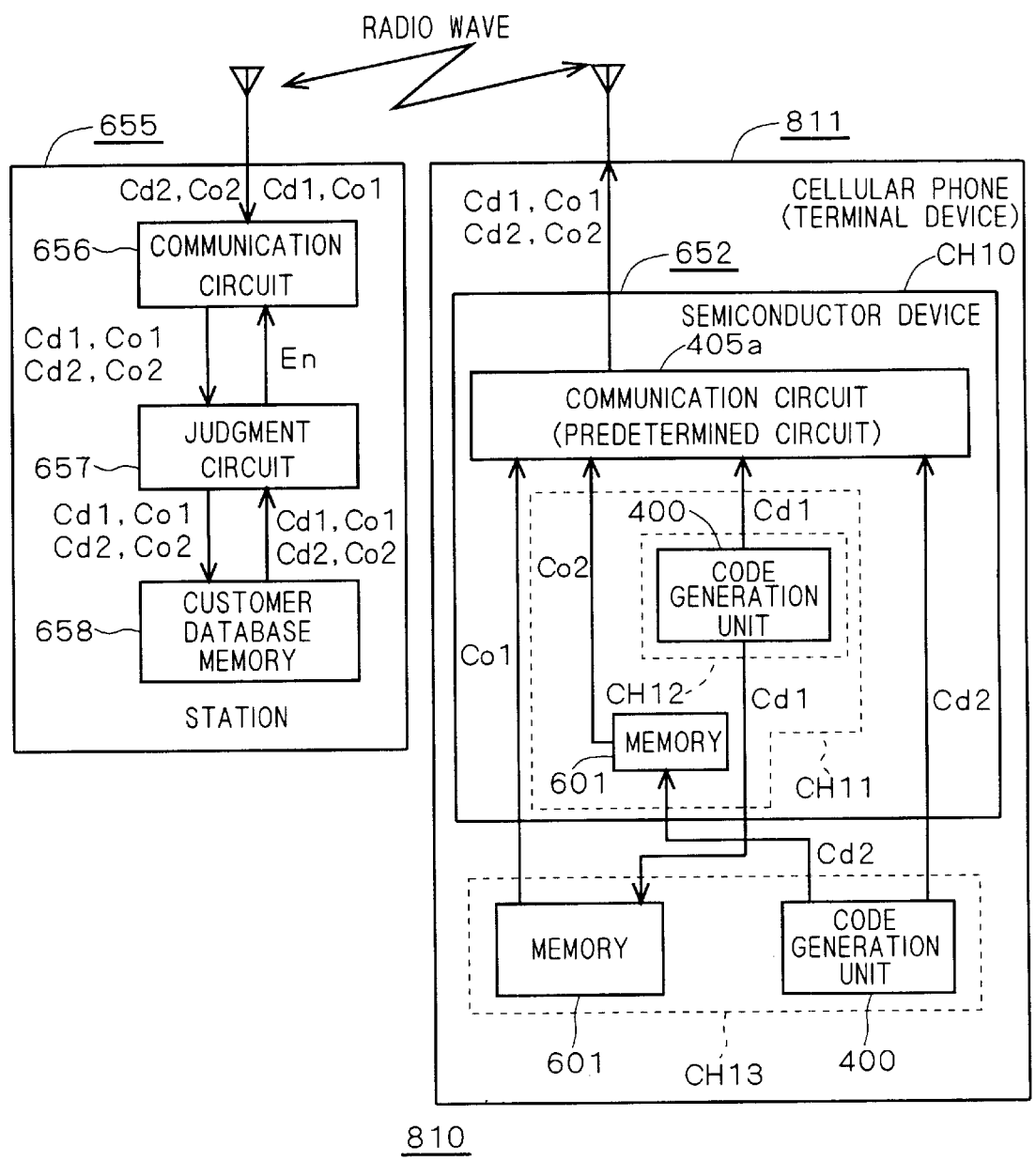
FIG. 22 is a block diagram showing another example of the terminal device in accordance with the fourth preferred embodiment of the present invention.

FIG. 22 is a block diagram showing another constitution of the terminal device in accordance with the fourth preferred embodiment of the present invention. The semiconductor device 652 in the terminal device 811 is characteristically different from the terminal device 1012 of the second preferred embodiment shown in FIG. 14 in that the comparator circuit 403 is removed and the communication circuit 405a merely transmits the identification codes Cd1 and Cd2 and the memory codes Co and Co2 to the communication common carrier equipment 655 as part of the communication signal.

The communication common carrier equipment 655 of FIG. 22 comprises the judgment circuit 657 and the customer database memory 658 besides the communication circuit 656. The communication common carrier equipment 655 and the terminal device 811 constitute the communication system 810.

Figure 23:
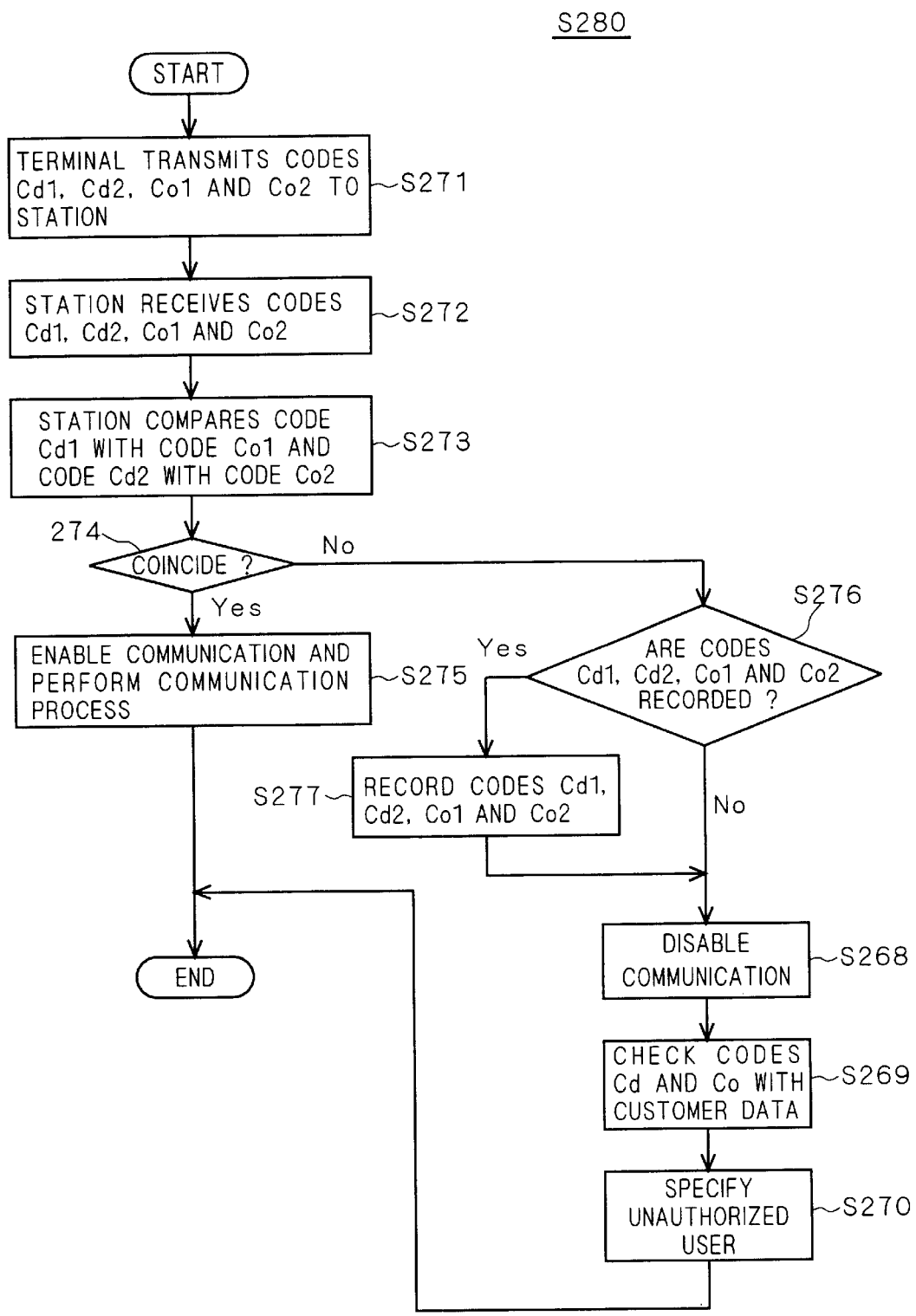
FIG. 23 is a flowchart of communication method using the terminal device of FIG. 22.

The flow of procedure for the use of the terminal device 811 for communication is similar to that shown in FIG. 15. The internal flow of the step S245, however, is replaced with the procedure of the step S280 shown in FIG. 23. When the step 280 starts, the terminal device 811 transmits the identification codes Cd1 and Cd2 and the memory codes Co1 and Co2 to the communication common carrier equipment 655 (S271). Accordingly, the communication circuit 656 in the communication common carrier equipment 655 receives the identification codes Cd1 and Cd2 and the memory codes Co1 and Co2 (S272).

Subsequently, the judgment circuit 657 in the communication common carrier equipment 655 compares the identification code Cd1 with the memory code Co1 to judge whether these codes coincide with each other or not and compares the identification code Cd2 with the memory code Co2 to judge whether these codes coincide with each other or not. The judgment circuit 657 transmits the enable signal En indicating these judgment results to the communication circuit 656 (S273). When both the two comparison results indicate coincidence (S274), the communication common carrier equipment 655 performs an authentication that the user of the terminal device 811 is authorized, and when at least one of the two comparison results indicates noncoincidence (S274), the communication common carrier equipment 655 does not perform the authentication. The communication common carrier equipment 655 permits the communication to continue the communication process (S275) when the authentication is performed, and does not permit the communication to stop the communication process (S278) when the authentication is not performed, for example.

Further, when it is instructed to record the identification codes Cd1 an Cd2 and the memory codes Co1 and Co2 (S276), the identification codes Cd1 and Cd2 and the memory codes Co1 and Co2 are recorded into the customer database memory 658 if the authentication is not performed (S277). Then, for example, after the communication process is stopped (S278), by checking the identification codes Cd1 and Cd2 and the memory codes Co1 and Co2 with the content of the customer database memory 658 which is recorded in the past (S279), an unauthorized user is specified (S280).

There may be another case where only recording of the identification codes Cd1 and Cd2 and the memory codes Co1 and Co2 is performed (S277), without stopping the communication process, when the authentication is not performed. Further, there may be still another case where recording of the identification codes Cd1 and Cd2 and the memory codes Co1 and Co2 is performed (S277) regardless of the authentication result. In the latter case, the procedure of the step S277 is performed between the steps S273 and S274 for example.

Thus, in the terminal device 811 of FIG. 22, the identification codes Cd1 and Cd2 and the memory codes Co1 and Co2 can be served for judgment in the authentication performed by the communication common carrier equipment 655, and the fraudulent use through replacement of the semiconductor substrate is thereby omitted in the authentication to achieve the authentication with high accuracy. Further, since the two identification codes Cd1 and Cd2 are used in the comparison, the authentication with still higher accuracy can be achieved than in the terminal device 801 of FIG. 20.

[5. The Fifth Preferred Embodiment]

In the fifth preferred embodiment, the identification code Cd and the memory code Co are transmitted in an encrypted form between the semiconductor substrates in the semiconductor device of the first or second preferred embodiment.

Figure 24:
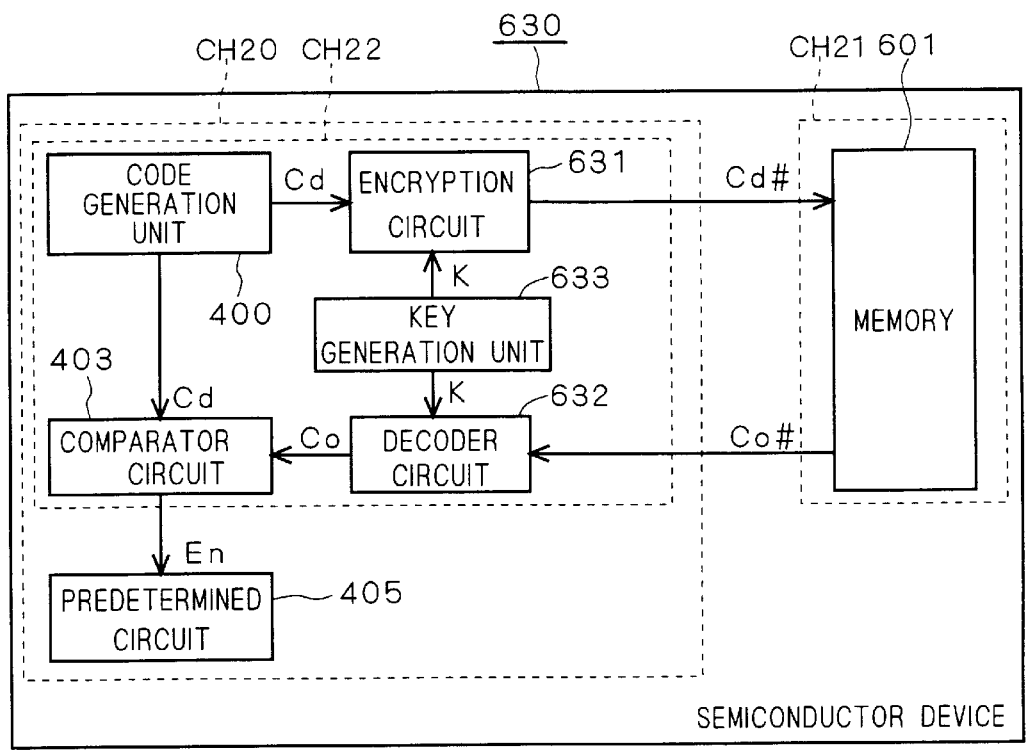
FIG. 24 is a block diagram showing a semiconductor device in accordance with a fifth preferred embodiment of the present invention.

FIG. 24 is a block diagram showing a constitution of a semiconductor device in accordance with the fifth preferred embodiment of the present invention. In the semiconductor device 630 of FIG. 24, an encryption circuit 631, a decoder circuit 632 and a key generation unit 633 are formed in a semiconductor substrate CH20 or CH22 in which the code generation unit 400 is formed.

The key generation unit 633 generates a key K for encryption. The key K is generated as a code inherent in the semiconductor substrate CH20 or CH22 like the identification code Cd. The encryption circuit 631 encrypts the identification code Cd generated by the code generation unit 400 on the basis of the key K generated by the key generation unit 633 into an identification code Cd# and transmits the identification code Cd# to the memory 601 formed in a semiconductor substrate CH21. The memory 601 stores the encrypted identification code Cd# as an encrypted memory code Co#.

The decoder circuit 632 reads out the memory code Co# stored in the memory 601, decodes the memory code Co# into the memory code Co on the basis of the key K generated by the key generation unit 633 and supplies the memory code Co for the comparator circuit 403. The predetermined circuit 405 includes a circuit portion which selectively comes into an active state or an inactive state on the basis of the enable signal En outputted form the comparator circuit 403.

Thus, since the identification code Cd and the memory code Co are transmitted in the encrypted form between the different semiconductor substrates in the semiconductor device 630, neither the identification code Cd nor the memory code Co can be read out from the outside. Therefore, a higher barrier against the fraudulent use can be achieved.

Figure 25:
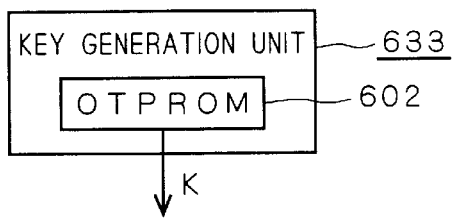
FIG. 25 is a block diagram showing a key generation unit of FIG. 24.

FIG. 25 is a block diagram showing an exemplary internal constitution of the key generation unit 633. In the example of FIG. 25, the key generation unit 633 comprises the OTPROM 602, and before the shipment of the semiconductor device 630, the key K is written in the OTPROM 602. Therefore, it is impossible to fraudulently change the key K generated by the key generation unit 633. Further, since the key K has been written at the shipment of the semiconductor device 630, the key K is prevented from leaking out to the user.

Figure 26:
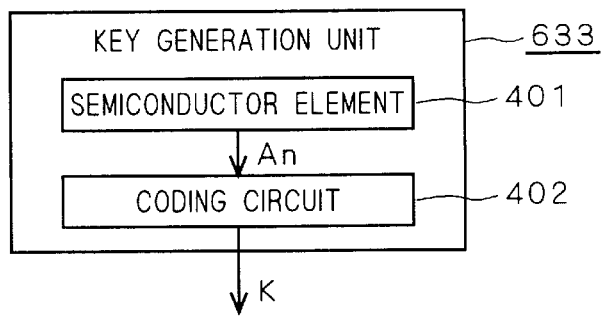
FIG. 26 is a block diagram showing another example of the key generation unit of FIG. 24.

FIG. 26 is a block diagram showing another internal constitution of the key generation unit 633. The key generation unit 633 of FIG. 26 comprises the semiconductor element 401 and the coding circuit 402 shown in FIG. 2. The coding circuit 402 reads out the electric property of the semiconductor element 401 as the analog signal An and converts it into the digital signal. The digital signal obtained by conversion is outputted as the key K.

As the electric property of the semiconductor element 401 selected is a property which varies from one semiconductor element 401 to another. The key K, which is generated as a value which varies from one semiconductor element 401 to another, is inherent in the semiconductor substrate in which the key generation unit 633 is formed. Since it is not necessary to write the key K and the semiconductor elements 401 manufactured though the same process can be used among a lot of mass-produced semiconductor devices 630, the manufacturing process of the semiconductor device 630 can be simplified. Further, since the electric property of the semiconductor element 401 on which the key K is based can not be changed from the outside, the barrier against the fraudulent change of the key K is advantageously high.

As illustrated in FIGS. 3 to 6, the semiconductor element 401 has polycrystalline substance, and the electric property which varies with variation in crystal structures of the polycrystalline substances can be used. Since the variation in the crystal structures of the polycrystalline substances is large and the variation in the electric properties caused by the variation in the crystal structures is accordingly large, it is possible to ensure a large range of variation in the keys K. In other words, it is easy to prevent coincidence of the keys K among a lot of mass-produced semiconductor devices 630.

Figure 27:
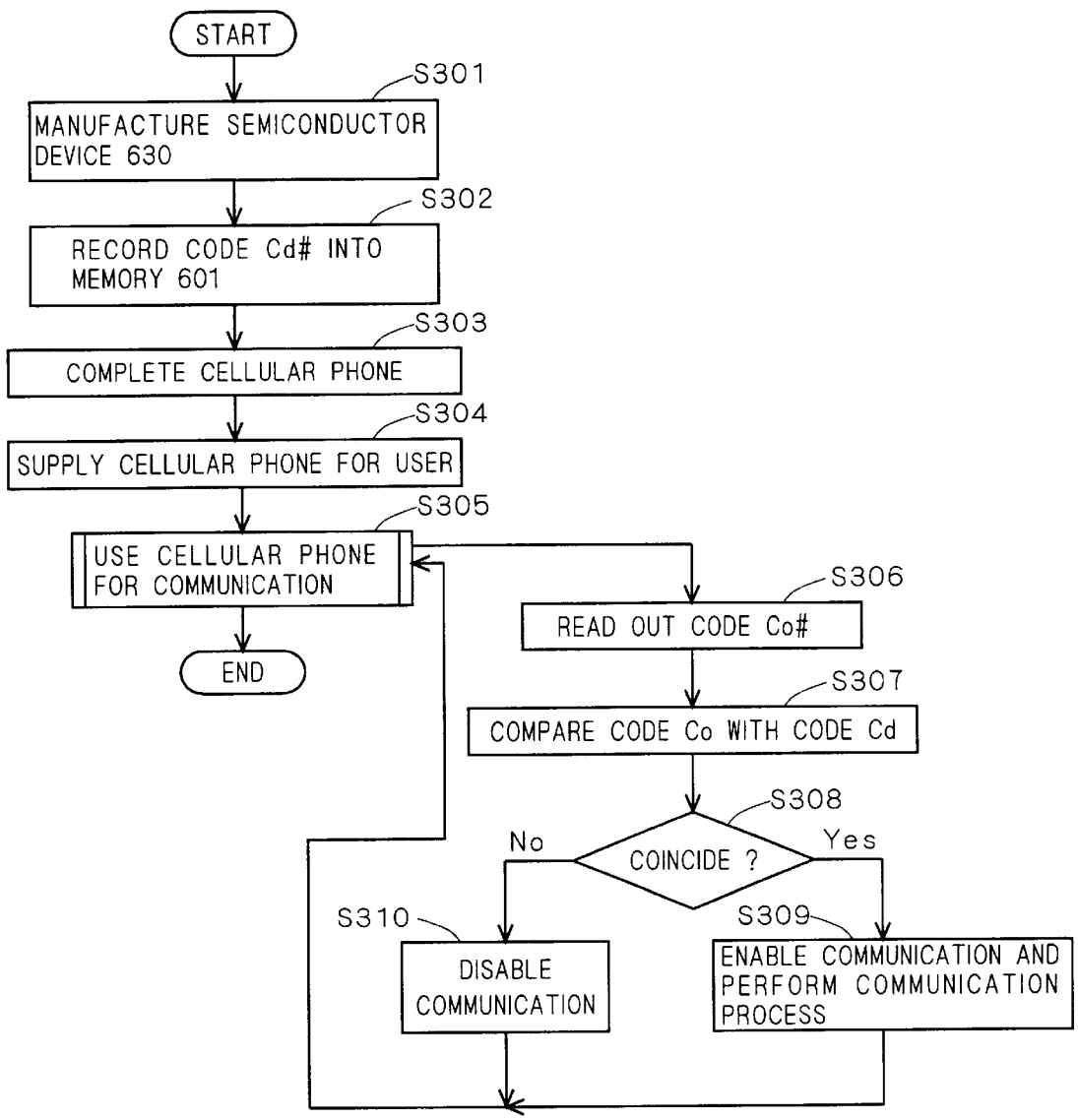
FIG. 27 is a flowchart of procedure for the use of the terminal device incorporating the semiconductor device of FIG. 24.

FIG. 27 is a flowchart of procedure for the use of the terminal device 1001 of FIG. 9 for communication when the semiconductor device 630 of FIG. 24 is used instead of the semiconductor device 1002 and the communication circuit 405a is used as the predetermined circuit 405 in the terminal device 1001. At first, the semiconductor device 630 as a part is manufactured (S301). During or before the last step, the encrypted identification code Cd# is recorded into the memory 601 as the memory code Co# (S302). After that, the semiconductor device 630 is supplied for a phone maker and the terminal device 1001 is assembled by the phone maker (S303). The finished terminal device 1001 is supplied for a user (S304), and served for communication by the user (S305).

The steps S306 to S310 show a procedure of communication using the terminal device 1001, i.e., an internal flow of the step S305. When the communication is started, terminal device 1001 reads out the memory code Co# from the memory 601 (S306). Subsequently, the decoder circuit 632 decodes the memory code Co# into the memory code Co and thereafter comparator circuit 403 compares the identification code Cd and the memory code Co, and generates the enable signal En representing the result of judgment on whether these codes coincide with each other or not (S307).

When the enable signal En indicates coincidence of the codes (S308), the communication circuit 405a maintains the communication function to continue the communication (S309). On the other hand, the enable signal En indicates noncoincidence of the codes (S308), the communication circuit 405a stops at least one of the transmission function and the reception function to disable the communication (S310). When the communication is completed, the procedure is ended.

Figure 28:
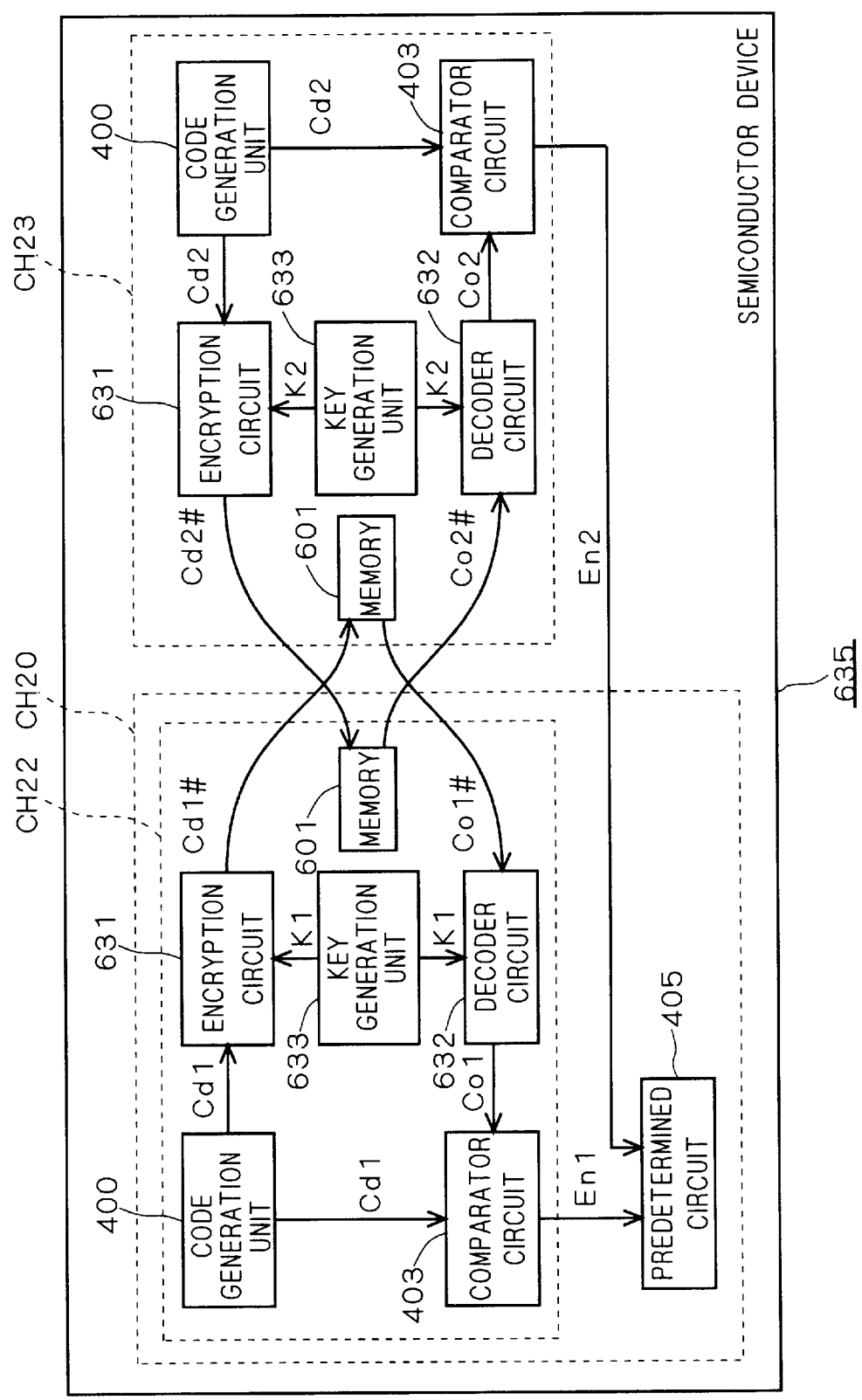
FIG. 28 is a block diagram showing another example of the semiconductor device in accordance with the fifth preferred embodiment of the present invention.

FIG. 28 is a block diagram showing another constitution of the semiconductor device in accordance with the fifth preferred embodiment of the present invention. The semiconductor device 635 of FIG. 28 has a constitution where the identification codes Cd1 and Cd2 and the memory codes Co1 and Co2 are transmitted in an encrypted form between the two semiconductor substrates in the semiconductor device 620 of FIG. 13. Specifically, the encryption circuit 631, the decoder circuit 632 and the key generation unit 633 are each formed in both the two semiconductor substrates CH20 (or CH22) and CH23 in which the code generation unit 400, the comparator circuit 403 and the memory 601 are formed.

In the semiconductor substrate CH20 (or CH22), the key generation unit 633 generates a key K1 inherent in the semiconductor substrate CH20 (or CH22), and the encryption circuit 631 encrypts the identification code Cd1 into an identification code Cd1# on the basis of the key K1 and transmits the identification code Cd1# to the memory 601 in the semiconductor substrate CH23. The memory 601 in the semiconductor substrate CH23 stores the identification code Cd1# as a memory code Co1#. The decoder circuit 632 in the semiconductor substrate CH20 (or CH22) reads out the memory code Co1# from the memory 601, decodes the memory code Co1# into the memory code Co1 on the basis of the key K1 and supplies the memory code Co1 for the comparator circuit 403.

In the semiconductor substrate CH23, the key generation unit 633 generates a key K2 inherent in the semiconductor substrate CH23, and the encryption circuit 631 encrypts the identification code Cd2 into an identification code Cd2# on the basis of the key K2 and transmits the identification code Cd2# to the memory 601 in the semiconductor substrate CH20 (or CH22). The memory 601 in the semiconductor substrate CH20 (or CH22) stores the identification code Cd2# as a memory code Co2#. The decoder circuit 632 in the semiconductor substrate CH23 reads out the memory code Co2# from the memory 601, decodes the memory code Co2# into the memory code Co2 on the basis of the key K2 and supplies the memory code Co1 for the comparator circuit 403. The predetermined circuit 405 includes a circuit portion which selectively comes into an active state or an inactive state on the basis of a pair of enable signals En1 and En2 outputted form the two comparator circuits 403.

Thus, since the identification codes Cd1 and Cd2 and the memory codes Co1 and Co2 are transmitted in the encrypted form between the different semiconductor substrates in the semiconductor device 635, none of the identification codes Cd1 and Cd2 and the memory codes Co1 and Co2 can be read out from the outside. Therefore, a higher barrier against the fraudulent use can be achieved. Since the two enable signals En1 and En2 are used like in the semiconductor device 620 of the second preferred embodiment (of FIG. 13), it is possible to achieve a higher barrier against the fraudulent use through replacement of the semiconductor substrate.

Also when the number of semiconductor substrates in which the code generation units 400 are formed is three or more, by forming the encryption circuit 631, the decoder circuit 632 and the key generation unit 633 in each of the semiconductor substrates, it is possible to transmit the identification codes and the memory codes in the encrypted form between the different semiconductor substrates.

Figure 29:
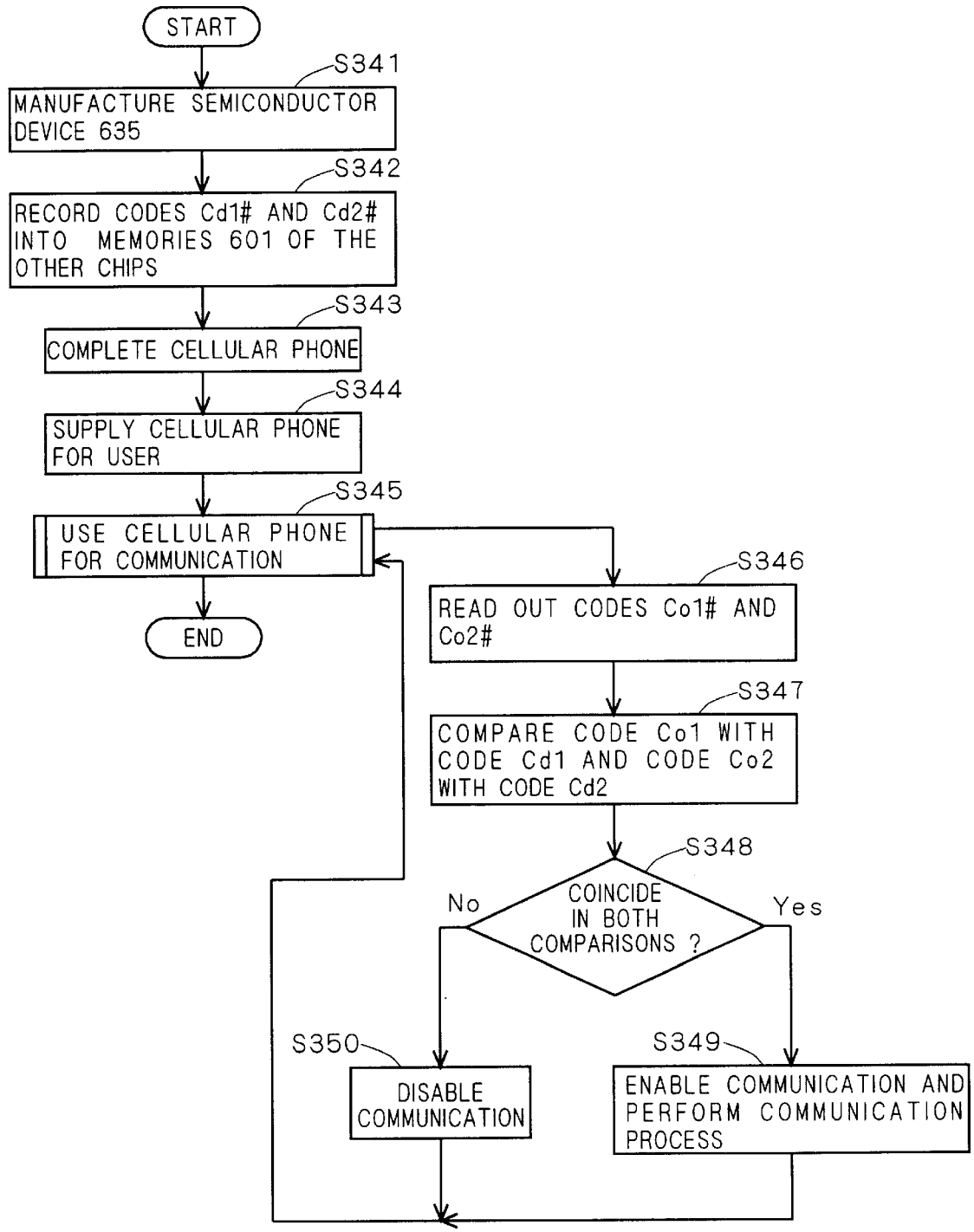
FIG. 29 is a flowchart of procedure for the use of the terminal device incorporating the semiconductor device of FIG. 28.

FIG. 29 is a flowchart of procedure for the use of the terminal device 1011 for communication when the semiconductor device 635 of FIG. 28 is used instead of the semiconductor device 1012 and the communication circuit 405a is used as the predetermined circuit 405 in the terminal device 1011. At first, the semiconductor device 635 as a part is manufactured (S341). During or before the last step, the encrypted identification codes Cd1# and Cd2# are recorded into the memory 601 of the other semiconductor substrate as the memory codes Co#1 and Co#2 (S342). After that, the semiconductor device 635 is supplied for a phone maker and the terminal device 1011 is assembled by the phone maker (S343). The finished terminal device 1011 is supplied for a user (S344), and served for communication by the user (S345).

The steps S346 to S350 show a procedure of communication using the terminal device 1011, i.e., an internal flow of the step S345. When the communication is started, the terminal device 1011 reads out the memory codes Co1# and Co2# from the two memories 601 (S346). Subsequently, the decoder circuit 632 decodes the memory codes Co1# and Co2# into the memory codes Co1 and Co2 and thereafter one of the comparator circuits 403 compares the identification code Cd1 and the memory code Co1 to output the enable signal En1 representing the judgment result on whether these codes coincide with each other or not, and at the same time, the other of the comparator circuits 403 compares the identification code Cd2 and the memory code Co2 to output the enable signal En2 representing the judgment result on whether these codes coincide with each other or not (S347).

When both the enable signals En1 and En2 indicate coincidence of the codes (S348), the communication circuit 405a maintains the communication function to continue the communication (S349). On the other hand, at least one of the enable signals En1 and En2 indicates noncoincidence of the codes (S348), the communication circuit 405a stops at least one of the transmission function and the reception function to disable the communication (S350). When the communication is completed, the procedure is ended.

[6. The Sixth Preferred Embodiment]

In the sixth preferred embodiment, discussion will be made on a constitution where a switching circuit for exclusively performing transmission of the encrypted identification code and input of the encrypted memory code is provided in the semiconductor device of the fifth preferred embodiment.

Figure 30:
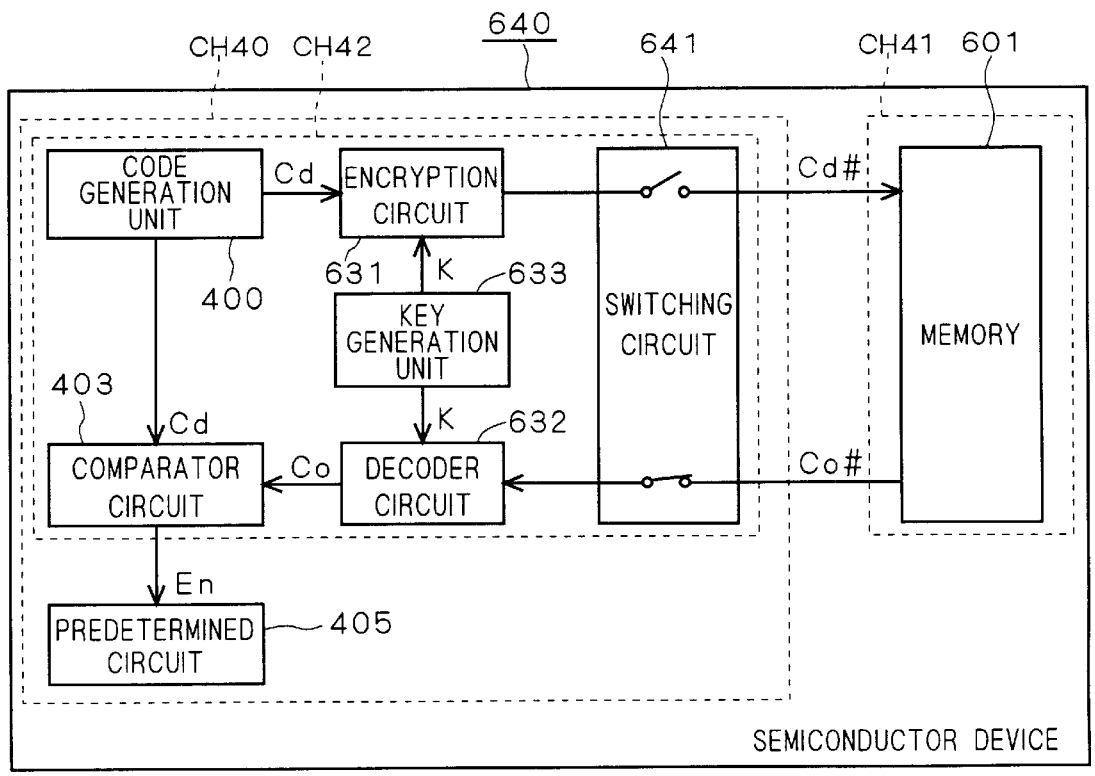
FIG. 30 is a block diagram of a semiconductor device in accordance with a sixth preferred embodiment of the present invention.

FIG. 30 is a block diagram showing a constitution of a semiconductor device in accordance with the sixth preferred embodiment of the present invention. In the semiconductor device 640 of FIG. 30, a switching circuit 641 is formed in a semiconductor substrate CH40 or CH42 in which the code generation unit 400 is formed together with the encryption circuit 631, the decoder circuit 632 and the key generation unit 633. The switching circuit 641 is inserted in a transmission path of the identification code Cd# transmitted from the encryption circuit 631 to the memory 601 formed in a semiconductor substrate CH41 and a transmission path of the memory code Co# transmitted from the memory 601 to the decoder circuit 632, and exclusively performs the transmission of the identification code Cd# and the transmission of the memory code Co#.

Even if a user short-circuits a terminal of the semiconductor substrate CH40 (or CH42) so that the identification code Cd# outputted from the encryption circuit 631 may be inputted directly to the decoder circuit 632 in an attempt to make a fraudulent use, the switching circuit 641 prevents the identification code Cd# from being inputted directly to the decoder circuit 642. In other words, even if the fraudulent use through short circuit of the terminal is attempted, it is impossible to pretend that the identification code Cd and the memory code Co to be compared by the comparator circuit 403 coincide with each other. Thus, the semiconductor device 640 can also prevent the fraudulent use of the appliance through short circuit of the terminal of the semiconductor substrate.

Another constitution where the switching circuit 641 is interposed between the code generation unit 400 and the encryption circuit 631 and between the comparator circuit 403 and the decoder circuit 632 can produce the same effect. In general, the switching circuit 641 has only to be inserted in the transmission path of the identification code Cd (Cd#) from the code generation unit 400 to the memory 601 and the transmission path of the memory code Co (Co#) from the memory 601 to the comparator circuit 403.

Further, the switching circuit 641 can be applies to the semiconductor device 600 of FIG. 1 which does not comprise the encryption circuit 631 etc. Specifically, in the semiconductor device 600 of FIG. 1, the switching circuit 641 may be formed in the semiconductor substrate CH1 (or CH3) so as to be inserted in the transmission path of the identification code Cd from the code generation unit 400 to the memory 601 and the transmission path of the memory code Co from the memory 601 to the comparator circuit 403. This can produce the same effect as in the semiconductor device 640 of FIG. 30.

Furthermore, the switching circuit 641 can be applied to the semiconductor device 620 of FIG. 13 and the semiconductor device 635 of FIG. 28. In the semiconductor device 620 of FIG. 13, the switching circuit 641 is formed both in the semiconductor substrates CH4 (CH6) and CH5. In the semiconductor device 635 of FIG. 28, the switching circuit 641 is formed both in the semiconductor substrates CH20 (or CH22) and CH23.

[7. The Seventh Preferred Embodiment]

The key generation unit 633 comprising the semiconductor element 401 discussed in the fifth preferred embodiment can be applied to a general terminal device which transmits and receives data to and from a host computer. The terminal device having such a constitution will be discussed in the seventh preferred embodiment.

Figure 31:
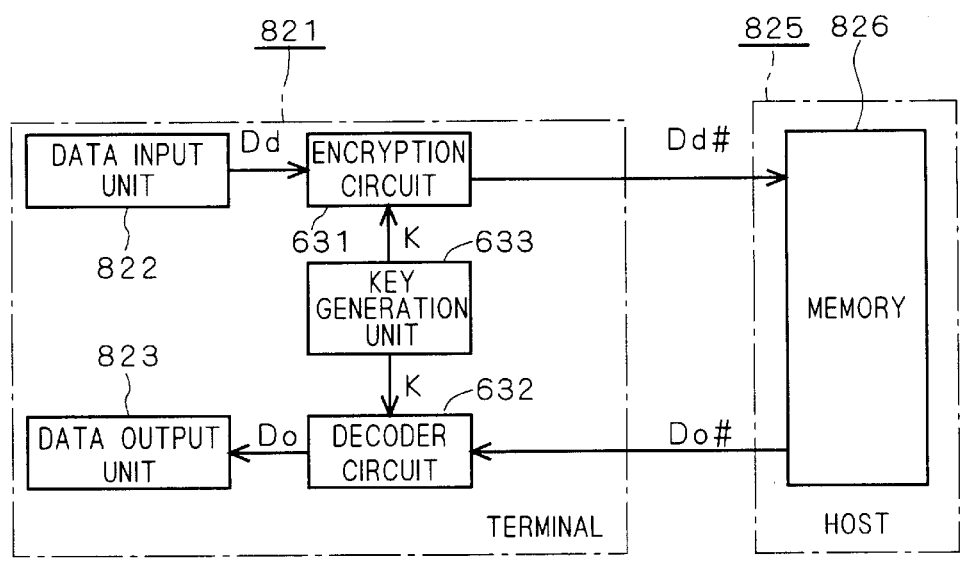
FIG. 31 is a block diagram showing a terminal device in accordance with a seventh preferred embodiment of the present invention.

FIG. 31 is a block diagram showing a constitution of a terminal device in accordance with the seventh preferred embodiment of the present invention. A terminal device 821 and a host computer 825 connected thereto constitute a system 820 for transmitting and receiving data Dd therebetween. The terminal device 821 comprises a data input unit 822 for inputting the data Dd and a data output unit 823 for outputting the data Dd, and further comprises the encryption circuit 631, the decoder circuit 632 and the key generation unit 633. The key generation unit 633 generates the key K for encryption. The encryption circuit 631 encrypts the data Dd inputted by the data input unit 822 into data Dd# on the basis of the key K generated by the key generation unit 633 and transmits the data Dd# to the host computer 825.

The host computer 825 stores the encrypted data Dd# in a memory 826 as data Do#. The decoder circuit 632 receives the data Do# stored in the memory 826, decodes the data Do# into the data Do on the basis of the key K generated by the key generation unit 633 and transmits the data Do to the data output unit 823. The data Do is equivalent to the data Dd. Thus, since the terminal device 821 transmits and receives the encrypted data to and from the host computer 825, the barrier against leakage of the information represented by the data is high.

The internal constitution of the key generation unit 633 is shown in FIG. 26. Specifically, the key generation unit 633 generates the key K inherent in the terminal device by using the electric property which varies from one semiconductor element 401 to another. Therefore, since it is not necessary to write the key K in the manufacturing process of the terminal device 821 and the semiconductor elements 401 manufactured through the same process can be used among a lot of mass-produced terminal devices 821, the manufacturing process of the terminal device 821 can be simplified. Further, since the electric property of the semiconductor element 401 on which the key K is based can not be changed from the outside, the barrier against the fraudulent change of the key K is advantageously high.

FIG. 32 is a block diagram showing another constitution of the terminal device in accordance with the seventh preferred embodiment of the present invention. The terminal device of FIG. 32 is characteristically different from the terminal device 821 of FIG. 31 in that the key generation unit 633 is incorporated in an IC card 829 detachable from a main body portion 828. When the IC card 829 is attached to the main body portion 828, the encryption circuit 631 and the decoder circuit 632 formed in the main body portion 828 are connected to the key generation unit 633.

Since the key generation unit 633 is incorporated in the IC card 829 detachable from the main body portion 828, it is possible to use the same key K for a plurality of main body portions 828 installed away from one another by freely carrying the portable IC card 829.

[8. The Eighth Preferred Embodiment]

In the eighth preferred embodiment, discussion will be made on a constitution where the memory 654 storing the memory code Co is incorporated in an auxiliary portion detachable from a main body portion in the terminal device 801 of the fourth preferred embodiment.

Figure 33:
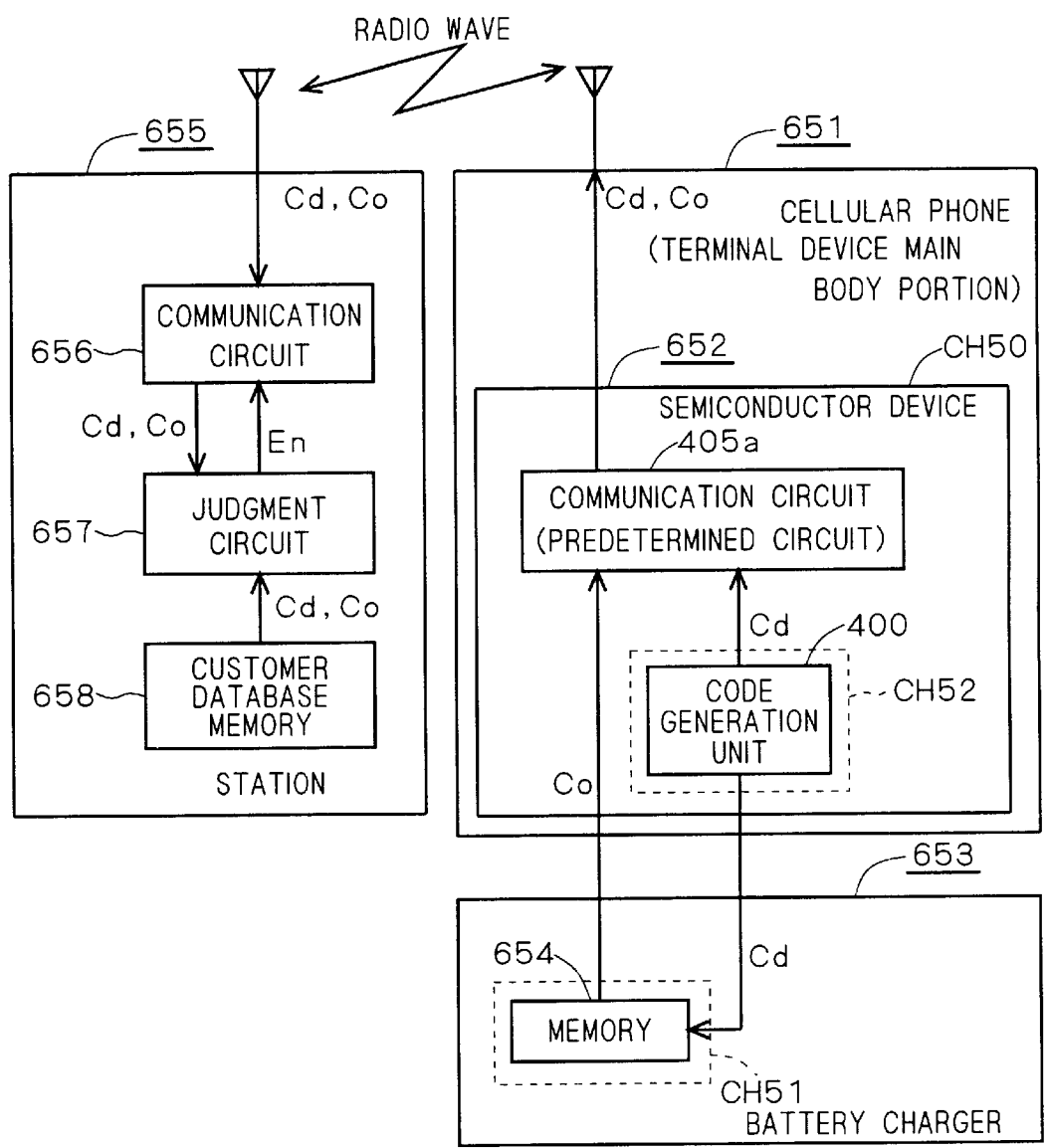
FIG. 33 is a block diagram showing a terminal device in accordance with an eighth preferred embodiment of the present invention.

FIG. 33 is a block diagram showing a constitution of a terminal device in accordance with the eighth preferred embodiment of the present invention. The terminal device is separated in a main body portion 651 and a battery charger 653 as an auxiliary portion, which is an equivalent to a device where a semiconductor substrate CH50 is incorporated into the main body portion 651 and a semiconductor substrate CH51 is incorporated into the battery charger 653 in the terminal device 801 of FIG. 20. The main body portion 651 comprises a rechargeable battery which is not shown, and the battery charger 653 charges the battery when attached to the main body portion 651.

When the battery charger 653 is attached to the main body portion 651, not only the battery is charged, but also the semiconductor device 652 having the semiconductor substrate CH50 is connected to the semiconductor substrate CH51. The communication circuit 405a transmits only identification code Cd, among the identification code Cd and the memory code Co, to the communication common carrier equipment 655 when the battery charger is not attached to the main body portion 651 and transmits both the identification code Cd and the memory code Co to the communication common carrier equipment 655 when the battery charger is attached to the main body portion 651. The communication common carrier equipment 655, the terminal device main body portion 651 and the battery charger 653 constitute a communication system 650.

Figure 34:
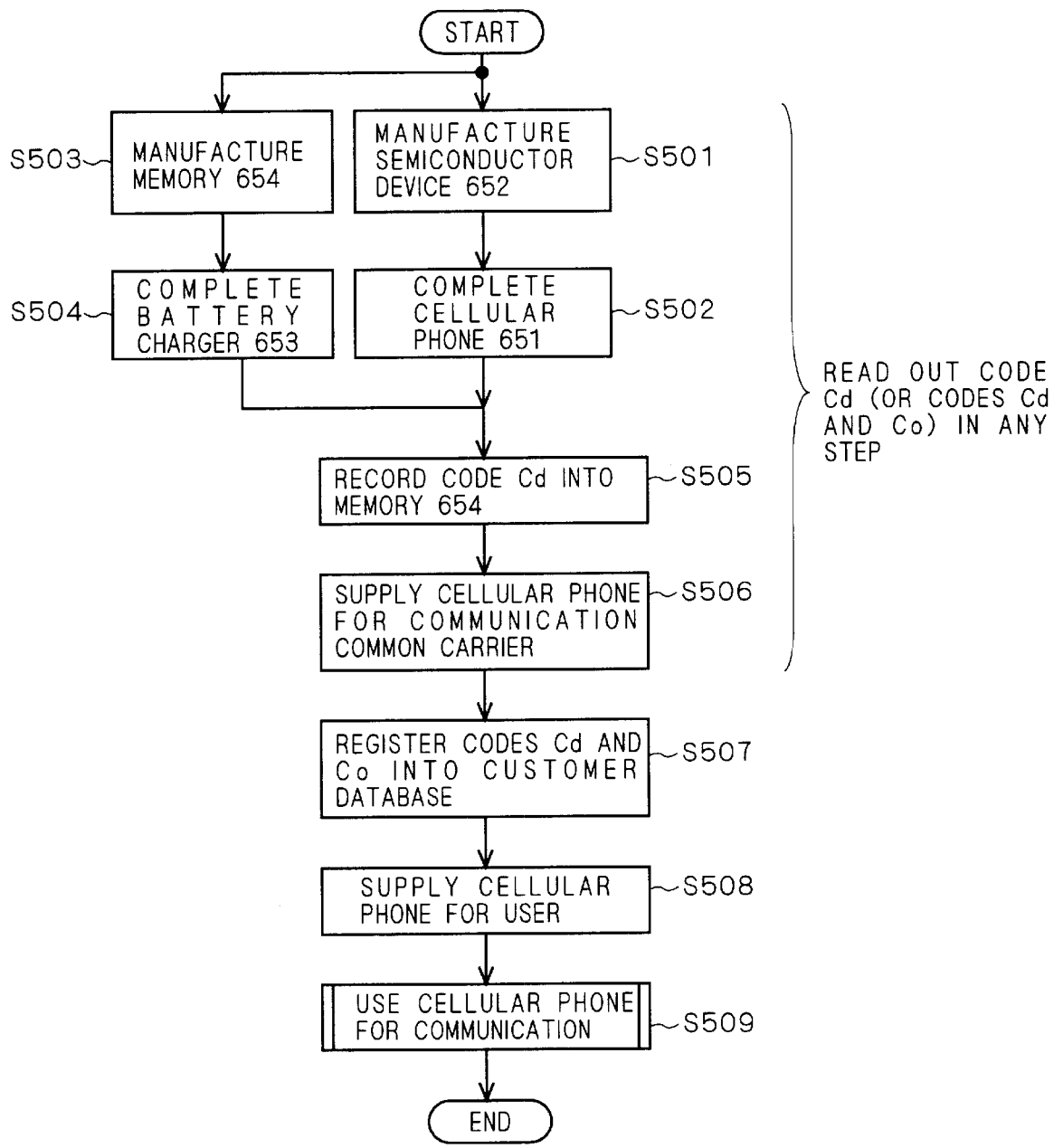
FIG. 34 is a flowchart of procedure for the use of the terminal device of FIG. 33.

FIG. 34 is a flowchart of procedure for the use of the terminal device of FIG. 33 for communication. At first, the semiconductor device 652 as a part is manufactured (S501). After that, the semiconductor device 652 is supplied for a phone maker and the terminal device main body portion 651 is assembled by the phone maker (S502). In parallel to these steps, or before or after these steps, the memory 654 as a part is manufactured (S503), and the battery charger 653 is thereafter assembled by the phone maker (S504).

When both the terminal device main body portion 651 and the battery charger 653 are finished, the identification code Cd is recorded into the memory 654 as the memory code Co (S505) and a set of the terminal device main body portion 651 and the battery charger 653 are supplied for a communication common carrier holding the communication common carrier equipment 655 (S506). Both the identification code Cd and the memory code Co are read out in any stage of the steps S501 to S506 and registered into the customer database memory 658 of the communication common carrier equipment 655 (S507). After that, the set of the terminal device main body portion 651 and the battery charger 653 are supplied for a user (S508) and thereafter served for communication by the user (S509).

Figure 35:
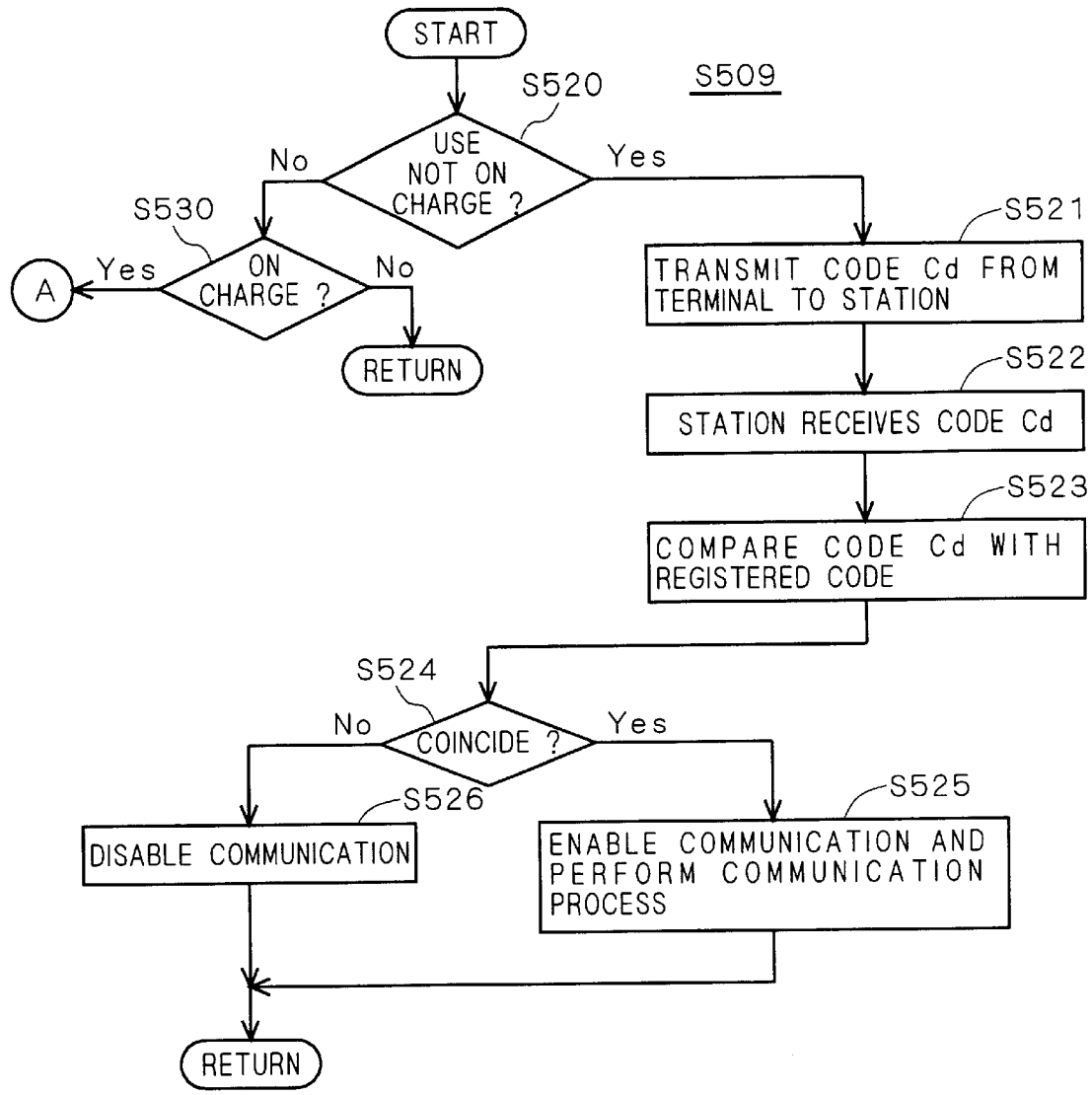
FIGS. 35 and 36 are flowcharts of the step S509 of FIG. 34.
Figure 36:
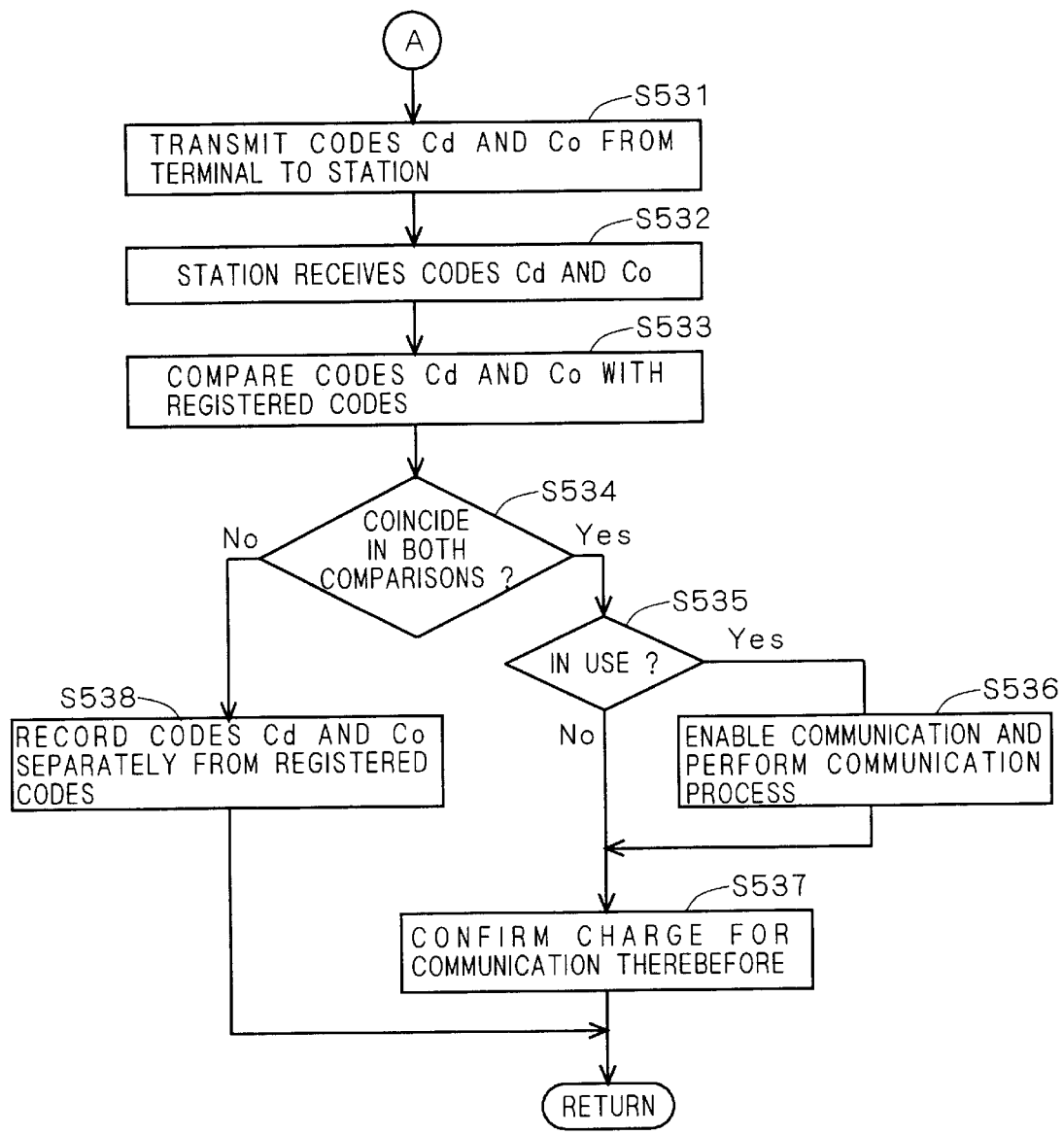

FIGS. 35 and 36 are flowcharts showing an internal procedure of the step S509 of FIG. 34. When the communication is started, if the terminal device is used not on charge, in other words, if the battery charger 653 is not attached to the main body portion 651 (S520), the terminal device main body portion 651 transmits the identification code Cd to the communication common carrier equipment 655 (S521). The communication common carrier equipment 655 accordingly receives the identification code Cd through the communication circuit 656 (S522).

Subsequently, in the communication common carrier equipment 655, the judgment circuit 657 compares the identification code Cd with the registered identification code Cd and judges whether these codes coincide with each other or not to transmit the enable signal En representing the judgment result to the communication circuit 656 (S523). When the enable signal En indicates coincide of the codes (S524), the communication common carrier equipment 655 performs an authentication that the user of the terminal device main body portion 651 is authorized and when the enable signal En indicates noncoincidence of the codes (S524), the communication common carrier equipment 655 does not perform the authentication. The communication common carrier equipment 655 permits the communication to continue the communication process (S525) when the authentication is performed, and does not permit the communication to stop the communication process (S526) when the authentication is not performed, for example.

If the terminal device is used on charge, in other words, if the main body portion 651 is used for communication while being connected to the battery charger 653 (S520, S530), the terminal device main body portion 651 transmits both the identification code Cd and the memory code Co to the communication common carrier equipment 655 (S531). The communication common carrier equipment 655 accordingly receives the identification code Cd and the memory code Co through the communication circuit 656 (S532).

Subsequently, in the communication common carrier equipment 655, the judgment circuit 657 compares the identification code Cd with the registered identification code Cd to judge whether these codes coincide with each other or not and at the same time, compares the memory code Co with the registered memory code Co to judge whether these codes coincide with each other or not. The judgment circuit 657 transmits the enable signal En representing the two judgment results to the communication circuit 656 (S533).

When it is recognized on the basis of the enable signal En that both the judgment results indicate coincidence of the codes (S534), the communication common carrier equipment 655 performs an authentication that the user of the terminal device is authorized and when it is recognized that at least one of the judgment results indicates noncoincidence of the codes (S534), the communication common carrier equipment 655 does not perform the authentication. Since the judgment is made on the basis both of the two codes Cd and Co in the step S533, the accuracy of the judgment in the step S533 is higher than that in the step S523. In other word, the authentication made on the basis of the judgment in the step S533 is a high-level authentication, proving that the terminal device is used validly with higher accuracy than the authentication made on the basis of the judgment in the step S523.

Therefore, the communication common carrier equipment 655 can selectively use the two authentications of different levels depending on the importance. As an example, if the authentication is performed on the basis of the judgment in the step S533, when the terminal device is used for communication (S535), the communication common carrier equipment 655 not only permits the communication to continue the communication process (S536), but also records the communication charge for the communication therebefore (from the previous authentication based on the judgment in the step S533 up to this communication) as confirmed, regardless of whether the terminal device is used for communication (S537). It is thereby possible to prevent an illegal action of evading the duty of payment on the pretence that the terminal device has been lost. Since it is rare case that the terminal device main body portion 651 and the battery charger 653 are lost together, the confirmation is made with sufficiently high accuracy.

Further, if the authentication is not performed on the basis of the judgment in the step S533, the communication common carrier equipment 655 records the identification code Cd and the memory code Co which are received in the step S532 into the customer database memory 658 separately from the identification code Cd and the memory code Co which have been registered. The recorded identification code Cd and memory code Co can be useful for specifying the unauthorized user.

Back to the step S507 of FIG. 34, there may be another case where only the identification code Cd is registered, instead of both the identification code Cd and the memory code Co. In this case, only the identification code Cd has to be read out in any stage of the steps S501 to S506. Registering the memory code Co is achieved by registering the memory code Co transmitted in the step S531 into the customer database memory 658 when the user first uses the terminal device on charge (S530).

Furthermore, the memory 601 may be incorporated in some auxiliary portion, not limited to the battery charger 653, detachable from the main body portion. The constitution of FIG. 33 where the auxiliary portion is the battery charger 653, however, has an advantage of periodically combining the main body portion 651 and the auxiliary portion without requesting an extra labor of the user.

[9. The Ninth Preferred Embodiment]

In the ninth preferred embodiment, discussion will be made on a constitution where the codes are transmitted in the encrypted form between the main body portion and the auxiliary portion and between the main body portion and the communication common carrier equipment in the terminal device of the eighth preferred embodiment.

Figure 37:
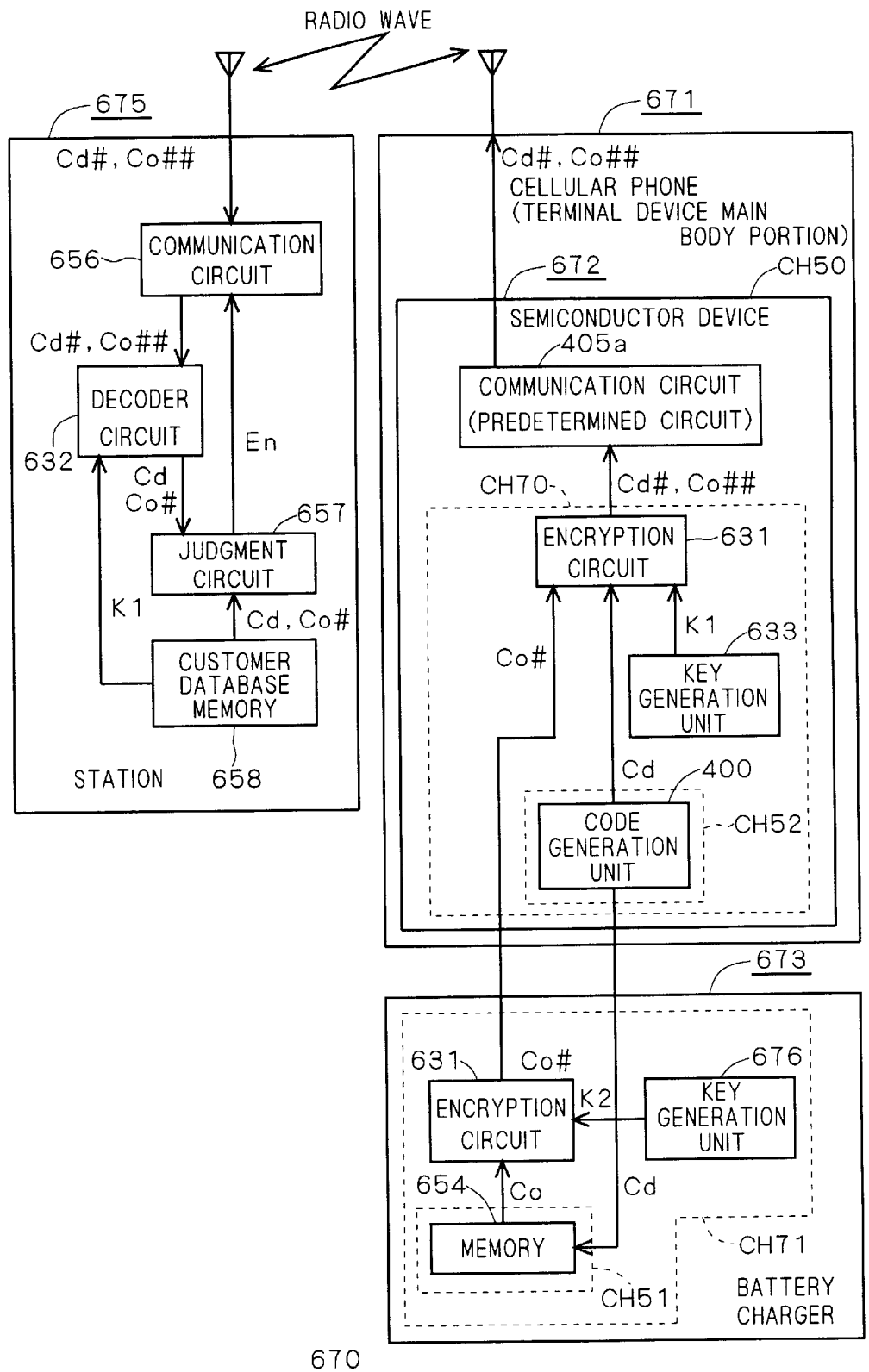
FIG. 37 is a block diagram showing a terminal device in accordance with a ninth preferred embodiment of the present invention.

FIG. 37 is a block diagram showing a constitution of a terminal device in accordance with the ninth preferred embodiment of the present invention. The terminal device is characteristically different from the terminal device of FIG. 33 in that the encryption circuit 631 and the key generation unit 633 are formed in a semiconductor device 672 of a main body portion 671 and the encryption circuit 631 and a key generation unit 676 are also formed in the battery charger 653. Accordingly, the decoder circuit 632 is formed in a communication common carrier equipment 675. The communication common carrier equipment 675, the terminal device main body portion 671 and the battery charger 673 constitute a communication system 670.

In the battery charger 673, the key generation unit 676 generates the key K2 for encryption and the encryption circuit 631 encrypts the memory code Co read out from the memory 601 on the basis of the key K2 and transmits the encrypted memory code to the main body portion 671 as a memory code Co#. In the main body portion 671, the key generation unit 633 generates the key K1 for encryption and the encryption circuit 631 encrypts the identification code Cd generated by the code generation unit 400 on the basis of the key K1 and transmits the encrypted identification code to the communication circuit 405a as an identification code Cd#. The encryption circuit 631 in the main body portion 671 also encrypts the memory code Co# transmitted from the battery charger 673 on the basis of the key K1 and transmits the encrypted memory code to the communication circuit 405a as a memory code Co##. The memory code Co## is doubly encrypted on the basis of the two keys K1 and K2.

The communication circuit 405a transmits the identification code Cd# and the memory code Co## which are encrypted to the communication common carrier equipment 675. The decoder circuit 632 of communication common carrier equipment 675 decodes the identification code Cd# and the memory code Co## into the identification code Cd and the memory code Co# to be served for judgment in the judgment circuit 657.

Thus, since the codes are transmitted in the encrypted form between the main body portion 671 and the battery charger 673 and between the main body portion 671 and the communication common carrier equipment 675 in the terminal device of FIG. 37, the barrier against leakage of these codes is advantageously high.

In the main body portion 671, it is preferable that the key generation unit 633 and the encryption circuit 631 are formed in the single semiconductor substrate CH50 (or CH70) together with the code generation unit 400. With this constitution, a still higher barrier against leakage of the key K1 and the identification code Cd is achieved. Similarly, in the battery charger 673, it is preferable that the key generation unit 676 and the encryption circuit 631 are formed in a single semiconductor substrate CH71 together with the memory 654. With this constitution, a still higher barrier against leakage of the key K2 and the memory code Co is achieved.

Figure 38:
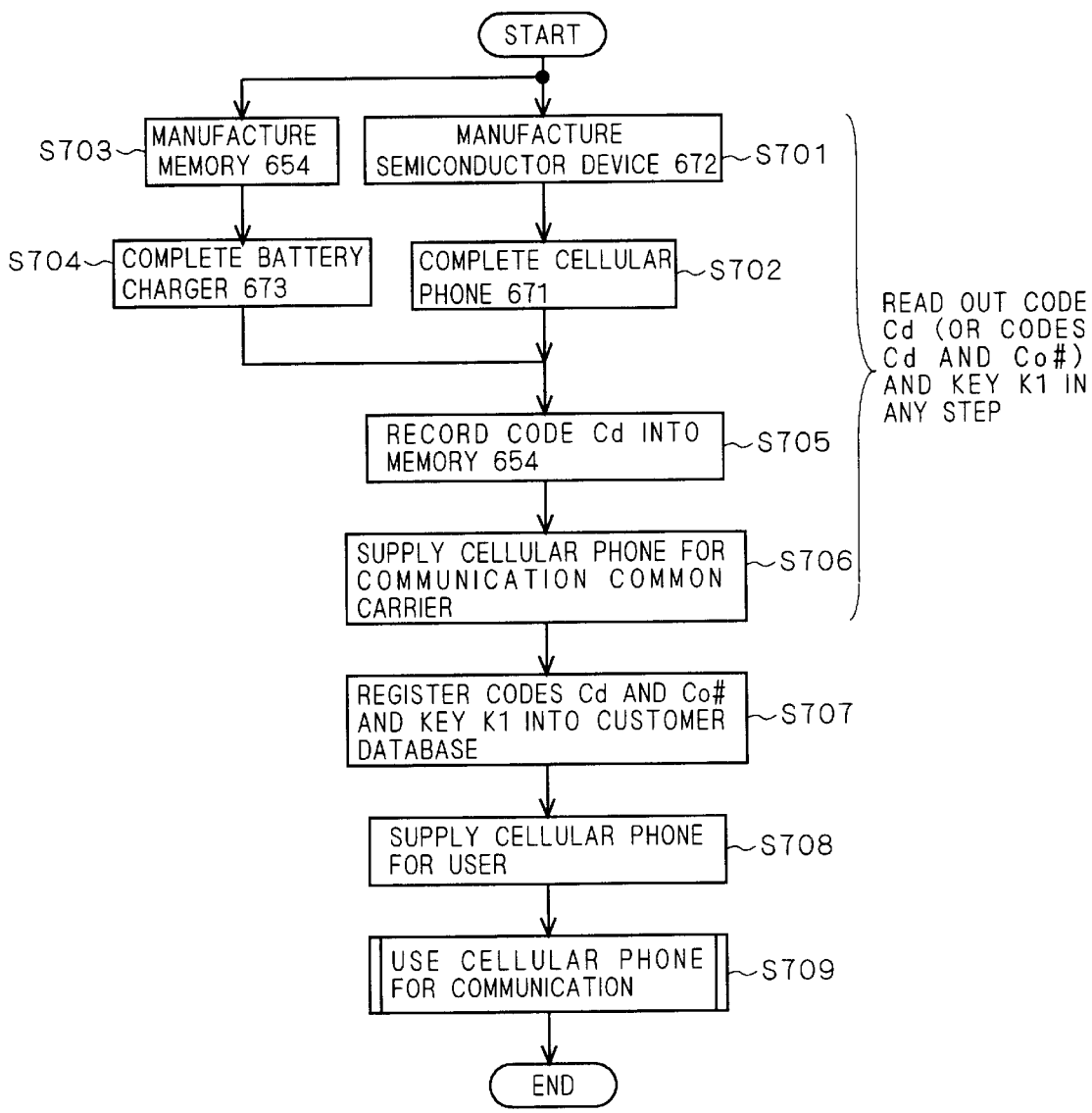
FIG. 38 is a flowchart of procedure for the use of the terminal device of FIG. 37.

FIG. 38 is a flowchart of procedure for the use of the terminal device of FIG. 37. At first, the semiconductor device 672 as a part is manufactured (S701). After that, the semiconductor device 672 is supplied for a phone maker and the terminal device main body portion 671 is assembled by the phone maker (S702). In parallel to these steps, or before or after these steps, the memory 654 as a part is manufactured (S703), and the battery charger 673 is thereafter assembled by the phone maker (S704).

When both the terminal device main body portion 671 and the battery charger 673 are finished, the identification code Cd is recorded as the memory code Co into the memory 654 (S705) and a set of the terminal device main body portion 671 and the battery charger 673 are supplied for a communication common carrier holding the communication common carrier equipment 675 (S706). The identification code Cd, the memory code Co# and the key K1 are read out in any stage of the steps S701 to S706 and registered into the customer database memory 658 of the communication common carrier equipment 675 (S707). After that, the set of the terminal device main body portion 671 and the battery charger 673 are supplied for a user (S708) and thereafter served for communication by the user (S709).

Figure 39:
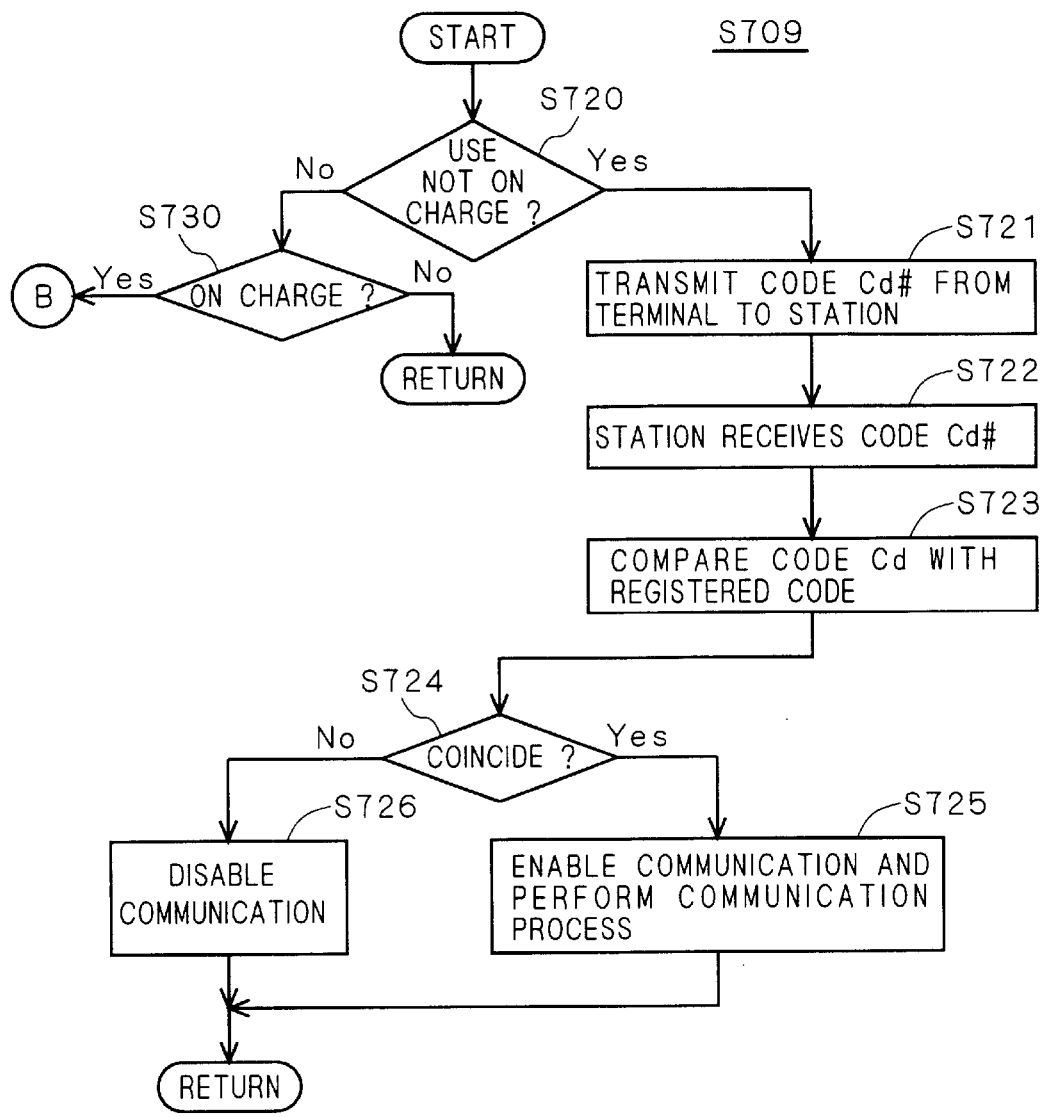
FIGS. 39 and 40 are flowcharts of the step S709 of FIG. 38.
Figure 40:
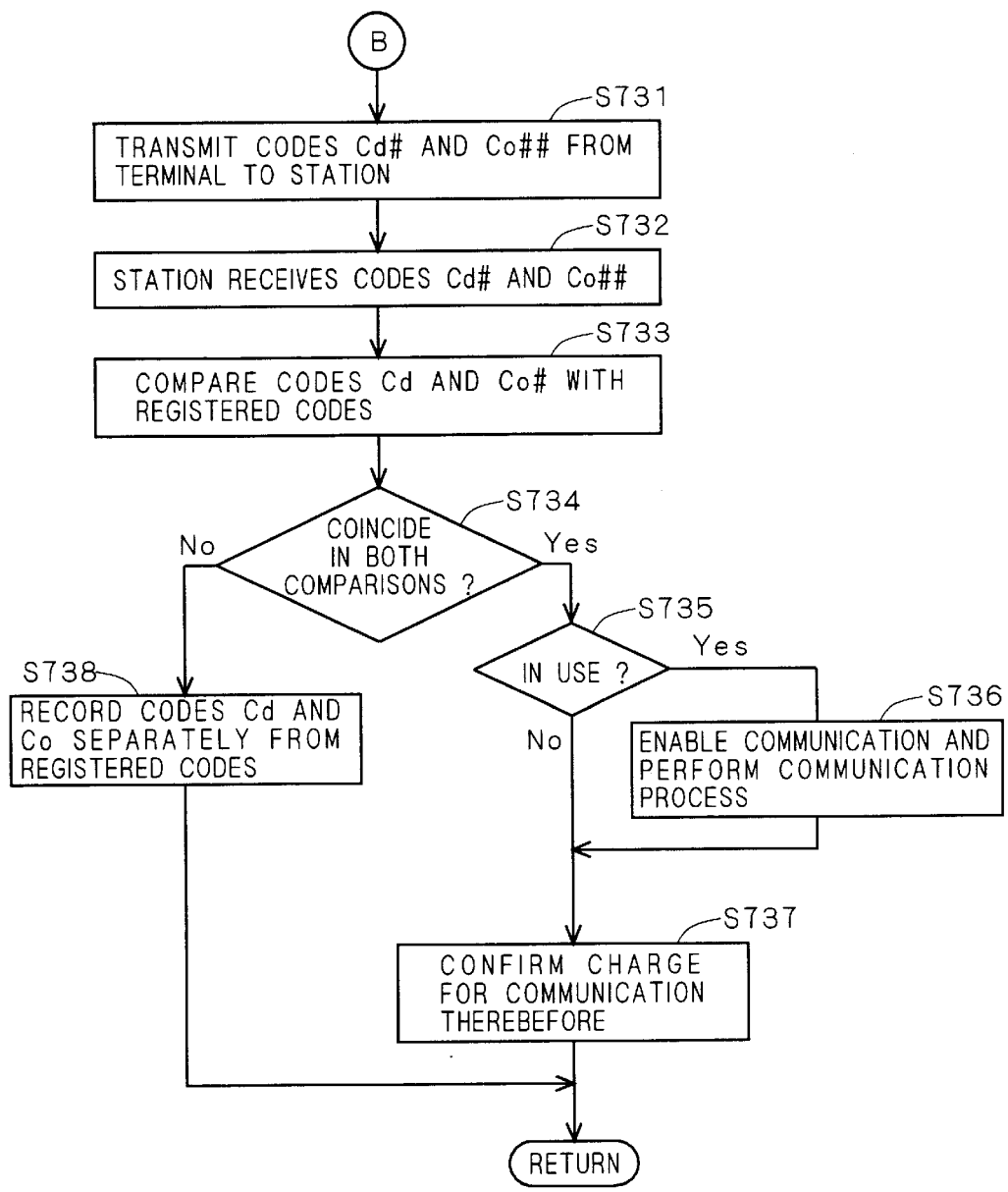

FIGS. 39 and 40 are flowcharts showing an internal procedure of the step S709 of FIG. 38. When the communication is started, if the terminal device is used not on charge, in other words, if the battery charger 673 is not attached to the main body portion 671 (S720), the terminal device main body portion 671 transmits the identification code Cd# to the communication common carrier equipment 675 (S721). The communication common carrier equipment 675 accordingly receives the identification code Cd# at the communication circuit 656 (S722).

Subsequently, in the communication common carrier equipment 675, the decoder circuit 632 decodes the identification code Cd# into the identification code Cd, and then the judgment circuit 657 compares the identification code Cd with the registered identification code Cd and judges whether these codes coincide with each other or not to transmit the enable signal En representing the judgment result to the communication circuit 656 (S723). When the enable signal En indicates coincidence of the codes (S724), the communication common carrier equipment 675 performs an authentication that the user of the terminal device main body portion 671 is authorized and when the enable signal En indicates noncoincidence of the codes (S724), the communication common carrier equipment 675 does not perform the authentication. The communication common carrier equipment 675 permits the communication to continue the communication process (S725) when the authentication is performed, and does not permit the communication to stop the communication process (S726) when the authentication is not performed, for example.

If the terminal device is used on charge, in other words, if the main body portion 671 is used for communication while being connected to the battery charger 673 (S720, S730), the terminal device main body portion 671 transmits both the identification code Cd# and the memory code Co## to the communication common carrier equipment 675 (S731). The communication common carrier equipment 675 accordingly receives the identification code Cd# and the memory code Co## through the communication circuit 656 (S732).

Subsequently, in the communication common carrier equipment 675, the decoder circuit 632 decodes the identification code Cd# into the identification code Cd and decodes the memory code Co## into the memory code Co#, and then the judgment circuit 657 compares the identification code Cd with the registered identification code Cd to judge whether these codes coincide with each other or not and at the same time, compares the memory code Co# with the registered memory code Co# to judge whether these codes coincide with each other or not. The judgment circuit 657 transmits the enable signal En representing the two judgment results to the communication circuit 656 (S733).

When it is recognized on the basis of the enable signal En that both the judgment results indicate coincidence of the codes (S734), the communication common carrier equipment 675 performs an authentication that the user of the terminal device is authorized and when it is recognized that at least one of the judgment results indicates noncoincidence of the codes (S734), the communication common carrier equipment 675 does not perform the authentication. The authentication made on the basis of the judgment in the step S733 is a high-level authentication, proving that the terminal device is used validly with higher accuracy than the authentication made on the basis of the judgment in the step S723.

As an example, if the high-level authentication is performed on the basis of the judgment in the step S733, when the terminal device is used for communication (S735), the communication common carrier equipment 675 not only permits the communication to continue the communication process, but also records the communication charge for the communication therebefore (from the previous authentication based on the judgment in the step S733 up to this communication) as confirmed, regardless of whether the terminal device is used for communication (S737). Further, if the high-level authentication is not performed on the basis of the judgment in the step S733, the communication common carrier equipment 675 records the identification code Cd and the memory code Co which are received in the step S732 into the customer database memory 658 separately from the identification code Cd and the memory code Co which have been registered.

Back to the step S707 of FIG. 38, there may be another case where only the identification code Cd and the key K1 are registered, instead of the identification code Cd, the memory code Co# and the key K1. In this case, only the identification code Cd has to be read out in any stage of the steps S701 to S706. Registering the memory code Co# is achieved by registering the memory code Co# transmitted in the step S731 into the customer database memory 658 when the user first uses the terminal device on charge (S730).

Thus, by using the terminal device of FIG. 37, like using the terminal device of FIG. 33, the communication common carrier equipment 675 can selectively use the two authentications of different levels depending on the importance. Moreover, since the identification code Cd and the memory code Co are transmitted in the encrypted form, the barrier against leakage of these codes is advantageously high.

Figure 41:
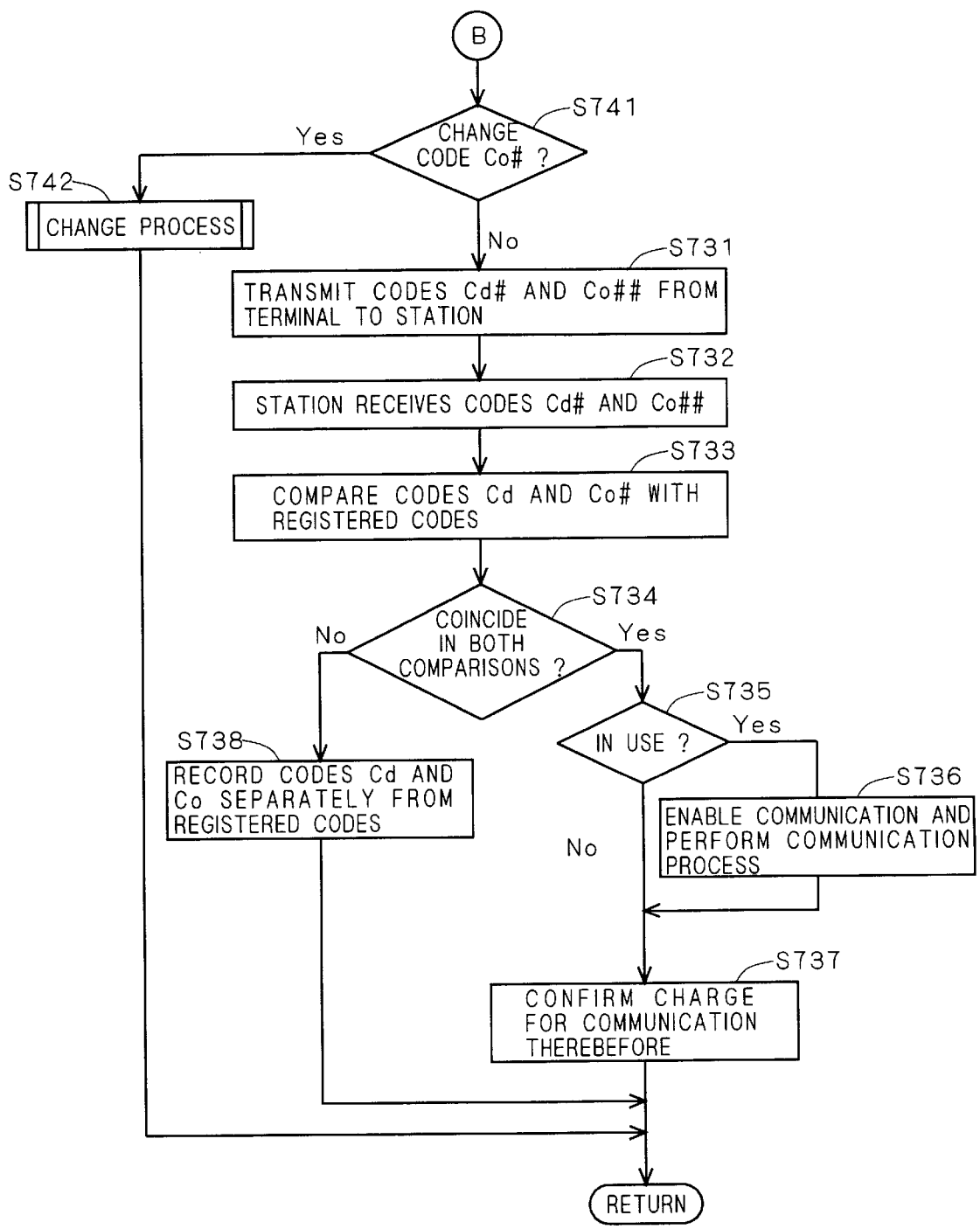
FIG. 41 is a flowchart of another example of the step 709 of FIG. 38.

It is considered that there is a case where an exchange of the battery charger 673 is needed as the battery charger 673 is lost or damaged. In such a case, if the memory code Co# which has been registered can be updated to a memory code Co# inherent in a new battery charger 673, this is convenient for an authorized user. To update the memory code Co#, it is only necessary to add the steps S741 and S742 to the procedure of FIG. 40, as shown in FIG. 41. In the procedure of FIG. 41, when the memory code Co# is not changed (S741), the procedure of the steps S731 to S738 are performed like in the procedure of FIG. 40, and when the memory code Co# is changed (S741), a change process of the memory code Co# which has been registered is performed (S742).

Figure 42:
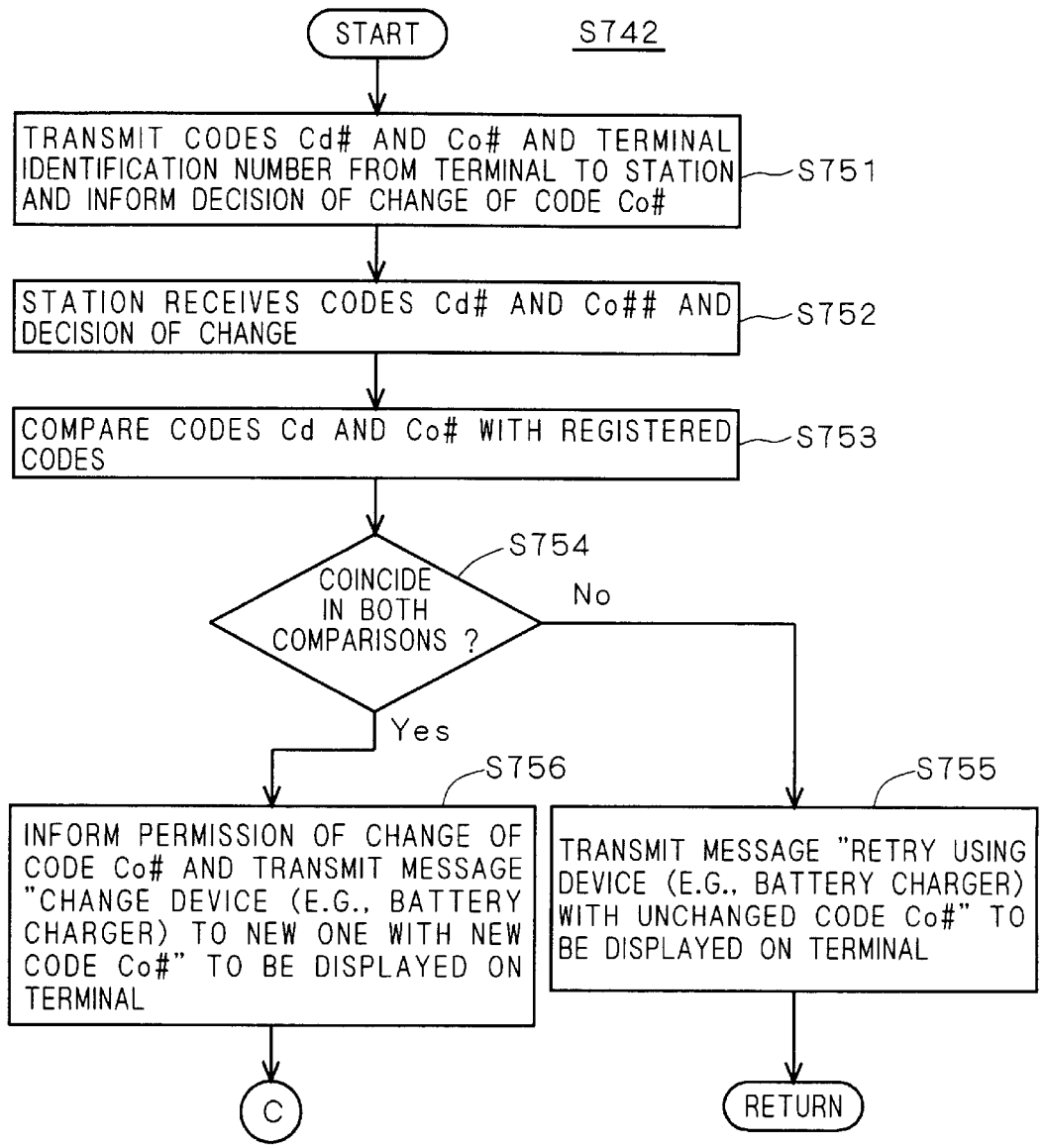
FIGS. 42 and 43 are flowcharts of the step S742 of FIG. 41.
Figure 43:
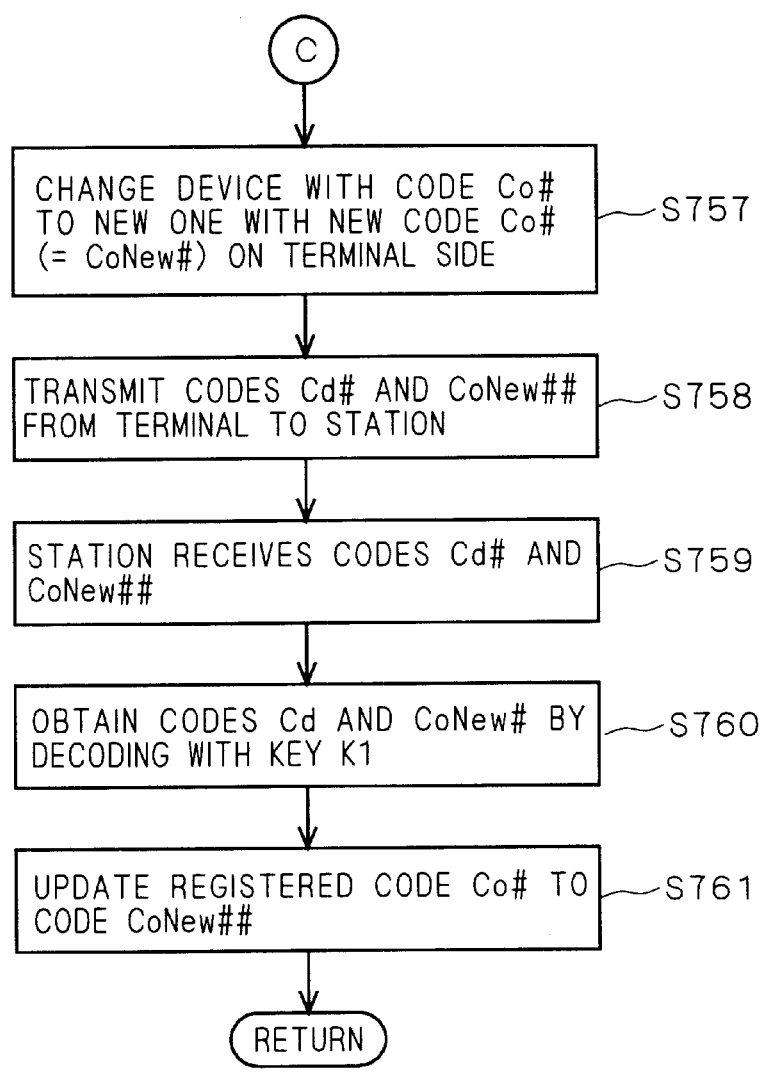

FIGS. 42 and 43 are flowcharts showing an internal procedure of the change process (S742) of FIG. 41. When the change process is started, the identification code Cd#, the memory code Co##, the terminal identification number and a request signal representing decision of changing the registered memory code Co# are transmitted from the terminal device to the communication common carrier equipment 675 (S752). Accordingly, the communication common carrier equipment 675 receives these codes, the terminal identification number and the request signal at the communication circuit 656 (S753).

Subsequently, in the communication common carrier equipment 675, the decoder circuit 632 decodes the identification code Cd# into the identification code Cd and decodes the memory code Co## into the memory code Co#, and then the judgment circuit 657 compares the identification code Cd with the registered identification code Cd and judges whether these codes coincide with each other or not and compares the memory code Co# with the registered memory code Co# and judges whether these codes coincide with each other or not, to transmit the enable signal En representing the two judgment results to the communication circuit 656 (S753).

When it is recognized on the basis of the enable signal En that both the judgment results indicate coincidence of the codes (S754), the communication common carrier equipment 675 transmits notice of permission for changing the registered memory code Co# to the terminal device and further transmits a message prompting a change of the battery charger 673 to a new one with a new memory code Co# to be displayed on the terminal device. When, responding to this, a user of the terminal device changes the battery charger 673 with the memory code Co# to a new battery charger 673 with a new memory code Co# (for convenience of discussion, referred to as CoNew#) (S757), the identification code Cd# and the memory code CoNew## are transmitted from the terminal device to the communication common carrier equipment 675 (S758). Accordingly, the communication common carrier equipment 675 receives these identification code Cd# and the memory code CoNew## at the communication circuit 656 (S753).

Subsequently, in the communication common carrier equipment 675, the decoder circuit 632 decodes the identification code Cd# into the identification code Cd and decodes the memory code CoNew## into the memory code CoNew# (S760). After that, the communication common carrier equipment 675 updates the memory code Co# registered in the customer database memory 658 with the memory code CoNew #.

When it is recognized on the basis of the enable signal En that at least one of the judgment results indicates noncoincidence of the codes (S754), the communication common carrier equipment 675 does not further perform the change process and transmits a message prompting a retry with the currently-used battery charger 673 to be displayed on the terminal device (S755).

The same change process as the step S742 can be added to not only the procedure shown in FIG. 40 but also the procedure shown in FIG. 36 where no encryption is used. That allows the user to change the battery charger 653 of FIG. 33.

Instead of using the OTPROM for the memory 654 in the battery charger 653 and 673, a rewritable memory such as a flash ROM may be used. The above change process S742 is suitable also for the use of the battery charger 653 and 673 in which the memory code Co# can be rewritten. For higher security against the fraudulent change, it is also possible to limit the change process of the registered memory code Co# to a case where the terminal device transmits some information for assurance of charges such as a credit card number.

Figure 44:
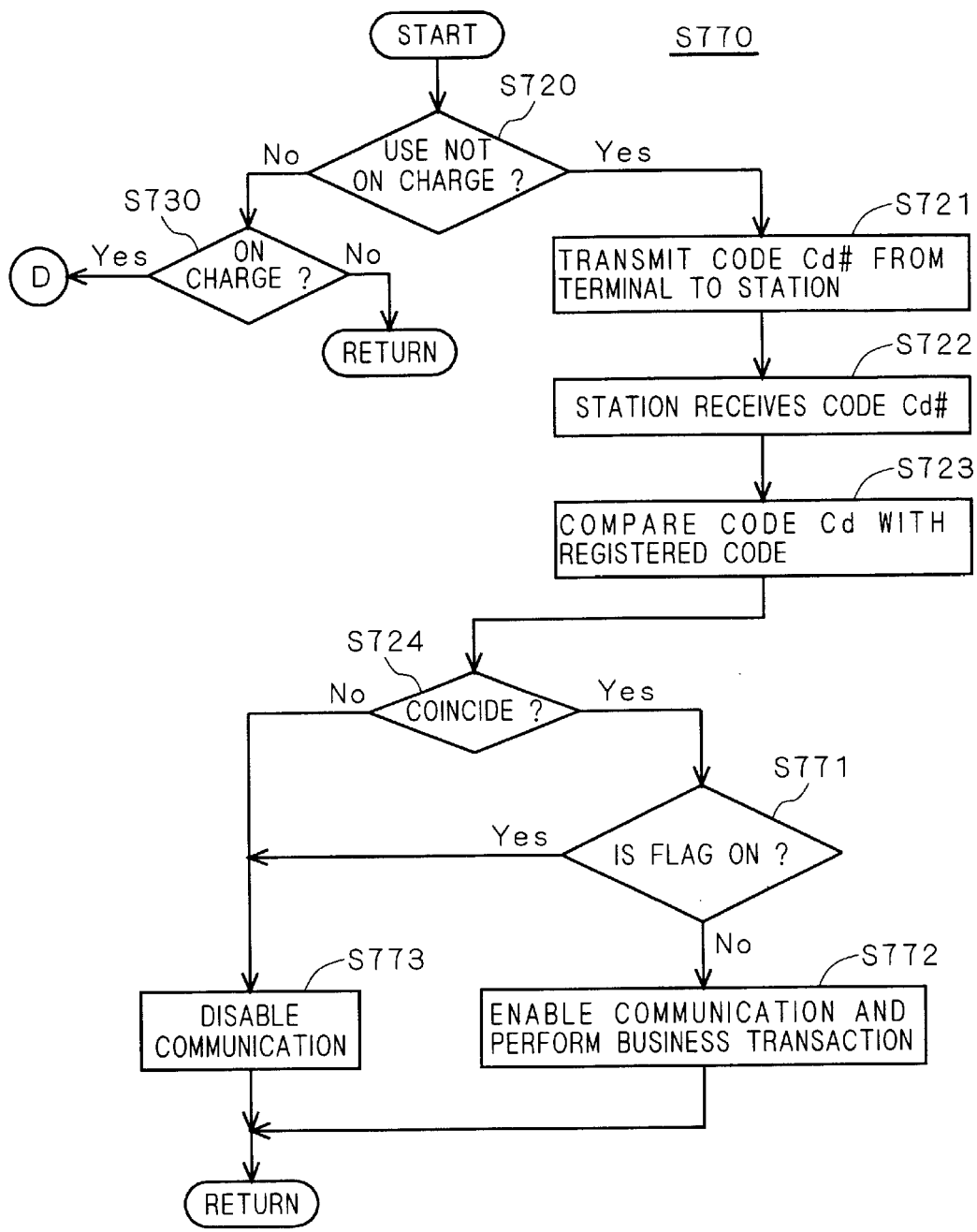
FIGS. 44 and 45 are flowcharts of another example of the step 709 of FIG. 38.
Figure 45:
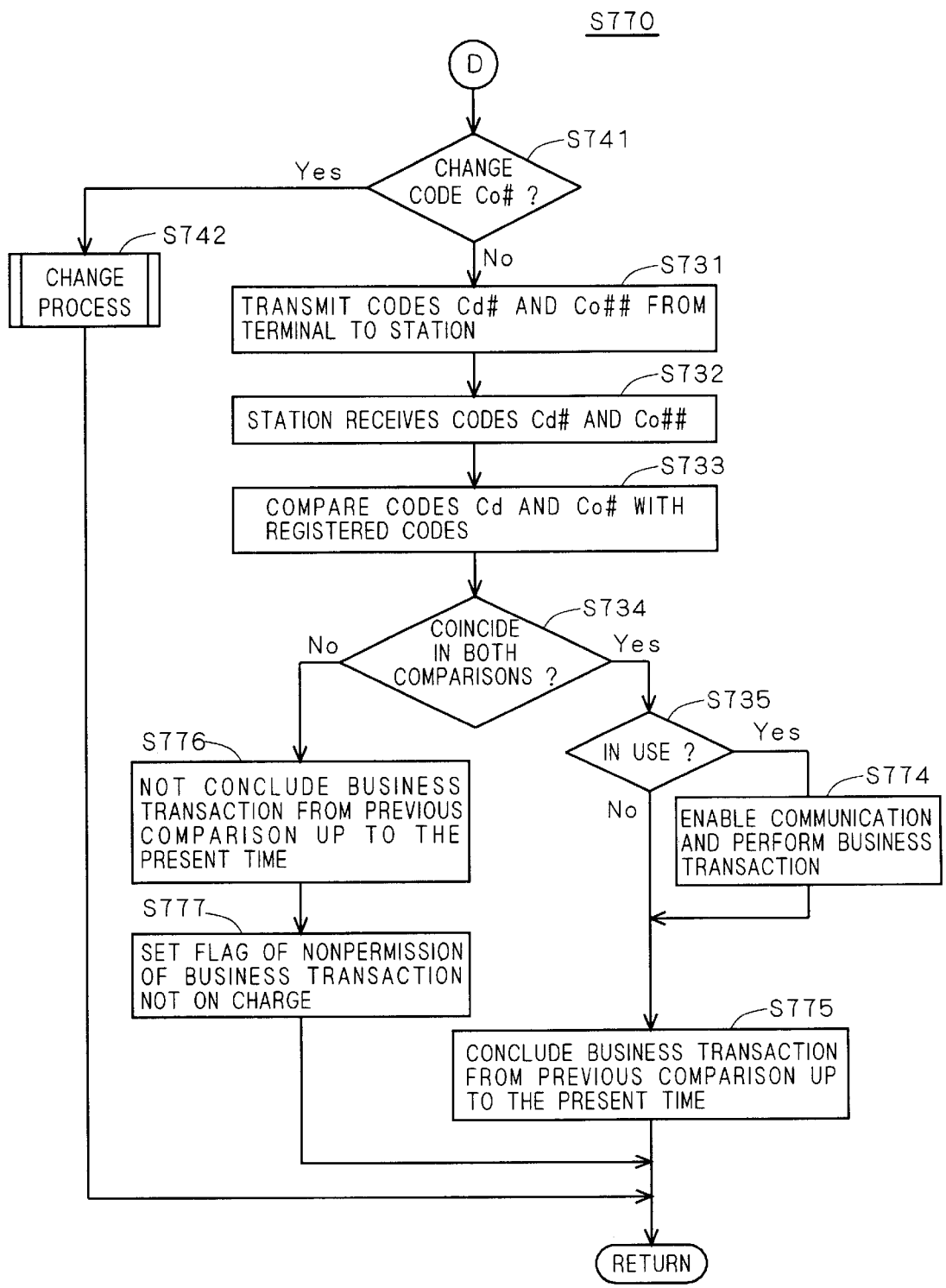

FIGS. 44 and 45 are flowcharts showing another internal flow of the communication process (S709) of FIG. 38. In the communication process (S770), the authentication is used for business transaction. Specifically, if the high-level authentication is performed on the basis of the judgment in the step S733, when the terminal device is used for communication (S735), the communication common carrier equipment 675 continues the communication process to permit the business transaction (S774) and further records the business transaction in the communication therebefore (from the previous authentication based on the judgment in the step S733 up to this communication) as concluded, regardless of whether the terminal device is used for communication (S775). On the other hand, if the high-level authentication is not performed on the basis of the judgment in the step S733, the communication common carrier equipment 675 records the business transaction in the communication therebefore as not concluded (S776).

With the record that the business transaction is concluded on the basis of the highly accurate authentication, a trading partner can perform various procedures, such as shipment of products, as the business transaction is valid on the basis of the record, and with the record that the business transaction is not concluded, the trading partner can stop the procedure for the business transaction. This makes it possible to resolve or reduce the loss through the illegal business transaction caused by the fraudulent use of the terminal device.

More preferably, if the high-level authentication is not performed on the basis of the judgment in the step S733, the communication common carrier equipment 675 makes a recording so as not to permit the business transaction not on charge (S777). The recording is made, for example, by setting a flag in a register of a computer system of the communication common carrier equipment 675.

If the terminal device is used not on charge, in other words, if the battery charger 673 is not attached to the main body portion 671 (S720), when the authentication is performed on the basis of the judgment of the step S723, it is judged whether the recording not to permit the business transaction not on charge is made or not (e.g., whether the above flag is on or off) (S771). Then, if the above recording is not made, the communication common carrier equipment 675 continues the communication process to permit the business transaction (S772) and if the recording is made, the communication common carrier equipment 675 stops the communication process (S773).

Since the highly-accurate judgment result made in the past is reflected on the normal authentication performed when the battery charger 673 is not attached to the main body portion 671, it is possible to perform an important procedure such as business transaction under the normal authentication. Further, the steps S772 to S773 and S774 to S777 shown in FIGS. 44 and 45 can be performed in the step S509 shown in FIGS. 35 and 36.

Figure 46:
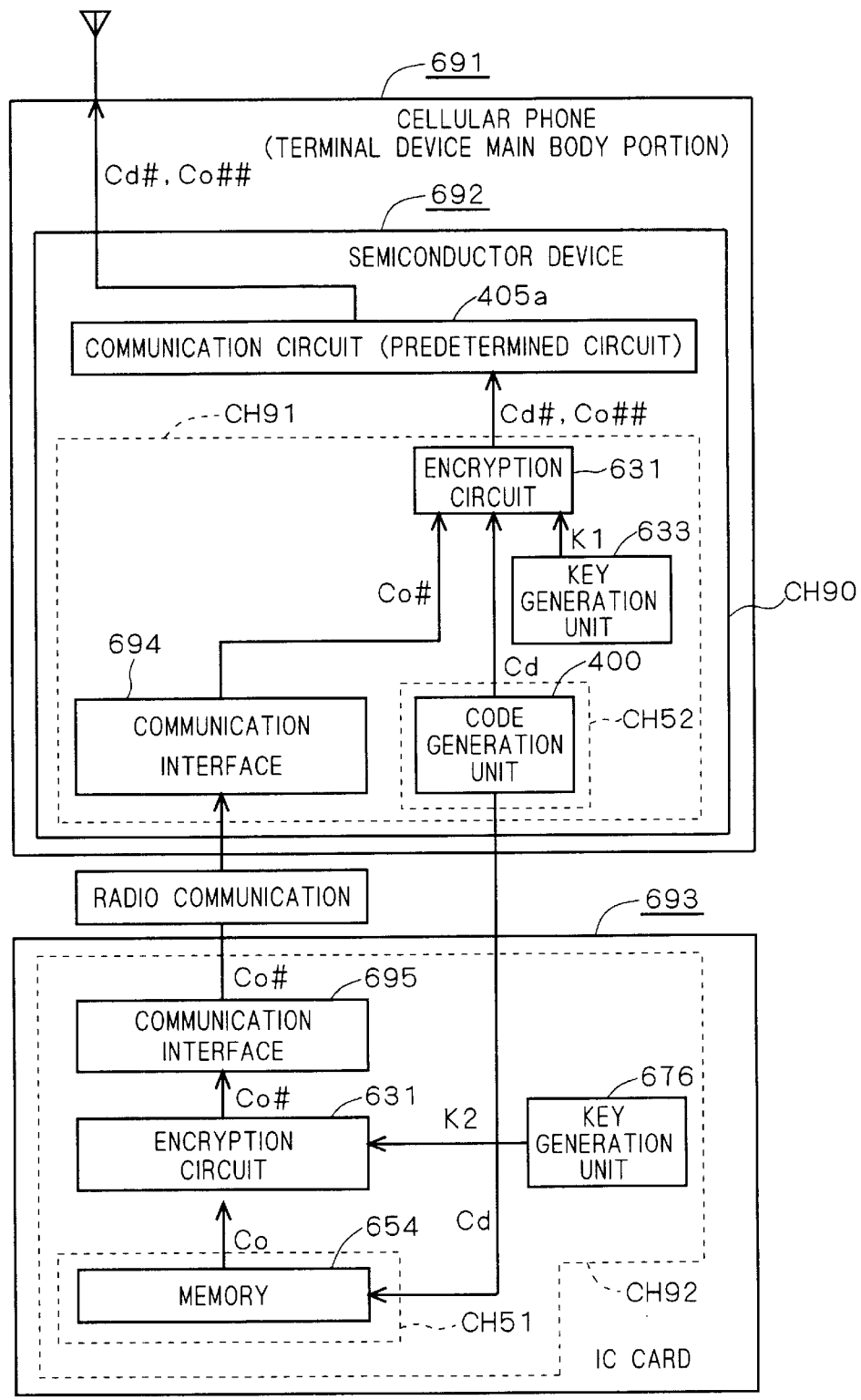
FIG. 46 is a block diagram showing another example of the terminal device in accordance with the ninth preferred embodiment of the present invention.

The battery charger 673 of FIG. 37 can be replaced with a portable IC card. In this case, a user sometimes needs to attach the IC card to the main body portion 671, but if the memory code Co# can be transmitted from the IC card to the main body portion 671 by wireless, it is possible to save the user's labor of attaching the IC card to the main body portion 671 on purpose, for user's convenience. FIG. 46 is a block diagram showing another constitution of the terminal device to achieve the above radio communication.

In the terminal device of FIG. 46, a communication interface 694 is provided in a semiconductor device 692 of a main body portion 691 and a communication interface 695 is provided in an IC card 693. The communication interface 694 is formed in a single semiconductor substrate CH90 (or CH91) together with the key generation unit 633, the encryption circuit 631 and the code generation unit 400, for example. Similarly, the communication interface 695 is formed in a single semiconductor substrate CH92 together with the key generation unit 676, the encryption circuit 631 and the memory 654, for example.

The communication interfaces 694 and 695 are interfaces for radio communication in conformity with Bluetooth Standard for example. Therefore, the memory code Co# is transmitted from the IC card 693 to the main body portion 691 with radio communication. For this reason, even when the IC card 693 is in a pocket of a user's jacket and the main body portion 691 is in a bag that the user carries, it is possible to transmit both the identification code Cd# and the memory code Co## to the communication common carrier equipment 675. Instead of the IC card 693, a card such as a UIM (Universal subscriber Identification Module) which is inserted in the main body portion as a cellular phone when it is used may be used. In this case, however, since a possibility of losing both the main body portion and the card at the same time should be considered, it is more preferable that the memory code Co# should be transmitted between the main body portion and a separately independent appliance as shown in FIG. 46.

Further, in the communication system 670, the communication common carrier equipment 675 may be replaced with an ATM system of a bank and other communication common carrier equipments, as shown in FIG. 12. For example, when a business transaction on the basis of the authentication is made, the ATM system of the bank which is a trading partner of the terminal device can directly perform procedures such as authentication, permission of business transaction and non-permission. The same applies to the communication system of other preferred embodiments.

[10. The Tenth Preferred Embodiment]

There has been a problem that the terminal device can not perform radio communication through the communication common carrier equipment in a region where radio wave has difficulty in entering, e.g., in an underground shopping area and a building. Or, to enable the radio communication in such a region, it is necessary to establish a lot of base stations. In the tenth preferred embodiment, discussion will be made on a terminal device and a communication method which enable the radio communication without any base station even in the region where the radio communication through the communication common carrier equipment can not be performed. In the terminal device of the communication method of this preferred embodiment, the encryption circuit, the decoder circuit and the key generation unit described in the fifth preferred embodiment are useful.

[10.1. Outline]

Figure 47:
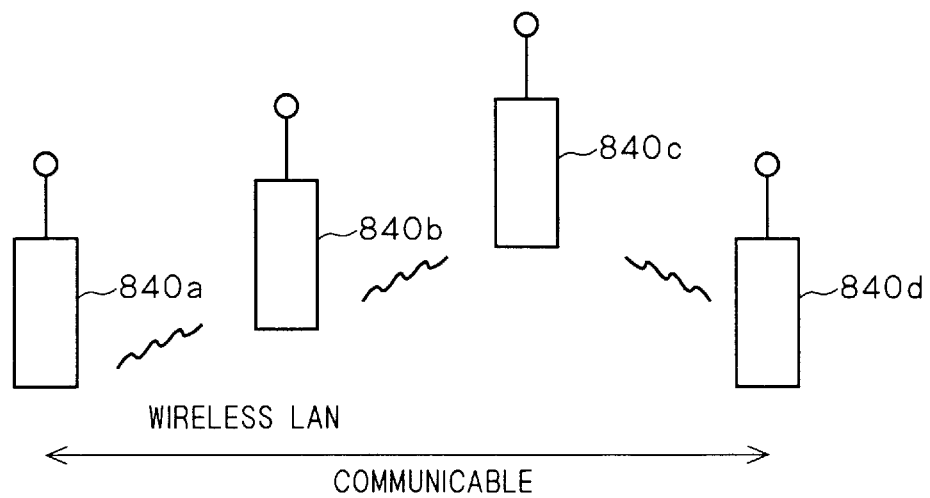
FIG. 47 is an explanatory diagram of a communication method in accordance with a tenth preferred embodiment of the present invention.

FIG. 47 is an explanatory diagram of a communication method in accordance with the tenth preferred embodiment of the present invention. In this method, a terminal device is used which is capable of forming both a radio communication through a communication common carrier equipment and a radio communication network without the communication common carrier equipment. In an example discussed below, a wireless LAN is used as the radio communication network. Even in the region where radio wave has difficulty in entering, people in crowds ordinarily assemble or pass by. Today, most of such people carry cellular phones. If the cellular phones that the people carry are terminal devices having the above function, as shown in FIG. 47, the wireless LAN is formed among a plurality of terminal devices 840a to 840d, to enable mutual communication. For example, the terminal devices 840a and the 840d use the terminal devices 840b and 840c as relays, to enable mutual communication.

As the wireless LAN, one in conformity with Bluetooth Standard may be used for example. In this case, one terminal device can perform communication by wireless with one other terminal device within a range of ten-meter radius around itself. In an underground shopping area or a building, a lot of passengers, workers and the like ordinarily exist within a range of a ten-meter radius, and through the terminal devices that the people carry, communication entirely covering the underground shopping area or the building can be achieved.

Using the wireless LAN advantageously makes the operation possible with small power. For example, the power consumption of the wireless LAN covering the range of a ten-meter radius, which is needed to throw the radio wave, is $(1/100)^2$ of that of the radio communication covering the range of a one-kilometer radius. If one thousand terminal devices which are aligned at one-meter intervals on the average relay the communication in order to establish communication between the terminal devices which located one-kilometer apart, the whole power consumption is reduced to $(1/100)^2 \times 1000 = 1/10$ of that of the above radio communication.

Further, not only in the region where the radio wave has difficulty in entering, such as an underground shopping area or a building, but also in a space where people in crowds generally assemble, pass by or live, the communication through other terminal devices can be achieved by forming the wireless LAN. Even when the space includes the region where the radio wave has difficulty in entering, such as an underground shopping area or a building, the communication through other terminal devices is not blocked. Furthermore, when the terminal devices in houses use the wireless LAN as a relay, architecture of a radio communication system with low power consumption which needs almost no base station can be achieved in residential blocks on the ground.

[10.2. Example of Terminal Device]

Figure 48:
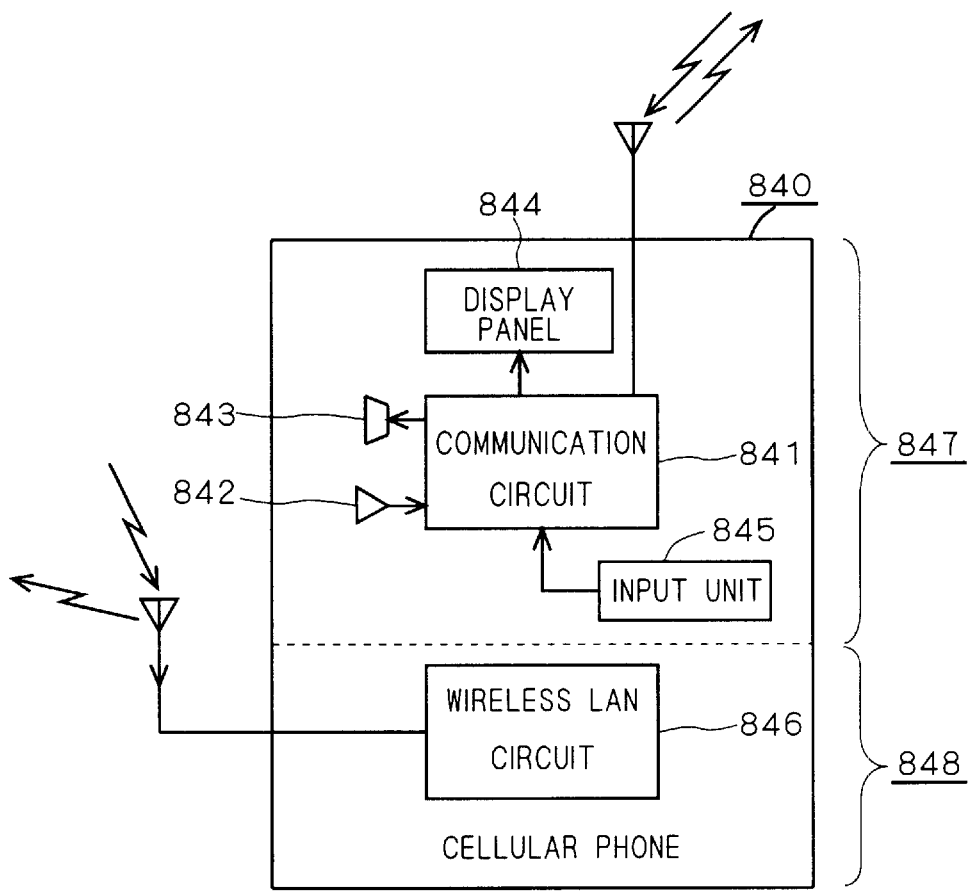
FIG. 48 is a block diagram showing a terminal device in accordance with the tenth preferred embodiment of the present invention.

In the communication through the wireless LAN shown in FIG. 47, it is necessary to ensure the security against leakage of communication content since the communication is performed through the terminal devices that an unspecified number of persons carry. To ensure the security, a terminal device 840 has only to have a constitution in which a portion for radio communication through a communication common carrier equipment (temporarily referred to as a long-distance communication unit) 847 and a portion for communication through the wireless LAN (temporarily referred to as a short-distance communication unit) 848 are electrically separated, as shown in FIG. 48.

The long-distance communication unit 847 comprises a communication circuit 841 for performing radio communication through the communication common carrier equipment, a microphone 842 for inputting a voice, a speaker 843 for outputting the voice, an input unit 845 for inputting dial numbers and the like through key operation and the like and a display panel 844 for displaying information with characters, signs, graphics and the like. The short-distance communication unit 848 comprises a wireless LAN circuit 846 for forming a wireless LAN to perform radio communication. Since the long-distance communication unit 847 and the short-distance communication unit 848 are separated from each other in a terminal device 840 of FIG. 48, a user carrying the terminal device 840 can not perform the communication through the wireless LAN, but only relays other's communication.

Figure 49:
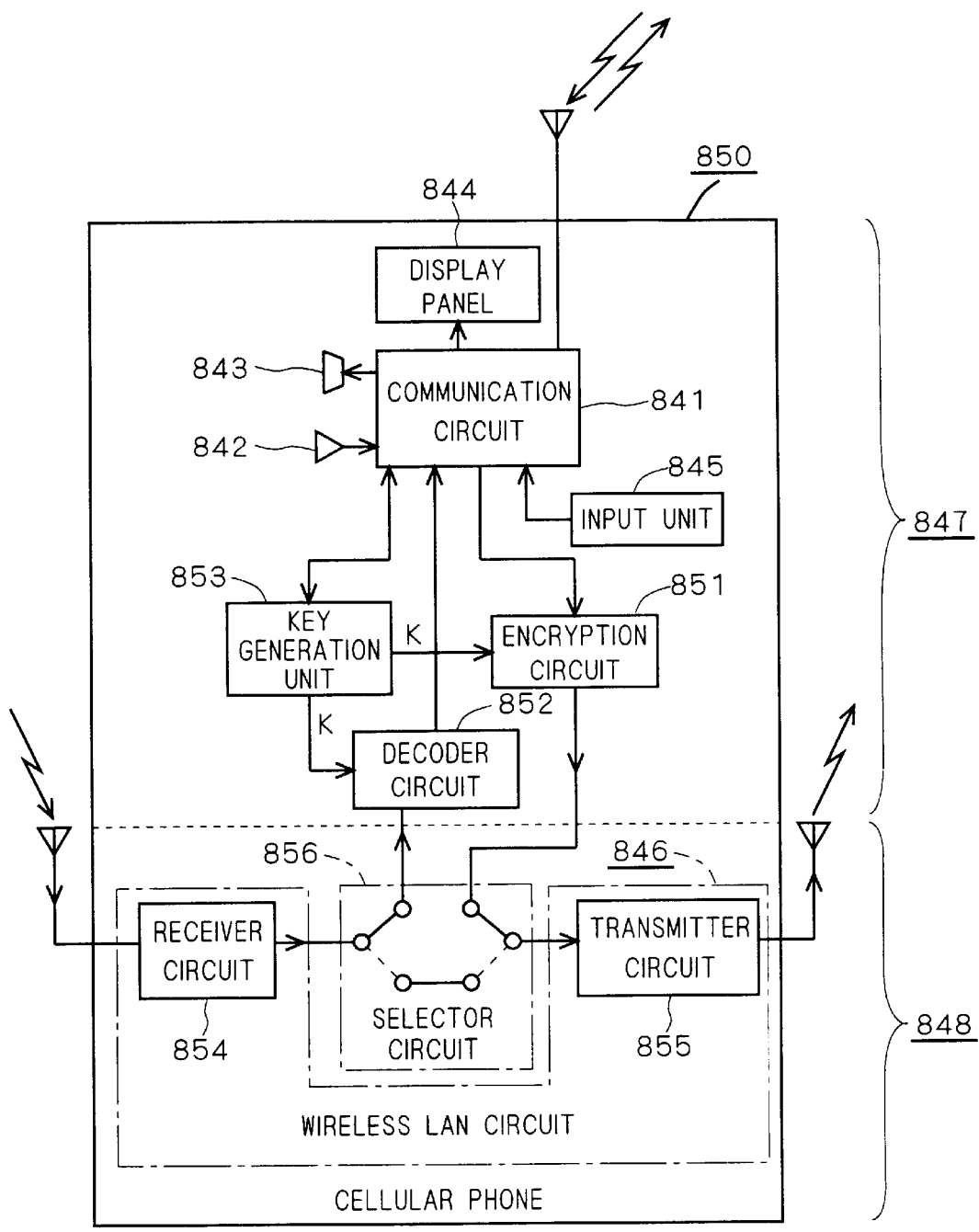
FIG. 49 is a block diagram showing another example of the terminal device in accordance with the tenth preferred embodiment of the present invention.

To enable the user carrying the terminal device to perform the communication through the wireless LAN and ensure security against leakage of communication content, an encryption technique can be used as shown in FIG. 49. Even when the radio communication through the communication common carrier equipment uses an encryption technique, the radio communication through the wireless LAN uses its own encryption technique different therefrom.

Between the wireless LAN circuit 846 and the communication circuit 841, a transmission path of the communication signal is provided and a selector circuit 856, an encryption circuit 851 and a decoder circuit 852 are inserted in this transmission path. The selector circuit 856 selectively connect and disconnect the above transmission path. When the selector circuit 856 connects the above transmission path, the communication through the wireless LAN is established between the user of a terminal device 850 and one other person. When the selector circuit 856 disconnects the above transmission path, the terminal device 850 only relays other persons' communication through the wireless LAN. Further, though antennas are separated into one for transmission and the other for reception in FIG. 49, for convenience of illustration, a single antenna is usually shared.

The encryption circuit 851, the decoder circuit 852 and the key generation unit 853 perform their own functions to establish communication through the wireless LAN between the user of the terminal device 850 and one other person when the selector circuit 856 connects the above transmission path. The key generation unit 853 generates the key K for encryption. The encryption circuit 851 encrypts a transmitting signal transmitted from the communication circuit 841 to a transmitter circuit 855 of the wireless LAN circuit 846 on the basis of the key K. The decoder circuit 852 decodes a receiving signal transmitted from a receiver circuit 854 of the wireless LAN circuit 846 to the communication circuit 841 on the basis of the key K.

In this case, the key K has to be a key shared with the partner of the communication that the terminal device performs through the wireless LAN. For this reason, the key generation unit 853 has an internal constitution shown in FIG. 50. Specifically, the key generation unit 853 comprises the code generation unit 633 and a key calculation unit 857. The code generation unit 633 generates an identification code inherent in the terminal device 850. The key calculation unit 857 calculates a shared key which is shared between the user of the terminal device 850 and the communication partner on the basis of another code transmitted from the communication partner through the wireless LAN circuit 846 and outputs the shared key as the key K.

Figure 50:
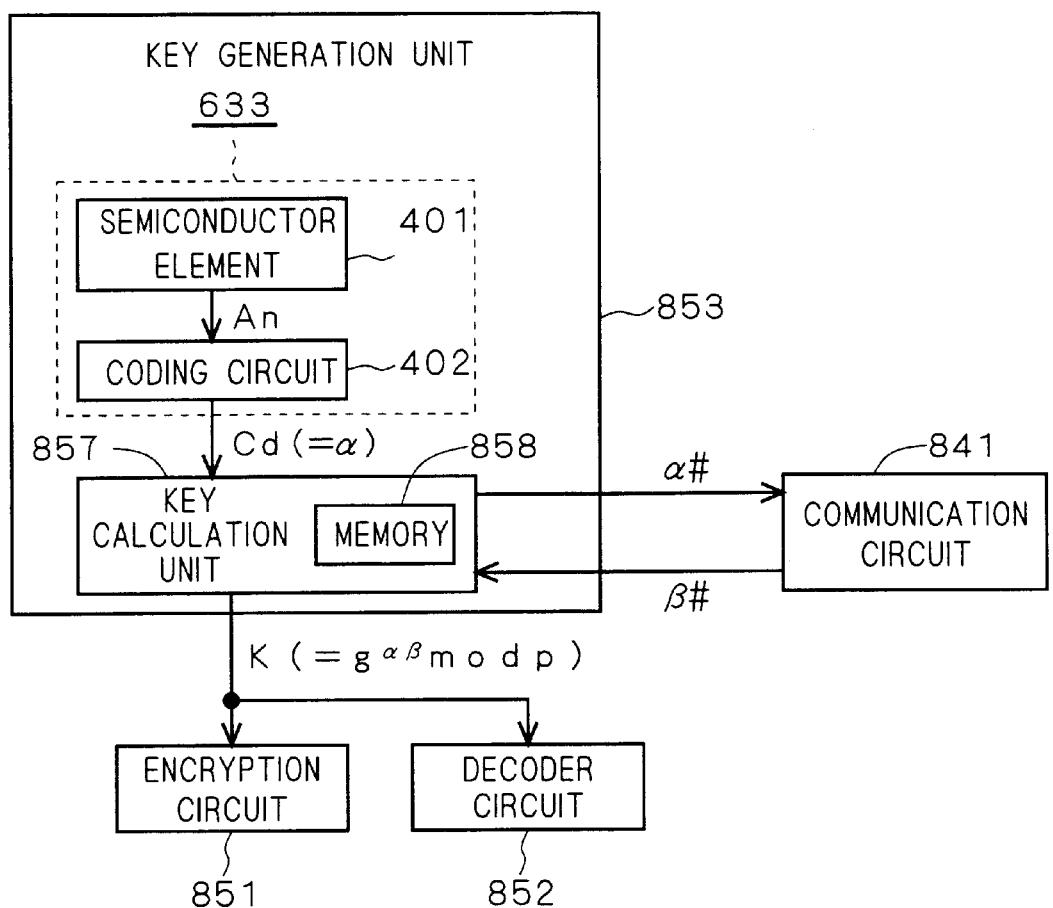
FIG. 50 is a block diagram showing a key generation unit f FIG. 49.

It is desirable that the code generation unit 633 should have the constitution of FIG. 25 or 26 in the fifth preferred embodiment. This produces the same effect as that of the fifth preferred embodiment. FIG. 50 illustrates an example where the code generation unit 633 has the constitution of FIG. 26.

[10.3. Procedure of Key Generation]

Figure 51:
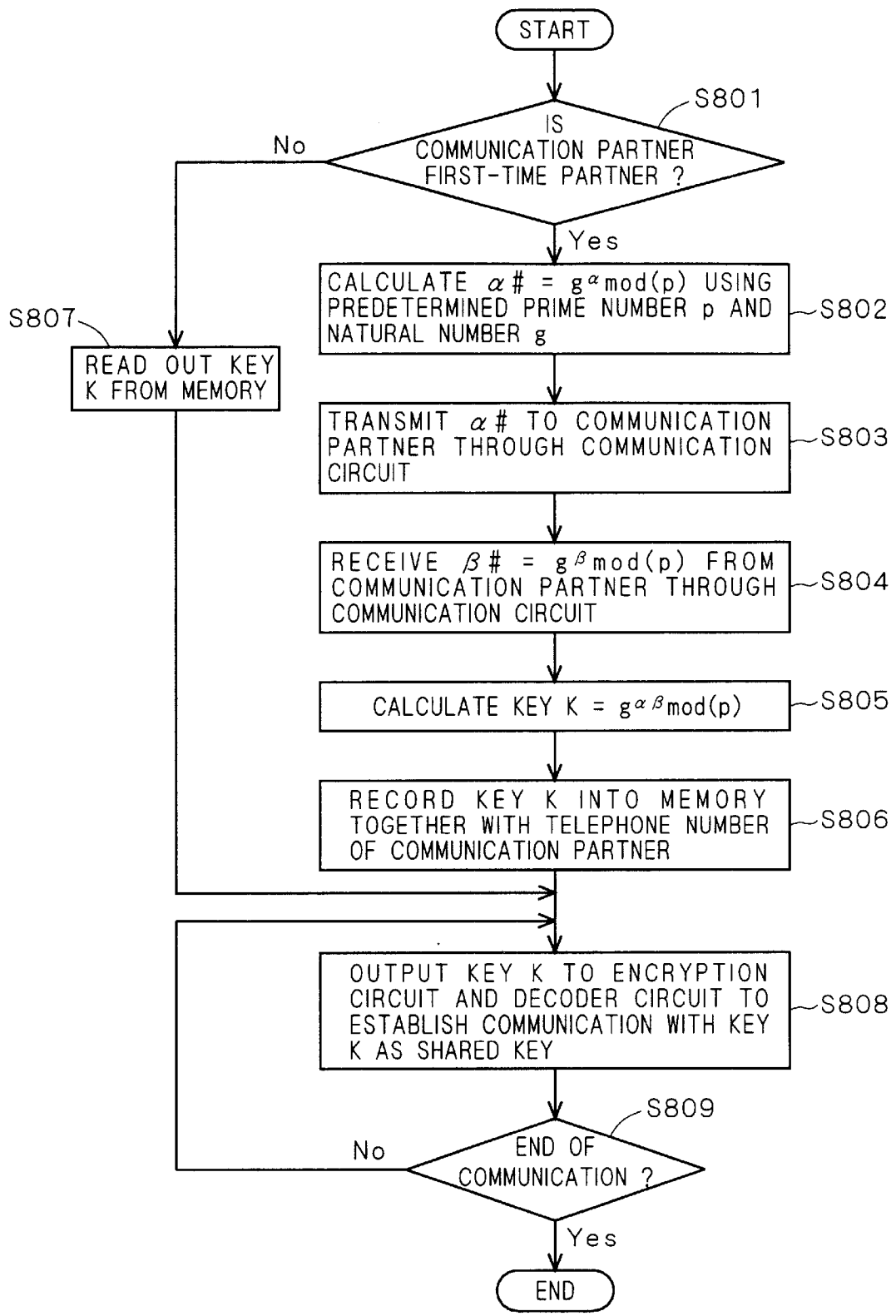
FIG. 51 is a flowchart of key generation by the terminal device of FIG. 49.

FIG. 51 is a flowchart showing an exemplary procedure for generating the key K by the key generation unit 853. The procedure of FIG. 51 uses the well-known DH method. When the communication through the wireless LAN is started between the terminal device 850 and one other terminal device, it is judged whether the other terminal device, i.e., the communication partner is a first-time partner or not (S801). When the communication partner is first-time one, a code $\alpha\#=g^\alpha \mod(p)$ is calculated by the key generation unit 857 on the basis of a predetermined prime number p and a predetermined natural number g (S802). In this case, $\alpha$ represents the identification code Cd generated by the code generation unit 633, mod( ) represents a mode in theory of numbers, and the prime number p and the natural number g are common among all the terminal devices, which correspond to public keys.

Subsequently, the calculated code $\alpha\#$ is transmitted through the communication circuit 841 and the transmitter circuit 855 to the communication partner (S803). Then, a code $\beta\#=g^\beta \mod(p)$ is received by the receiver circuit 854 and transmitted through the communication circuit 841 to the key calculation unit 857 (S804). The key calculation unit 857 calculates the key $K=g^{\alpha\beta} \mod(p)$ (S805). After that, the key calculation unit 857 records the calculated key K into a memory 858 together with an identification number (e.g., telephone number) of the communication partner (S806).

Next, the key calculation unit 857 supplies the encryption circuit 851 and the decoder circuit 852 with the key K to establish a cipher communication with the key K used as a shared key (S808). The process of the step S808 continues until the communication is ended (S809). In the step S801, when it is judged that the communication partner is not first-time one, the key calculation unit 857 does not calculate the key K but reads out the key K from the memory 858 (S807), and then the processes of the steps S808 and S809 are performed. The judgment in the step S801 can be made on the basis of whether the record is found in the memory 858 or not.

Thus, since the cipher communication is performed on the basis of the shared key generated by exchanging the identification codes with the communication partner, the communication can be established with any communication partner while preventing leakage of communication content. Further, in the procedure of FIG. 51, there may be another example where the steps S801 and S807 are omitted and the key K is calculated every time when the communication is performed.

[10.4. Another Example of Terminal Device]

FIG. 52 is a block diagram showing another constitution of the terminal device in accordance with the tenth preferred embodiment of the present invention. In this terminal device 860, a receiving signal received by a communication circuit 861 is amplified by a low noise amplifier 862 and demodulated by a mixer 863 coupled to a VCO (voltage controlled oscillator) 864 and then processed by a baseband circuit 878. Further, a transmitting signal processed by the baseband circuit 878 is modulated by a mixer 865 coupled to a VCO 866 and amplified by a power amplifier 867, and then transmitted to the communication common carrier equipment.

On the other hand, a receiving signal received by a wireless LAN 871 is amplified by a low noise amplifier 872 and demodulated by a mixer 873 coupled to a VCO 874, going through a selector circuit 870, and then modulated by a mixer 868 coupled to a VCO 869, The modulated receiving signal goes through the mixer 863 in the communication circuit 861 and then inputted to the baseband circuit 878. The receiving signal of the wireless LAN which is inputted to the baseband circuit 878 is demodulated by the decoder circuit 852. A transmitting signal of the wireless LAN goes through the baseband circuit 878, the encryption circuit 851 and the selector circuit 870 and then inputted to a baseband circuit 879. After that, the transmitting signal is modulated by a mixer 875 coupled to a VCO 766 and amplified by a power amplifier 877, and then transmitted.

Figure 53:
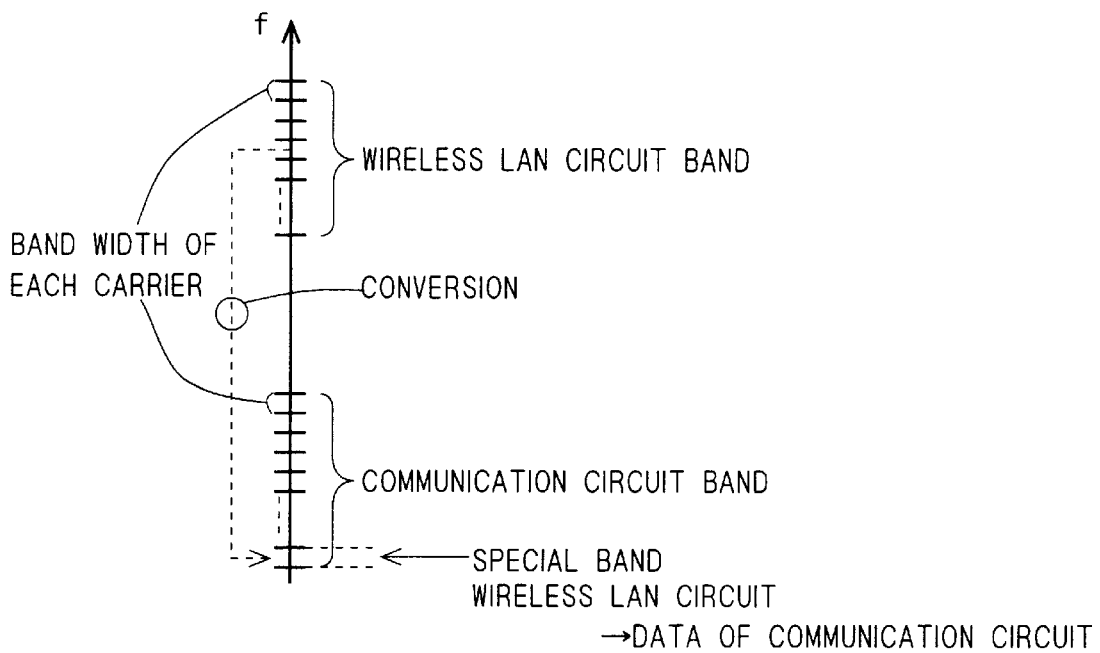
FIG. 53 is an illustration for explaining an operation of the terminal device of FIG. 52.

Thus, in the terminal device 860 of FIG. 52, the receiving signal inputted to the wireless LAN circuit 871 is demodulated, and thereafter modulated and inputted to the communication circuit 861. As shown in FIG. 53, the mixer 853 modulates the demodulated receiving signal of the wireless LAN with a carrier wave having a frequency f within a specified range (represented as "special band" in FIG. 53) in a communication circuit band. Therefore, in whichever range of a wireless LAN band the frequency f of the receiving signal of the wireless LAN exist, a modulated wave whose frequency f exists within the special band is inputted to the communication circuit 861.

Figure 54:
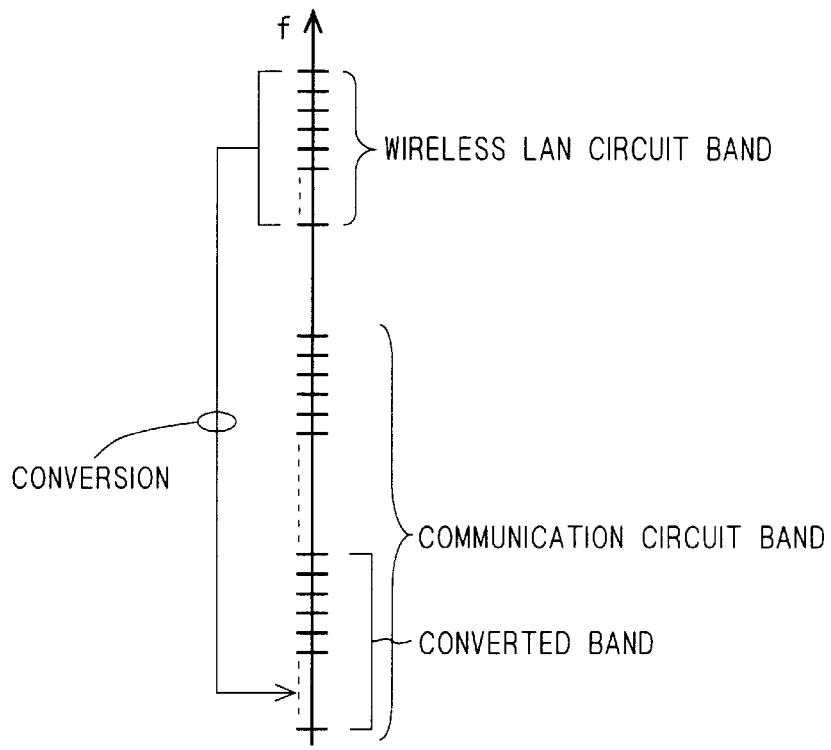
FIG. 54 is an illustration for explaining an operation compared with that of FIG. 53.

Supposing the receiving signal of the wireless LAN is not demodulated but inputted to the communication circuit 861 only with its frequency converted, it becomes necessary to ensure a wider communication circuit band as shown in FIG. 54. In contrast to this, in the terminal device 860 of FIG. 52, it is not necessary to ensure a wide communication circuit band and therefore the utilization ratio of the frequency band of the communication circuit 861 can be advantageously improved.

Figure 55:
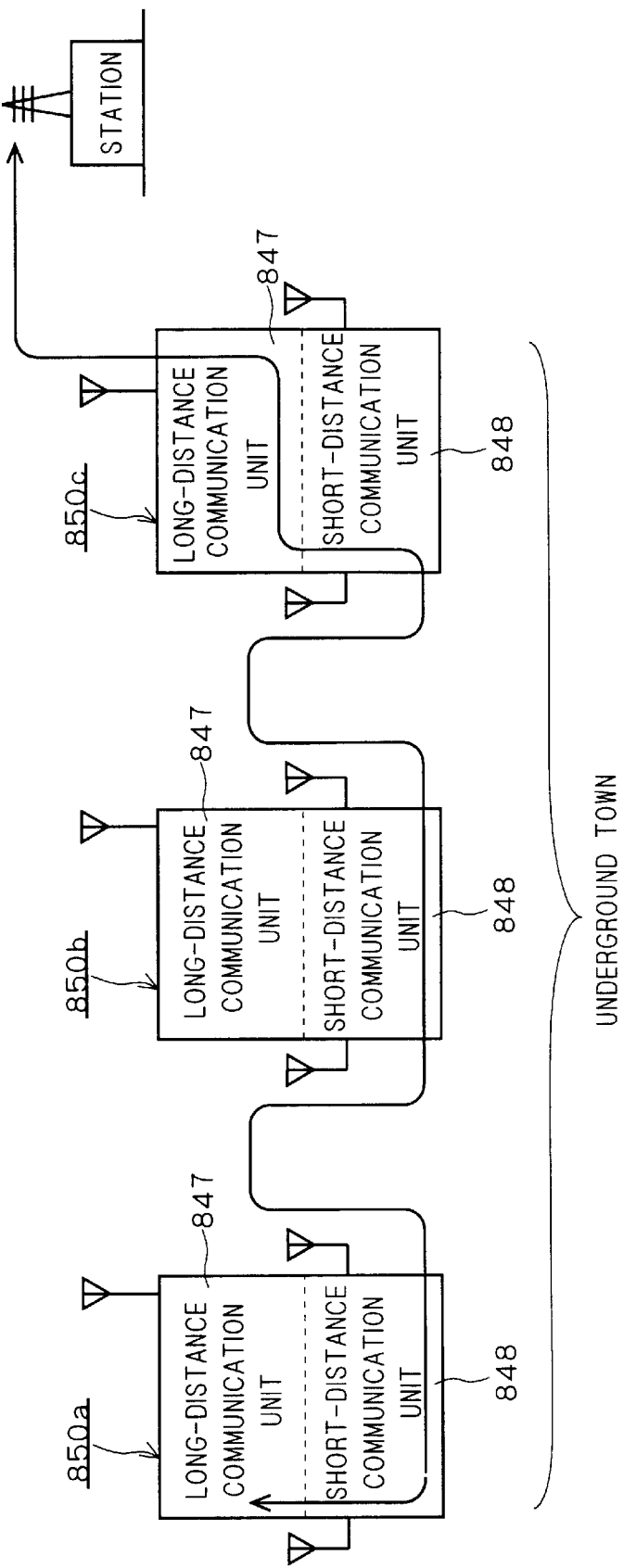
FIG. 55 is an explanatory diagram of another example of the communication method in accordance with the tenth preferred embodiment of the present invention.

In the terminal device where the communication circuit and the wireless LAN circuit are selectively combined as illustrated in FIG. 49 or 52, it becomes possible to combine the communication path through the communication common carrier equipment and the wireless LAN as shown in FIG. 55. Specifically, through the communication circuit in the long-distance communication unit 847 of the terminal device 850c which is one of a plurality of terminal devices 850a to 850c forming a wireless LAN, another terminal device 850a can perform communication through the communication common carrier equipment. Thus, it is also possible for a terminal device in an underground shopping area where radio wave has difficulty in entering to perform communication through the communication common carrier equipment. To reduce the load of the terminal device combining the communication path through the communication common carrier equipment and the wireless LAN (the terminal device 850c in the example of FIG. 55), such a communication should be permitted only for emergency communication.

Further, it is possible to limit all the communication through the wireless LAN to an emergency communication. This reduces the load of the terminal devices which relay the communication through the wireless LAN (the terminal devices 840b and 840c in the example of FIG. 47). Since the importance of security against leakage of communication content is low in the emergency communication, it is possible to remove the circuits for encryption. The emergency communication refers to communication for requesting aid, for example, at the time when an emergency which endangers life and property occurs.

[11. The Eleventh Preferred Embodiment]

Even in the region where, it is supposed, people in crowds ordinarily concentrate, such as an underground shopping area and building, the population density becomes low depending time, e.g., at night. In the eleventh preferred embodiment, discussion will be made on a method for enabling the communication through the wireless LAN even when the population density in the crowds is low.

Figure 56:
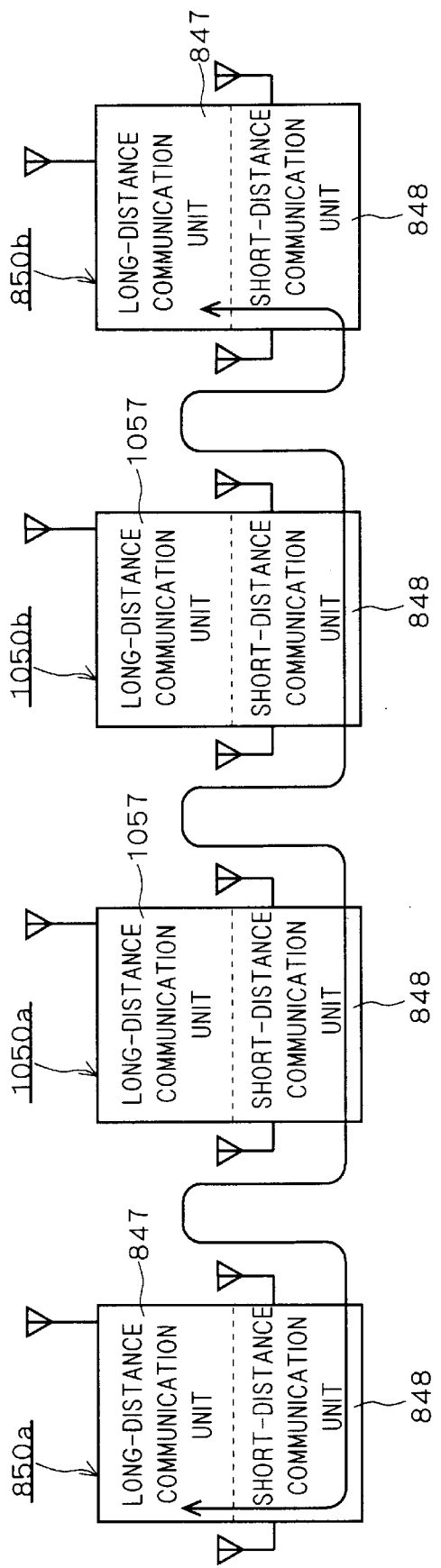
FIG. 56 is an explanatory diagram of a communication method in accordance with an eleventh preferred embodiment of the present invention.

FIG. 56 is an explanatory diagram of a communication method in accordance with the eleventh preferred embodiment of the present invention. In this communication method, terminal devices 1050a and 1050b for enabling formation of the wireless LAN are installed in the region where radio wave has difficulty in entering, such as an underground shopping area. The terminal devices 1050a and 1050b are preferably public telephones, and installed, e.g., near entrances of shops in the underground shopping area. In this case, the terminal devices 1050a and 1050b each comprise a long-distance communication unit 1057 for performing an original function of the public telephone as well as the short-distance communication unit 848. Even when the population density of the crowd is low, the terminal devices 850a and 850b can use the short-distance communication units 848 of the terminal devices 1050a and 1050b as relays to establish the communication through the wireless LAN.

[12. The Twelfth Preferred Embodiment]

In the twelfth preferred embodiment, discussion will be made on more desirable examples of the semiconductor element 401, the coding circuit 402 and the comparator circuit 403 discussed in the above preferred embodiments.

[12.1. Example of Semiconductor Device]

FIG. 57 is a circuit diagram showing a preferable example of the semiconductor element 401. This semiconductor element 401a comprises a plurality of TFTs 101(4×4=16 TFTs 101 in the example of FIG. 57) arranged in matrix on a semiconductor substrate. On the semiconductor substrate, a plurality of word lines WL1 to WL4 and a plurality of bit lines BL1 to BL4 are further arranged in horizontal and vertical directions, respectively.

Respective gate electrodes of four TFTs 101 which are horizontally arranged are connected in common to each of the word lines WL1 to WL4. On the other hand, respective drain electrodes of four TFTs 101 which are vertically arranged are connected in common to each of the bit lines BL1 to BL4. Respective source electrodes of sixteen TFTs 101 are connected in common to a positive power supply line. Further, one end of each of the bit lines BL1 to BL4 is connected to a ground power supply line through a bit-line load 17.

A wire 18 for taking out the analog signal An is connected to one end of the bit-line load 17 opposite to the ground line. Further, a pad 15 is connected to the other end of each of the bit lines BL1 to BL4, and a pad 16 is connected to one end of each of the word lines WL1 to WL4.

Since the semiconductor element 401a has the above constitution, when a gate voltage of predetermined level is applied to one of the word lines WL1 to WL4, drain currents Id1 to Id4 flow in the four TFTs 101 connected to the word line, respectively. Since the drain currents Id1 to Id4 flow in the bit-line loads 17, potentials in proportion to the drain currents Id1 to Id4 are developed at the wires 18 connected to the bit lines BL1 to BL4. The four potentials are outputted to the outside as the analog signals An. By sequentially applying the gate voltage to the word lines WL1 to WL4, sixteen potentials in total can be taken out as the analog signals AN.

The sixteen analog signals An are coded by the coding circuit 402, being converted into a 16-bit digital signal, e.g., as shown in FIG. 58. In FIG. 58, the 16-bit code is arranged in matrix so that the relation between the TFTs 101 on which the code is based and the bit lines BL1 to BL4 and the word lines WL1 to WL4 which are connected thereto can be understood.

[12.2. Example of Coding Circuit and Comparator Circuit]

Figure 59:
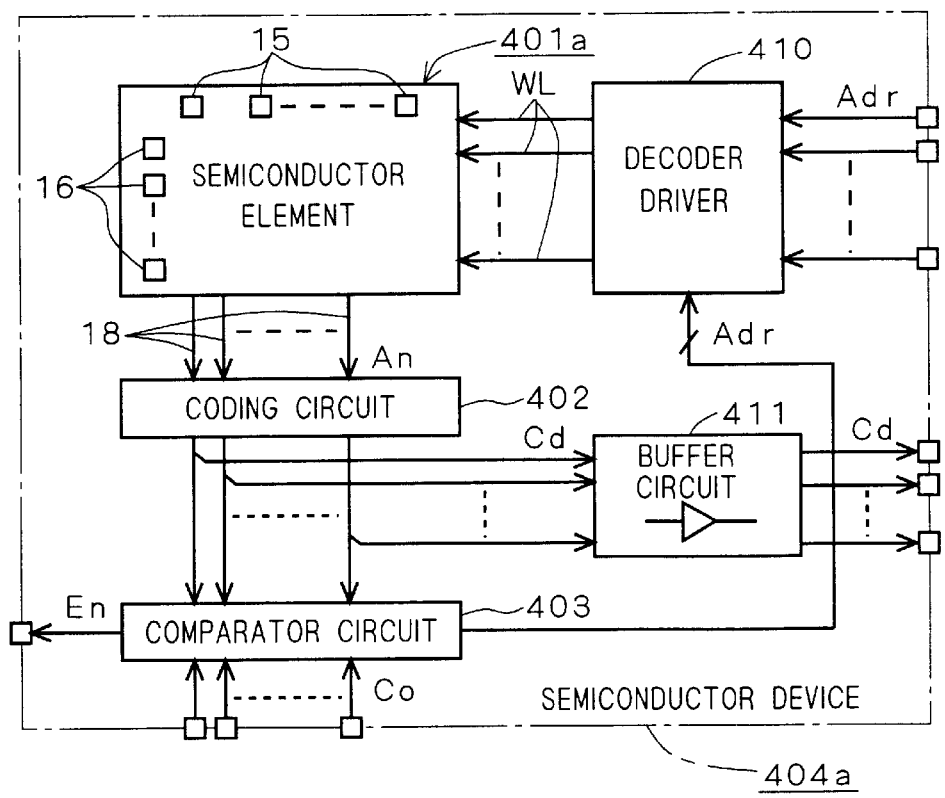
FIG. 59 is a block diagram showing a semiconductor device in accordance with the twelfth preferred embodiment of the present invention.

FIG. 59 is a block diagram showing a preferable constitution of a semiconductor device using the semiconductor substrate CH3 (or CH1) of FIG. 1. This semiconductor device 404a comprises the semiconductor element 401a shown in FIG. 57. The semiconductor device 404a comprises a decoder driver 410 for driving any one of the plurality of word lines WL1 to WL4 in the semiconductor element 401a on the basis of an address signal Adr. The address signal Adr can be inputted from the outside through input terminals.

A code Cd outputted by the coding circuit 402 is not only inputted to the comparator circuit 403 but also outputted to the outside through a buffer circuit 411. This allows limited persons to know the identification code Cd in advance. Since the buffer circuit 411 is provided, it is possible to prevent a fraud of inputting a code different from the identification code Cd outputted from the coding circuit 402 from the outside through output terminals for the identification code Cd to the comparator circuit 403.

Since the semiconductor element 401a comprises the pads 15 and 16, it is possible to directly read out the analog signals An by applying a probe to the pads 15 and 16 in the manufacturing process of the semiconductor device 404a. The read-out analog signal An can be converted into the identification code Cd by using a device having the same characteristic feature as the coding circuit 402, and the identification code Cd can also be thereby obtained. Therefore, when the identification code Cd does not need to be read out in a place other than a manufacturing plant for the semiconductor device 404a, the input terminal for the address signal Adr, the output terminals for the identification code Cd and the buffer circuit 411 may be removed.

The comparator circuit 403 inputs the address signal Adr to the decoder driver 410 when it compares the memory code Co inputted through input terminals with the identification code Cd. Since the semiconductor device 404a is thereby driven to read out the analog signal An, it is possible to compare the identification code Cd with the memory code Co without inputting the address signal Adr from the outside.

Figure 60:
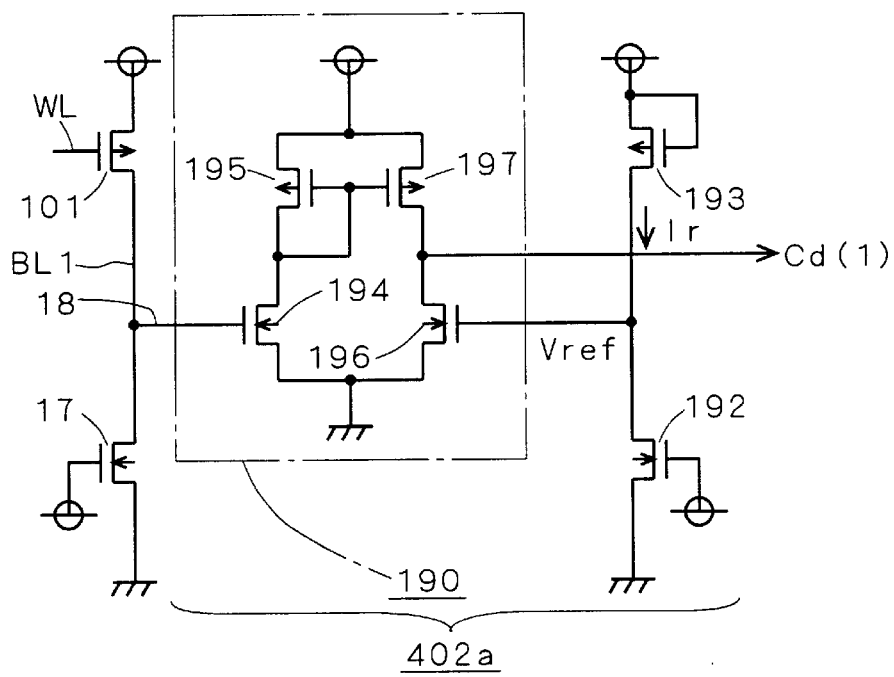
FIG. 60 is a circuit diagram showing part of the coding circuit of FIG. 59.

FIG. 60 is a circuit diagram of a preferable example of the coding circuit 402, showing a circuit portion connected to the bit line BL1 as a representative. The same circuit portion as shown in FIG. 60 are also connected to the other bit lines BL2 to BL4. The coding circuit 402a comprises a sense amplifier 190. The sense amplifier 190 compares the potential at the wire 18 with a reference potential Vref generated by transistors 192 and 193 to generate a signal of high level or low level and outputs the signal as one bit of the identification code Cd (e.g., an identification code Cd(1) corresponding to the bit line BL1).

In the sense amplifier 190, a series circuit consisting of an NMOS transistor 194 and a PMOS transistor 195 and a series circuit consisting of an NMOS transistor 196 and a PMOS transistor 197 are interposed between the positive power supply line and the ground power supply line. A gate electrode and a drain electrode of the PMOS transistor 195 and a gate electrode of the PMOS transistor 197 are connected to each other, to constitute a current mirror circuit.

The drain current flowing in the TFT 101 has a low value within a range from about 1 pA ($10^{-2}$ A) to about 1 µA.

Therefore, it is desirable to set the drain current to about 1 nA ($10^{-9}$ A) by using an NMOS transistor as the bit-line load 17 and applying a constant potential to its gate electrode. That enhances the sensitivity of the sense amplifier 190. It is desirable to set a gate potential to the ground potential in order to set the drain current to about 1 nA.

A series circuit consisting of the NMOS transistor 192 and the PMOS transistor 193 is interposed between the ground power supply line and the positive power supply line and the reference potential Vref is taken out from nodes of the two transistors. Constant potentials, such as the potential of the ground power supply line and the potential of the positive power supply line, are supplied to gate electrodes of the NMOS transistor 192 and the PMOS transistor 193, respectively. Comparison of the potential of the wire 18 with the reference potential Vref is equivalent to comparison of the drain current of the TFT 101 with a reference current Ir (or its constant-numberfold) flowing in the series circuit of the NMOS transistor 192 and the PMOS transistor 193.

For secure comparison, it is desirable that the transistors other than the TFT 101 of FIG. 60 should be bulk-type transistors. If the transistors other than the TFT 101 are polycrystalline TFTs like the TFT 101, it is desirable that the gate length and the gate width of the transistors should be set larger than those of the TFT 101 in order to secure the stability of the magnitude of the drain current therein.

[12.3. Another Example of Semiconductor Device]

The semiconductor element 401 may comprise a polycrystalline resistive element or a polycrystalline capacitive element, for example, instead of the polycrystalline TFT 101. Such an example will be discussed below.

Figure 61:
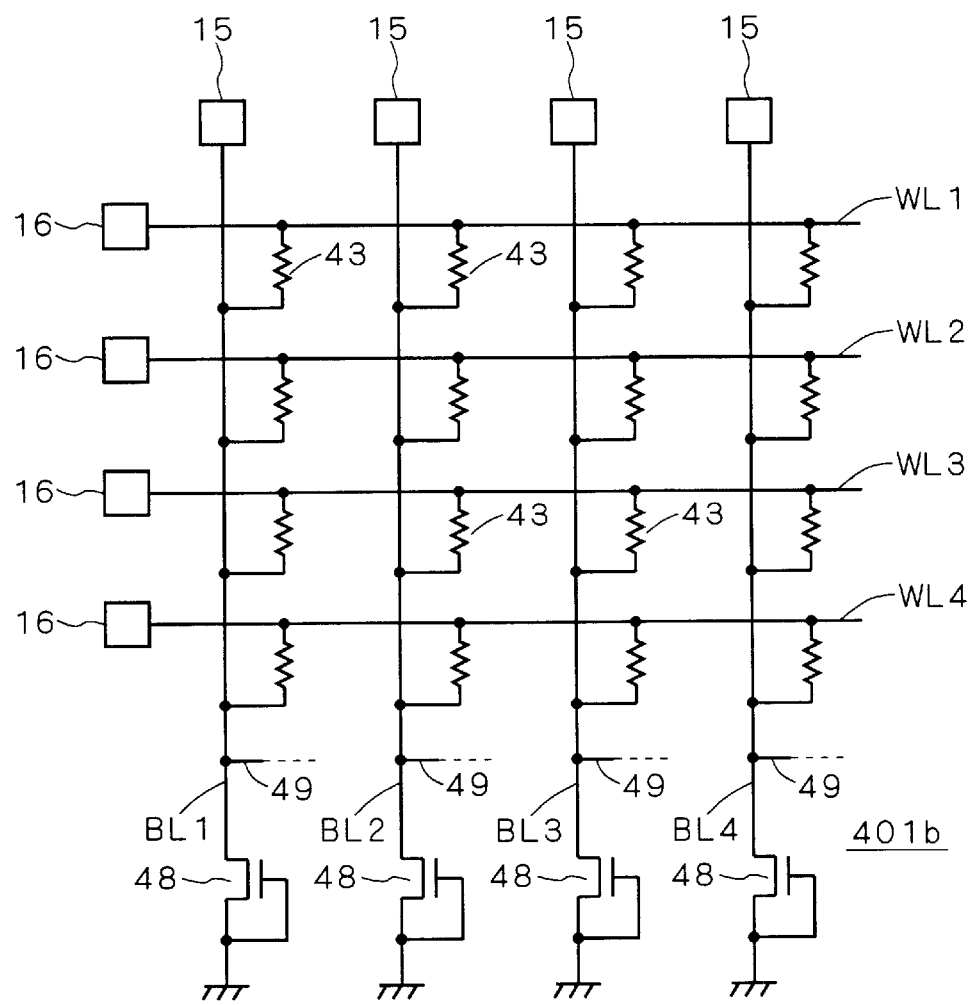
FIG. 61 is a circuit diagram showing another example of the semiconductor element in accordance with the twelfth preferred embodiment of the present invention.

FIG. 61 is a circuit diagram showing another example of the semiconductor element 401 comprising the polycrystalline resistive element. This semiconductor element 401b comprises a plurality of resistive elements 43 (4×4=16 resistive elements 43 in the example of FIG. 61) arranged in matrix on a semiconductor substrate. The resistive element 43 has a resistive substance made of polycrystalline semiconductor such as polycrystalline silicon. Therefore, the resistance value randomly varies in the resistive element 43.

On the semiconductor substrate, a plurality of word lines WL1 to WL4 and a plurality of bit lines BL1 to BL4 are further arranged horizontal and vertical directions, respectively.

Respective one ends of four resistive elements 43 which are horizontally arranged are connected in common to each of the word lines WL1 to WL4. On the other hand, respective other ends of four resistive elements 43 which are vertically arranged are connected in common to each of the bit lines BL1 to BL4. Further, one end of each of the bit lines BL1 to BL4 is connected to the ground power supply line through an NMOS transistor 48 as a bit-line load.

A wire 49 for taking out the analog signal An is connected to a drain electrode of the NMOS transistor 48. Further, the pad 15 is connected to the other end of each of the bit lines BL1 to BL4, and the pad 16 is connected to one end of each of the word lines WL1 to WL4.

Since the semiconductor element 401b has the above constitution, when a gate voltage of predetermined level is applied to one of the word lines WL1 to WL4, currents flow in the four resistive elements 43 connected to the word line. Since the currents flow in the NMOS transistor 48, potentials in proportion to the currents flowing the resistive elements 43 are developed at the wires 49 connected to the bit lines BL1 to BL4. The four potentials are outputted to the outside as the analog signals An. By sequentially applying the predetermined potentials to the word lines WL1 to WL4, sixteen potentials in total can be taken out as the analog signals AN. The analog signals An can be obtained as random values corresponding to varied resistances of the resistive elements 43.

Since the semiconductor element 401b comprises the pads 15 and 16, it is possible to read out the analog signals An by using the probe in the manufacturing process of the semiconductor element 401b. Further, there may be another case where the resistive elements 43 are arranged in linear matrix and one ends of all the resistive elements 43 are connected to a single word line. To increase the variation of the analog signals An, the length and the width of the polycrystalline substance of the resistive element 43 are preferably set to the same range as the optimum condition for the gate length L and the gate width W.

[12.4. Still Another Example of Semiconductor Device]

FIG. 62 is a circuit diagram showing still another example of the semiconductor element 401 having a capacitive element of polycrystalline substance. This semiconductor element 401c comprises series circuits consisting of a plurality of capacitive elements 91 (4×4=16 capacitive elements 91 in the example of FIG. 62) and MOS transistors 90 arranged in matrix on a semiconductor substrate. The capacitive element 91 comprises a polycrystalline dielectric substance, e.g., a perovskite polycrystalline dielectric substance such as BST ($Ba_xSr_{1-x}TiO_3$). Therefore, the capacitance value randomly varies in the capacitive element 91.

On the semiconductor substrate, a plurality of word lines WL1 to WL4 and a plurality of bit lines BL1 to BL4 are further arranged horizontal and vertical directions, respectively. Respective gate electrodes of the MOS transistors 90 included in the four series circuits which are horizontally arranged are connected in common to each of the word lines WL1 to WL4. On the other hand, respective one of source electrodes and drain electrodes of the MOS transistors 90 included in the four series circuits which are vertically arranged are connected in common to each of the bit lines BL1 to BL4. Respective one ends of the capacitive elements 91 included in the sixteen series circuits are connected to the ground power supply line. The pad 15 is connected to the other end of each of the bit lines BL1 to BL4, and the pad 16 is connected to one end of each of the word lines WL1 to WL4.

Since the semiconductor element 401c has the above constitution, when a gate voltage of predetermined level is applied to one of the word lines WL1 to WL4, the four MOS transistors connected to the word line can be turned on. Through the MOS transistors which are turned on, the other ends of the four capacitive elements 91 are electrically connected to the bit lines BL1 to BL4. At this time, through the bit lines BL1 to BL4, it is possible to measure the capacitances of the four capacitive elements 91. For example, the potential at the time when a current is supplied for a given time period can be measured and this potential can be taken out as the analog signal An. The potential reflects the capacitance of the capacitive element 91.

By sequentially applying the predetermined gate voltages to the word lines WL1 to WL4, sixteen potentials in total can be taken out as the analog signals An. The analog signals An can be obtained as random values corresponding to varied capacitances of the capacitive elements 91. Since the semiconductor element 401c comprises the pads 15 and 16, it is possible to read out the analog signals An by using a probe in the manufacturing process of the semiconductor element 401c. Further, there may be another case where the series circuits each consisting of the capacitive element 91 and the MOS transistor 90 are arranged in linear matrix and gate electrodes of all the MOS transistors 90 are connected to a single word line.

To increase the variation of the analog signals An, the length and the width of the polycrystalline dielectric substance of the capacitive element 91 are preferably set to the same range as the optimum condition for the gate length L and the gate width W. In the BST, when the film thickness is 100 nm, the film thickness in terms of silicon oxide film is about 0.5 nm. Therefore, if the shape of the BST facing the electrode is a square with sides of 0.3 $\mu$m, the capacitance is about 6.2 fF. In an optimal case where the diameter of grain (average value) is set to 100 nm which corresponds to the film thickness, the capacitance varies in a range from −30% to +30%, i.e., a range from 4.3 fF to 8.1 fF. The range is a variation sufficiently large enough to be used as identification.

[12.5. Another Example of Comparator Circuit]

Figure 63:
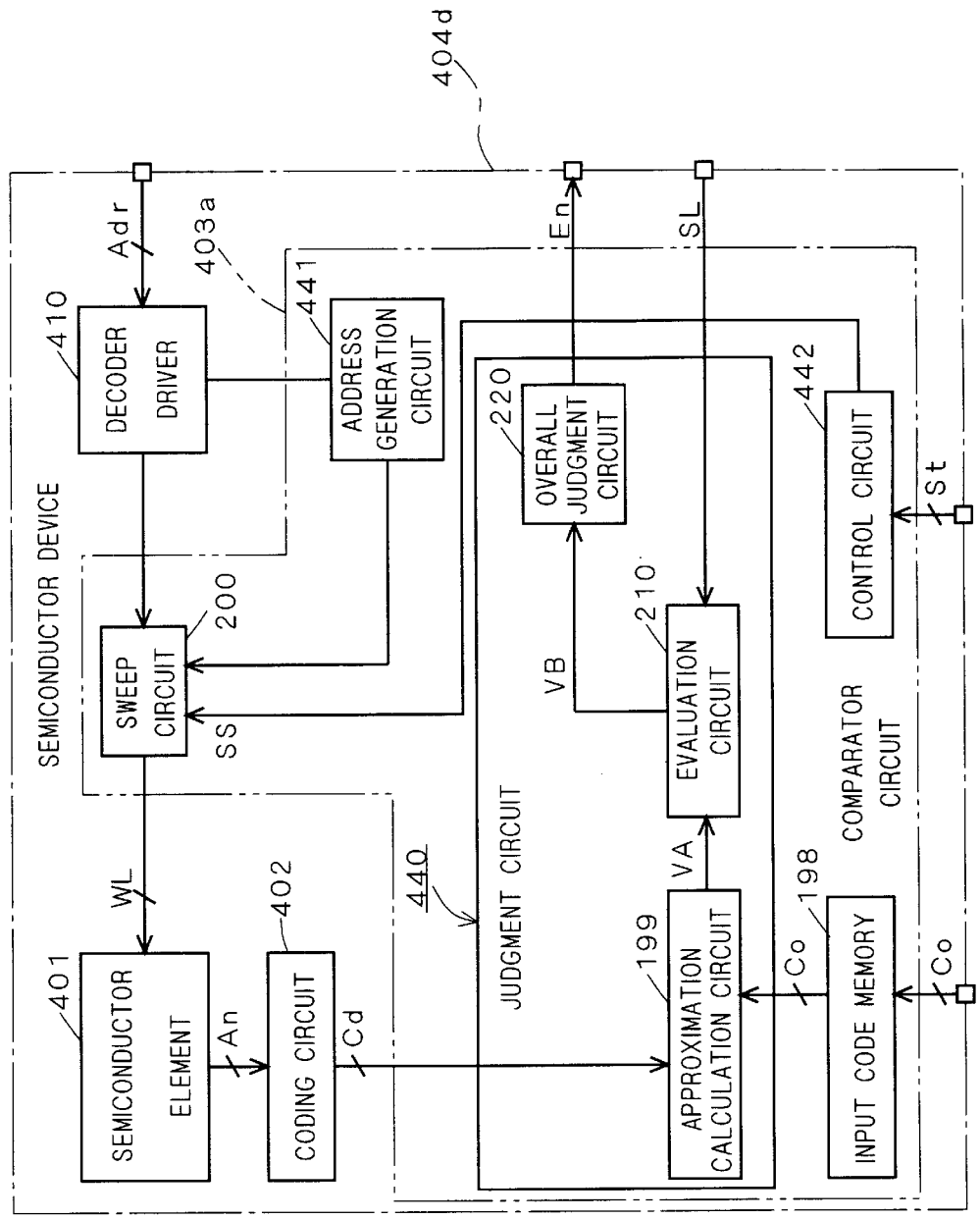
FIG. 63 is a block diagram showing a comparator circuit of the semiconductor element in accordance with the twelfth preferred embodiment of the present invention.
Figure 64:
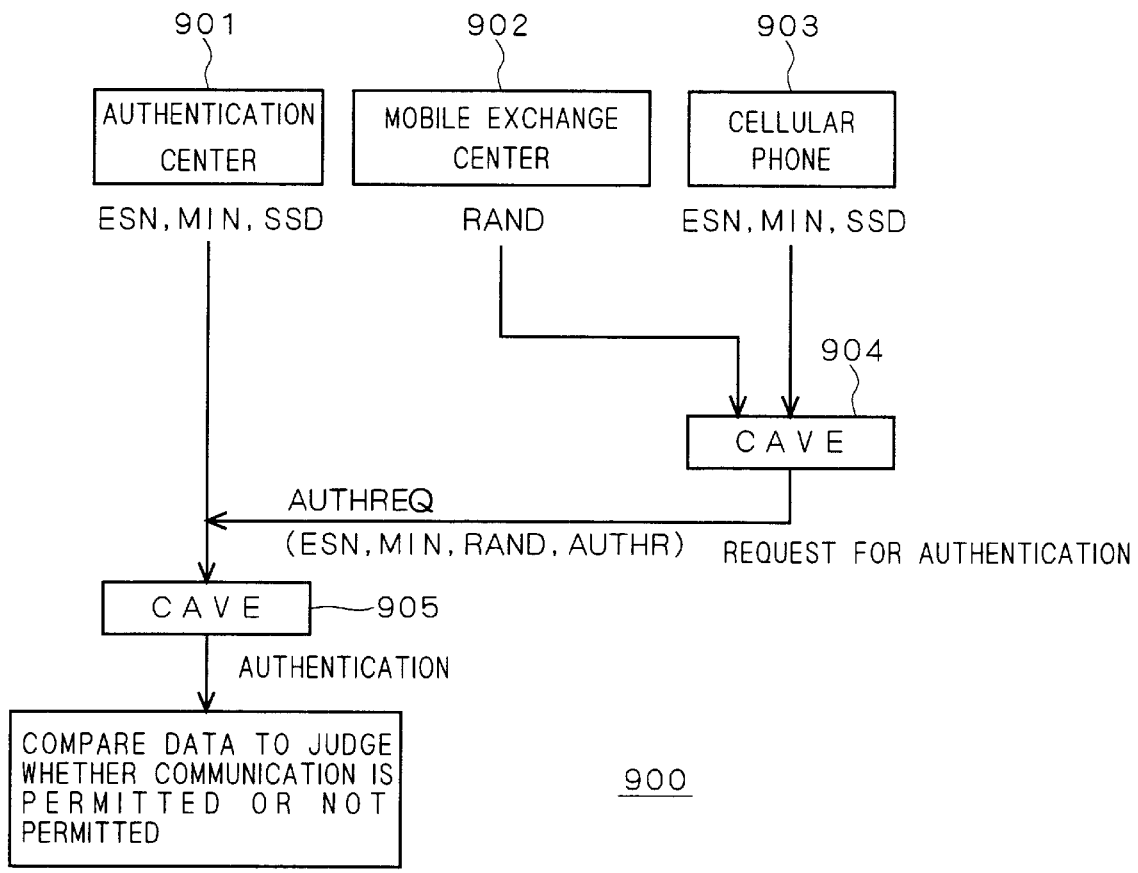
FIG. 64 is an illustration for explaining the procedure of a communication system in the background art.

FIG. 63 is a block diagram showing another preferable constitution of the semiconductor device using the semiconductor substrate CH3 (or CH1). This semiconductor device 404$d$ comprises a comparator circuit 403$a$ which can judge not only complete coincidence between the identification code Cd and the memory code Co but also approximation within a predetermined range. A reference value SL used for judgment can be inputted from the outside of the semiconductor element 404$d$ through an input terminal.

To enable this, the comparator circuit 403$a$ comprises a sweep circuit 200 for sweeping the potential of a word line WL. The identification code Cd which is varied by sweeping the potential of the word line WL is compared by an approximation calculation circuit 199 with corresponding some of the memory codes Co stored in an input code memory 198. The approximation calculation circuit 199 transmits a degree of approximation VA between the codes calculated through the comparison to an evaluation circuit 210. The evaluation circuit 210 compares the degree of approximation VA with the reference value SL to judge whether the degree of approximation VA is not less than a given value or not and outputs the judgment result as a judgment signal VB.

The judgment signal VB is obtained for each word line WL which the decoder driver 410 drives. An address generation circuit 441 transmits the address signal sequentially specifying all the word lines WL one by one to the decoder driver 410. Through this operation, a plurality of judgment signals VB corresponding to all the word lines WL are sequentially obtained one by one.

An overall judgment circuit 220 judges the approximation between the code Cd of all bits corresponding to all the word lines WL and the code Co of all bits on the basis of a plurality of judgment signals VB corresponding to all the word lines WL and outputs the enable signal En representing the judgment result. It is also possible to select judgment of complete coincidence which is the most strict judgment on approximation by properly setting the reference value SL. If there is one word line, the overall judgment circuit 220 is not needed and the judgment signal VB is outputted as the enable signal En.

In response to an instruction signal St inputted through the input terminal, a control circuit 442 starts the operations of elements in the comparator circuit 403$a$ and controls the operations of the elements in accordance with a predetermined procedure. In particular, a sweep switch signal SS which is a control signal instructing whether sweeping should be performed or not is transmitted from the control circuit 442 to the sweep circuit 200. The approximation calculation circuit 199, the evaluation circuit 210 and the overall judgment circuit 220 constitute a judgment circuit 440.

Incorporation by Reference

The entire contents of all of the two documents referred to as documents 1 and 3 are incorporated herein by reference. Further, U.S. patent application Ser. No. 09/457,721 is also incorporated herein by reference.

And furthermore, the entire contents of all of the following six documents(document 4 to 9) are incorporated herein by reference.

Document 4: Journal of Applied Physics, Vol. 76, No. 12, Dec. 15, 1994, pp. 8160 to 8166

Document 5: Japanese Patent application No. 5-111790 (1993) (Japanese Patent Laying-Open Gazette No. 6-326315 (1994)

Document 6: Japanese Patent Application No. 7-101179 (1995) (Japanese Patent Laying-Open Gazette No. 8-293611 (1996)

Document 7: "Spectrum Kakusan Tsushin Gijutsu: Saishin Oyo Report-Shu" supervised by Yasuo Kadokawa, issued by Nihon Gijutsu Keizai Center on Jan. 30, 1987, pp. 3 to 24

Document 8: Japanese Patent Application No. 6-120224 (1994) (Japanese Patent Laying-Open Gazette No. 7-99207 (1995)

Document 9: Japanese Patent Publication Gazette No. 61-1900 (1986)

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    N (1≦N) code generation unit formed in N semiconductor substrate in one to one correspondence, each of said N code generation unit being configured to generate an identification code inherent in a corresponding semiconductor substrate; and
    N memory formed in one-to-one correspondence to said N identification code, each of said N memory storing a code which coincides with a corresponding identification code as a memory code, and each of said N memory being formed in other semiconductor substrate than a corresponding semiconductor substrate.

2. The semiconductor device according to claim 1, wherein
    each of said N memory comprises an OTPROM (One Time Programmable Read Only Memory) storing said memory code.

3. The semiconductor device according to claim 1, wherein
    each of said N code generation unit comprises
        a semiconductor element; and
        a coding circuit configured to convert an electric property of said semiconductor element into a digital signal so that a value of said digital signal varies with a variation in said electric property of said semiconductor element to generate said identification code and output said identification code.

4. The semiconductor device according to claim 3, wherein said semiconductor element has a polycrystalline substance, and said variation in said electric property of said semiconductor element is caused by a variation in a crystal structure of said polycrystalline substance.

5. The semiconductor device according to claim 1, wherein
each of said N code generation unit comprises an OTPROM storing said identification code.

6. The semiconductor device according to claim 1, further comprising:
N comparator circuit formed in one-to-one correspondence to said N identification code, each of said N comparator circuit being configured to compare a corresponding identification code and a corresponding memory code to thereby judge whether these codes coincide with each other or not and outputting an enable signal representing the judgment result.

7. The semiconductor device according to claim 6, wherein
each of said N comparator circuit is formed in said semiconductor substrate corresponding to a corresponding identification code to be compared.

8. The semiconductor device according to claim 7, further comprising:
N key generation unit, N encryption circuit and N decoder circuit formed in one-to-one correspondence to said N identification code, each of said N key generation unit, each of said N encryption circuit and each of said N decoder circuit being formed in said semiconductor substrate corresponding to a corresponding identification code,
wherein each of said N key generation unit generates a key for encryption inherent in a corresponding semiconductor substrate,
each of said N encryption circuit encrypts said identification code generated by said code generation unit formed in a corresponding semiconductor substrate on the basis of a corresponding key and transmits said identification code of encrypted form to said corresponding memory,
each of said N memory stores said identification code of encrypted form outputted from a corresponding encryption circuit as said memory code of encrypted form,
each of said N decoder circuit decodes said memory code of encrypted form stored in a corresponding memory on the basis of a corresponding key, and
each of said N comparator circuit compares said identification code generated by a corresponding code generation unit with said memory code decoded by a corresponding decoder circuit.

9. The semiconductor device according to claim 8, wherein
each of said N key generation unit comprises
another semiconductor element;
another coding circuit for converting an electric property of said another semiconductor element into another digital signal so that a value of said another digital signal varies with a variation in said electric property of said another semiconductor element to generate said key and output said key.

10. The semiconductor device according to claim 8, wherein
said another semiconductor element has another polycrystalline substance, and
said variation in said electric property of said another semiconductor element is caused by a variation in a crystal structure of said another polycrystalline substance.

11. The semiconductor device according to claim 8, wherein
each of said N key generation unit comprises an OTPROM storing said key.

12. The semiconductor device according to claim 7, further comprising
N switching circuit formed in one-to-one correspondence to said N identification code, each of said N switching circuit being formed in said semiconductor substrate corresponding to a corresponding identification code, each of said N switching circuit being configured to exclusively perform a transmission of a corresponding identification code generated by a corresponding code generation unit to a corresponding memory and an input of said memory code stored in said corresponding memory to a corresponding comparator circuit.

13. The semiconductor device according to claim 6, further comprising
a predetermined circuit including a circuit portion which selectively comes into an active state or an inactive state, depending on said N enable signal respectively corresponding to said N identification code.

14. The semiconductor device according to claim 13, wherein
said predetermined circuit is formed in one of said N semiconductor substrate together with a corresponding comparator circuit.

15. A terminal device, comprising:
said semiconductor device as defined in claim 13,
wherein said predetermined circuit is a communication circuit for transmitting and receiving a signal to and from the outside, and
at least one of transmission and reception is stopped when said N enable signal indicates noncoincidence between at least one of said N identification code and a corresponding memory code.

16. A terminal device, comprising:
said semiconductor device as defined in claim 6; and
a communication circuit configured to transmit and receive a signal to and from the outside,
wherein said communication circuit transmits said N enable signal as part of said signal to said outside.

17. The semiconductor device according to claim 1, wherein
said number N is one.

18. The semiconductor device according to claim 1, wherein
said number N is two, and
each of said N code generation unit and a corresponding memory are formed respectively in one and the other of said N semiconductor substrates.

19. A terminal device, comprising:
said semiconductor device as defined in claim 1; and
a communication circuit configured to transmit and receive a signal to and from the outside,
wherein said communication circuit transmits said N identification code and said N memory code as part of said signal to said outside.

20. The terminal device according to claim 19, wherein
said number N is one,
said N code generation unit and said communication circuit are incorporated in a main body portion, and
said N memory is incorporated in an auxiliary portion detachable from said main body portion.

* * * * *